(12) United States Patent
Choi et al.

(10) Patent No.: US 10,361,385 B2
(45) Date of Patent: Jul. 23, 2019

(54) DISPLAY DEVICE

(71) Applicant: Samsung Display Co., Ltd., Yongin-si, Gyeonggi-do (KR)

(72) Inventors: Yoonsun Choi, Yongin-si (KR); Wonsuk Choi, Yongin-si (KR); Cheolsu Kim, Yongin-si (KR); Sangjo Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 29 days.

(21) Appl. No.: 15/404,057

(22) Filed: Jan. 11, 2017

(65) Prior Publication Data

US 2017/0237025 A1    Aug. 17, 2017

(30) Foreign Application Priority Data

Feb. 12, 2016 (KR) .................... 10-2016-0016599
Mar. 11, 2016 (KR) .................... 10-2016-0029690
Apr. 6, 2016 (KR) .................... 10-2016-0042416

(51) Int. Cl.
    *H01L 51/00*      (2006.01)
    *H01L 51/52*      (2006.01)
    (Continued)

(52) U.S. Cl.
    CPC ...... *H01L 51/0097* (2013.01); *H01L 51/5253* (2013.01); *H01L 51/5256* (2013.01);
    (Continued)

(58) Field of Classification Search
    CPC . H01L 51/0097; H01L 51/5253; H01L 51/56; H01L 27/323; H01L 27/3262; H01L 2251/5338
    (Continued)

(56) References Cited

U.S. PATENT DOCUMENTS 6,184,966 B1    2/2001   Fujita et al.
8,377,762 B2    2/2013   Eguchi et al.
(Continued)

FOREIGN PATENT DOCUMENTS

JP            3102392        10/2000
JP        2013-174692      9/2013
(Continued)

OTHER PUBLICATIONS

Office Action dated Jul. 26, 2018 in corresponding U.S. Appl. No. 15/948,214.

(Continued)

*Primary Examiner* — Dzung Tran

(74) *Attorney, Agent, or Firm* — F. Chau & Associates, LLC

(57) ABSTRACT

A display device is disclosed. The display device includes a substrate including a first area, a second area, and a first bending area located between the first and second areas. The first bending area is bent about a first bending axis extending in a first direction. The display device also includes a first inorganic insulating layer arranged over the substrate and having a first opening or a first groove at least in the first bending area, an organic material layer filling at least a part of the first opening or the first groove, and a first conductive layer extending from the first area to the second area across the first bending area and located over the organic material layer.

50 Claims, 39 Drawing Sheets

(51) Int. Cl.
*H01L 51/56* (2006.01)
*H01L 27/32* (2006.01)

(52) U.S. Cl.
CPC ............ *H01L 51/56* (2013.01); *H01L 27/323* (2013.01); *H01L 27/3262* (2013.01); *H01L 2251/5338* (2013.01); *Y02E 10/549* (2013.01)

(58) Field of Classification Search
USPC ........................................ 257/40, 59, 79, 98
See application file for complete search history.

(56) References Cited

U.S. PATENT DOCUMENTS

| | | | |
|---|---|---|---|
| 8,698,189 | B2 | 4/2014 | Park et al. |
| 8,933,451 | B2 | 1/2015 | Kim et al. |
| 9,287,342 | B2 | 3/2016 | Kwon et al. |
| 9,293,730 | B2 | 3/2016 | An |
| 9,543,370 | B2 | 1/2017 | Tsai et al. |
| 9,659,966 | B2 | 5/2017 | Kwak et al. |
| 9,698,162 | B2 | 7/2017 | Jeong |
| 9,882,152 | B2 | 1/2018 | Namkung et al. |
| 9,991,326 | B2 | 6/2018 | Iijima et al. |
| 10,020,462 | B1 | 7/2018 | Ai et al. |
| 2006/0169989 | A1 | 8/2006 | Bhattacharya et al. |
| 2008/0079889 | A1 | 4/2008 | Lee et al. |
| 2008/0106532 | A1 | 5/2008 | Choi et al. |
| 2011/0227846 | A1* | 9/2011 | Imazeki .................. G06F 3/044 345/173 |
| 2012/0162099 | A1* | 6/2012 | Yoo ....................... G06F 3/0412 345/173 |
| 2013/0148312 | A1* | 6/2013 | Han ......................... H05K 7/00 361/736 |
| 2014/0097408 | A1 | 4/2014 | Kim et al. |
| 2014/0217373 | A1 | 8/2014 | Youn et al. |
| 2014/0217397 | A1 | 8/2014 | Kwak et al. |
| 2014/0232956 | A1* | 8/2014 | Kwon ............... G02F 1/133305 349/12 |
| 2014/0346448 | A1 | 11/2014 | You et al. |
| 2014/0353670 | A1 | 12/2014 | Youn et al. |
| 2015/0102298 | A1 | 4/2015 | Namkung et al. |
| 2015/0116959 | A1 | 4/2015 | Namkung |
| 2015/0171113 | A1 | 6/2015 | Honjo |
| 2015/0380679 | A1 | 12/2015 | Fujiyoshi et al. |
| 2016/0014883 | A1 | 1/2016 | Cho et al. |
| 2016/0066409 | A1 | 3/2016 | Kwon et al. |
| 2016/0195901 | A1 | 7/2016 | Kauhaniemi et al. |
| 2016/0218305 | A1* | 7/2016 | Kim .................. G02F 1/133305 |
| 2016/0239133 | A1 | 8/2016 | Ko et al. |
| 2016/0336523 | A1 | 11/2016 | Kwon et al. |
| 2017/0062532 | A1 | 3/2017 | Jeong |
| 2017/0092230 | A1 | 3/2017 | Kuwabara |
| 2017/0147117 | A1 | 5/2017 | Song et al. |
| 2017/0237025 | A1 | 8/2017 | Choi et al. |
| 2017/0250237 | A1 | 8/2017 | Cheng |
| 2017/0329368 | A1 | 11/2017 | Rho et al. |
| 2018/0019418 | A1 | 1/2018 | Sonoda et al. |

FOREIGN PATENT DOCUMENTS

| | | |
|---|---|---|
| JP | 2013-174692 A | 9/2013 |
| KR | 10-2002-0076400 | 10/2002 |
| KR | 10-2008-0031091 | 4/2008 |
| KR | 10-2008-0040505 | 5/2008 |
| KR | 10-2012-0044019 | 5/2012 |
| KR | 10-2013-0007053 | 1/2013 |
| KR | 10-2014-0045193 | 4/2014 |
| KR | 10-2014-0045193 A | 4/2014 |
| KR | 10-2014-0103025 | 8/2014 |
| KR | 10-2014-0108914 | 9/2014 |
| KR | 10-2014-0108914 A | 9/2014 |
| KR | 10-2015-0043970 | 4/2015 |
| KR | 10-2015-0049303 | 5/2015 |
| KR | 10-2015-0049303 A | 5/2015 |
| KR | 10-2015-0061769 | 6/2015 |
| KR | 10-2015-0061769 A | 6/2015 |
| KR | 10-2015-0074808 | 7/2015 |

OTHER PUBLICATIONS

Office Action for U.S. Appl. No. 15/417,003.
Notice of Allowance dated Oct. 22, 2018 for U.S. Appl. No. 15/270,416.

* cited by examiner

DISPLAY DEVICE

CROSS-REFERENCE TO RELATED APPLICATION

This application claims the benefit of Korean Patent Application No. 10-2016-0016599, filed on Feb. 12, 2016, Korean Patent Application No. 10-2016-0029690, filed on Mar. 11, 2016, and Korean Patent Application No. 10-2016-0042416, filed on Apr. 6, 2016 in the Korean Intellectual Property Office, the disclosure of which is incorporated herein in its entirety by reference.

BACKGROUND

Field

The described technology generally relates to a display device.

Description of the Related Technology

In general, a display device includes a display unit on a substrate. Such a display device may be bent at least partially so as to improve visibility from various angles or reduce an area of a non-display region.

However, defects may occur while manufacturing a display device that is bent, or a lifespan of the display device may be reduced.

SUMMARY OF CERTAIN INVENTIVE ASPECTS

One inventive aspect relates to a display device that has a longer lifespan, and having fewer defects such as a disconnection during manufacturing processes thereof.

Another aspect is a display device that includes: a substrate including a first area, a second area, and a first bending area located between the first area and the second area, and the first bending area is bent about a first bending axis extending in a first direction; a first inorganic insulating layer arranged over the substrate and including a first opening or a first groove corresponding to the first bending area; an organic material layer filling at least a part of the first opening or the first groove; and a first conductive layer extending from the first area to the second area across the first bending area, and located over the organic material layer.

The first opening or the first groove may overlap with the first bending area. An area of the first opening or the first groove may be greater than an area of the first bending area.

The display device may further include a protective film located over a surface of the substrate, wherein the surface may be opposite to the first inorganic insulating layer, and including an opening corresponding to the first bending area. An area of the opening may be greater than an area of the first bending area. An area of the opening may be greater than an area of the first bending area and smaller than an area of the first opening or the first groove.

The organic material layer may cover an inner side surface of the first opening or the first groove.

The organic material layer may include an uneven surface at least partially in an upper surface of the organic material layer. The organic material layer may include the uneven surface only in the first opening or the first groove. An area of the uneven surface in the organic material layer may be greater than an area of the first bending area, and smaller than an area of the first opening or the first groove.

The organic material layer may include a plurality of grooves extending in the first direction in the upper surface of the organic material layer and defining the uneven surface.

An upper surface of the first conductive layer over the organic material layer may have a shape corresponding to a shape of the upper surface of the organic material layer.

The uneven surface may include a plurality of protrusions in a second direction that crosses the first direction, and a distance between the protrusions at a center portion of the first opening or the first groove may be less than a distance between the protrusions at other portions in the first opening or the first groove.

The uneven surface may include a plurality of protrusions in a second direction that crosses the first direction, and a height from an upper surface of the substrate to the protrusions at a center portion of the first opening or the first groove may be greater than a height from the upper surface of the substrate to the protrusions at other portions in the first opening or the first groove.

The display device may further include a stress neutralization layer located over an upper portion of the first conductive layer, wherein an upper surface of the stress neutralization layer at least partially has a shape corresponding to the uneven surface. The upper surface of the stress neutralization layer may have a same shape as that of the uneven surface. All of protrusions on the upper surface of the stress neutralization layer may correspond to at least some of the protrusions in the uneven surface.

The organic material layer may include an uneven surface having a plurality of protrusions at least partially in an upper surface in a second direction crossing the first direction, and a distance between the protrusions at a portion adjacent to the inner side surface of the first opening or the first groove may be smaller than a distance between the protrusions at other portions in the first opening or the first groove.

The organic material layer may include an uneven surface having a plurality of protrusions at least partially in an upper surface in a second direction crossing the first direction, and a height from an upper surface of the substrate to the protrusions at a portion adjacent to the inner side surface of the first opening or the first groove may be greater than a height from the upper surface of the substrate to the protrusions at other portions in the first opening or the first groove.

The organic material layer may include a plurality of islands extending in the first direction and spaced apart from one another in a second direction crossing the first direction.

An upper surface of the first conductive layer located over the islands may have a shape corresponding to shapes of upper surfaces of the islands.

A distance between the islands at a center portion of the first opening or the first groove may be smaller than a distance between the islands at other portions in the first opening or the first groove.

A height from an upper surface of the substrate to the islands at a center portion of the first opening or the first groove may be greater than a height from the upper surface of the substrate to the islands at other portions in the first opening or the first groove.

The display device may further include: a thin film transistor (TFT) arranged over the first area or the second area, and including a source electrode, a drain electrode, and a gate electrode; an encapsulation layer covering a display device over the first area; and a touch electrode for a touch sensing layer located over the encapsulation layer, wherein the first conductive layer may include a same material as that of the touch electrode.

The display device may further include a touch protective layer covering the touch electrode and the first conductive layer.

The display device may further include an encapsulation layer including a first inorganic encapsulation layer, a second inorganic encapsulation layer, and an organic encapsulation layer arranged between the first inorganic encapsulation layer and the second inorganic encapsulation layer, the encapsulation layer being configured to cover a display device over the first area, wherein the organic material layer may include a same material as that of the organic encapsulation layer.

The display device may further include a second conductive layer arranged over the first area or the second area and located on a layer different from a layer on which the first conductive layer is located, and the second conductive layer may be electrically connected to the first conductive layer.

An elongation rate of the first conductive layer may be greater than an elongation rate of the second conductive layer.

The display device may further include a TFT arranged over the first area or the second area, and comprising a source electrode, a drain electrode, and a gate electrode, wherein the first conductive layer may be located on a same layer as the source electrode and the drain electrode, and the second conductive layer may be located on a same layer as the gate electrode.

The TFT may further include a semiconductor layer, and the first inorganic insulating layer may be arranged between the semiconductor layer and the gate electrode.

The first inorganic insulating layer may be arranged between the TFT and the substrate. The TFT may further include a semiconductor layer, and the organic material layer may extend to be arranged between the semiconductor layer and the gate electrode.

The display device may further include: a TFT arranged over the first area or the second area, and including a source electrode, a drain electrode, and a gate electrode; and a planarization layer covering the TFT and including an organic material, wherein the organic material layer may include a same material as that of the planarization layer.

The organic material layer may be integrally formed with the interlayer insulating layer.

The display device may further include: a first TFT arranged over the first area or the second area, and including a first semiconductor layer, a first source electrode, a first drain electrode, and a first gate electrode; and a second TFT arranged over the first area or the second area, and including a second semiconductor layer, a second source electrode, a second drain electrode, and a second gate electrode, wherein a distance between a layer in which the first gate electrode is located and the substrate may be smaller than a distance between a layer in which the second gate electrode is located and the substrate, the first inorganic insulating layer may be arranged between the first semiconductor layer and the first gate electrode and between the second semiconductor layer and the second gate electrode, and the organic material layer may extend to be arranged between the first inorganic insulating layer and the second gate electrode. The display device may further include a second inorganic insulating layer arranged over the organic material layer and including a second opening or a second groove corresponding to the first bending area.

The display device may further include a second conductive layer arranged over the first area or the second area, including a same material as that of the first gate electrode, and electrically connected to the first conductive layer, wherein the first conductive layer may include a same material as that of the second gate electrode.

The substrate may include a second bending area that extends in a second direction crossing the first direction within the first area, and the second bending area may be bent about a second bending axis extending in the second direction.

The substrate may have a chamfered corner that is closest to a point where the first bending axis and the second bending axis cross each other.

A radius of curvature at the first bending area may be smaller than a radius of curvature at the second bending area. The first inorganic insulating layer may be continuous over at least a region including the second bending area within the first area.

Another aspect is a display device comprising: a substrate comprising a first area, a second area, and a first bending area located between the first and second areas, wherein the first bending area is bent about a first bending axis extending in a first direction; a first inorganic insulating layer arranged over the substrate and having a first opening or a first groove at least in the first bending area; an organic material layer filling at least a part of the first opening or the first groove; and a first conductive layer extending from the first area to the second area across the first bending area and located over the organic material layer.

In the above display device, the first opening or the first groove overlaps the first bending area.

In the above display device, first opening or the first groove has an area that is greater than the first bending area.

The above display device further comprises a protective film located over a surface of the substrate, wherein the surface is opposite to the first inorganic insulating layer, and wherein the protective film has a protective film opening at least in the first bending area.

In the above display device, the protective film opening has an area that is greater than the first bending area.

In the above display device, the protective film opening has an area that is greater than the first bending area and smaller than an area of the first opening or the first groove.

In the above display device, the organic material layer covers an inner side surface of the first opening or the first groove.

In the above display device, the organic material layer comprises an upper surface that is at least partially uneven.

In the above display device, an uneven portion of the upper surface of the organic material layer is disposed only in the first opening or the first groove.

In the above display device, the uneven portion of the organic material layer has an area is greater than the first bending area and smaller than that of the first opening or the first groove.

In the above display device, the upper surface of the organic material layer comprises a plurality of grooves extending in the first direction, and wherein the grooves define an uneven portion of the upper surface.

In the above display device, an uneven upper surface of the first conductive layer has a shape corresponding to that of the upper surface of the organic material layer.

In the above display device, an uneven portion of the upper surface comprises a plurality of protrusions in a second direction that crosses the first direction, wherein the protrusions at a center portion of the first opening or the first groove has a distance therebetween that is less than that between the protrusions at other portions in the first opening or the first groove.

In the above display device, an uneven portion of the upper surface comprises a plurality of protrusions in a second direction that crosses the first direction, and wherein a height from an upper surface of the substrate to the protrusions at a center portion of the first opening or the first groove is greater than a height from the upper surface of the substrate to the protrusions at other portions in the first opening or the first groove.

The above display device, may further comprise a stress neutralization layer located over an upper portion of the first conductive layer, wherein an upper surface of the stress neutralization layer at least partially has a shape corresponding to an uneven portion of the upper surface of the organic material layer.

In the above display device, the upper surface of the stress neutralization layer has the same shape as that of the uneven portion.

In the above display device, all of the protrusions on the upper surface of the stress neutralization layer correspond to at least some of the protrusions in the uneven portion.

In the above display device, the organic material layer comprises an uneven surface having a plurality of protrusions in a second direction crossing the first direction, wherein a distance between the protrusions at a portion adjacent to the inner side surface of the first opening or the first groove is smaller than a distance between the protrusions at other portions in the first opening or the first groove.

In the above display device, the organic material layer comprises an uneven surface having a plurality of protrusions in a second direction crossing the first direction, and wherein a height from an upper surface of the substrate to the protrusions at a portion adjacent to the inner side surface of the first opening or the first groove is greater than a height from the upper surface of the substrate to the protrusions at other portions in the first opening or the first groove.

In the above display device, the organic material layer comprises a plurality of islands extending in the first direction and spaced apart from one another in a second direction crossing the first direction.

In the above display device, an upper surface of the first conductive layer located over the islands has a shape corresponding to the islands.

In the above display device, a distance between the islands at a center portion of the first opening or the first groove is smaller than a distance between the islands at other portions in the first opening or the first groove.

In the above display device, a height from an upper surface of the substrate to the islands at a center portion of the first opening or the first groove is greater than a height from the upper surface of the substrate to the islands at other portions in the first opening or the first groove.

The above display device further comprises: a thin film transistor (TFT) arranged over the first area or the second area and comprising a source electrode, a drain electrode, and a gate electrode; an encapsulation layer covering an organic light-emitting diode (OLED) over the first area; and a touch electrode of a touch sensing layer located over the encapsulation layer, wherein the first conductive layer and the touch electrode are formed of at least one same material.

The above display device further comprises a touch protective layer covering the touch electrode and the first conductive layer.

The above display device further comprises an additional OLED over the second area, wherein the encapsulation layer covers the additional OLED over the second area.

The above display device further comprises an encapsulation layer comprising a first inorganic encapsulation layer, a second inorganic encapsulation layer, and an organic encapsulation layer arranged between the first and second inorganic encapsulation layers, wherein the encapsulation layer covers a display device over the first area, and wherein the organic material layer and the organic encapsulation layer are formed of at least one same material.

The above display device further comprises a second conductive layer arranged over the first area or the second area and located on a layer different from a layer on which the first conductive layer is located, wherein the second conductive layer is electrically connected to the first conductive layer.

In the above display device, an elongation rate of the first conductive layer is greater than that of the second conductive layer.

The above display device further comprises a TFT arranged over the first area or the second area and comprising a source electrode, a drain electrode, and a gate electrode, wherein the first conductive layer is located on the same layer as the source and drain electrodes, and wherein the second conductive layer is located on the same layer as the gate electrode.

In the above display device, the TFT further comprises a semiconductor layer, wherein the first inorganic insulating layer is arranged between the semiconductor layer and the gate electrode.

In the above display device, the first inorganic insulating layer is arranged between the TFT and the substrate.

In the above display device, the TFT further comprises a semiconductor layer, wherein the organic material layer extends to be interposed between the semiconductor layer and the gate electrode.

The above display device further comprises: a TFT arranged over the first area or the second area and comprising a source electrode, a drain electrode, and a gate electrode; and a planarization layer covering the TFT and formed of an organic material, wherein the organic material layer and the planarization layer are formed of at least one same material.

The above display device further comprises: a TFT arranged over the first area or the second area and comprising a source electrode, a drain electrode, and a gate electrode; and an interlayer insulating layer arranged between the source electrode and the gate electrode and between the drain electrode and the gate electrode, wherein the organic material layer and the interlayer insulating layer are formed of at least one same material.

In the above display device, the organic material layer is integrally formed with the interlayer insulating layer.

The above display device further comprises: a first TFT arranged over the first area or the second area and comprising a first semiconductor layer, a first source electrode, a first drain electrode, and a first gate electrode; and a second TFT arranged over the first area or the second area and comprising a second semiconductor layer, a second source electrode, a second drain electrode, and a second gate electrode, wherein a distance between a layer in which the first gate electrode is located and the substrate is smaller than a distance between a layer in which the second gate electrode is located and the substrate, wherein the first inorganic insulating layer is arranged between the first semiconductor layer and the first gate electrode and between the second semiconductor layer and the second gate electrode, and wherein the organic material layer extends to be interposed between the first inorganic insulating layer and the second gate electrode.

The above display device further comprises a second inorganic insulating layer arranged over the organic material layer and comprising a second opening or a second groove corresponding to the first bending area.

The above display device further comprises a second conductive layer arranged over the first area or the second area, wherein the second conductive layer and the first gate electrode are formed of at least one same material, wherein the second conductive layer is electrically connected to the first conductive layer, and wherein the first conductive layer and the second gate electrode are formed of at least one same material.

In the above display device, the substrate comprises a second bending area that extends in a second direction crossing the first direction within the first area, and wherein the second bending area is bent about a second bending axis extending in the second direction.

In the above display device, the substrate has a chamfered corner that is the closest to a point where the first bending axis and the second bending axis cross each other.

In the above display device, a radius of curvature at the first bending area is smaller than that of the second bending area.

In the above display device, the first inorganic insulating layer is continuous over at least a region including the second bending area within the first area.

The above display device further comprises an additional inorganic insulating layer comprising an additional opening corresponding to the first bending area and overlapping the first conductive layer.

In the above display device, the additional opening overlaps the first bending area.

In the above display device, the additional opening has an area that is greater than that of the first bending area.

In the above display device, the first opening or the first groove overlaps the first bending area.

In the above display device, the first opening or the first groove is greater than an area of the first bending area.

In the above display device, the additional opening has an area that is greater than that of the first opening or the first groove.

In the above display device, the additional opening corresponds to the first conductive layer within the first bending area.

In the above display device, the additional opening overlaps the first conductive layer within the first bending area.

In the above display device, the additional opening has an area that is greater than that of an upper surface of the first conductive layer within the first bending area.

In the above display device, the additional inorganic insulating layer at least partially covers an upper surface of the organic material layer on an outer portion of the first conductive layer within the first bending area.

Another aspect is a display device that includes: a substrate comprising a first area, a second area, and a first bent area located between the first and second areas, wherein the first bent area is bent about a first bending axis extending in a first direction; a first inorganic insulating layer arranged over the substrate and having a first opening or a first groove at least in the first bent area; an organic material layer filling at least a part of the first opening or the first groove; and a first conductive layer extending from the first area to the second area across the first bent area and located over the organic material layer.

DETAILED DESCRIPTION OF CERTAIN INVENTIVE EMBODIMENTS

Figure 1:
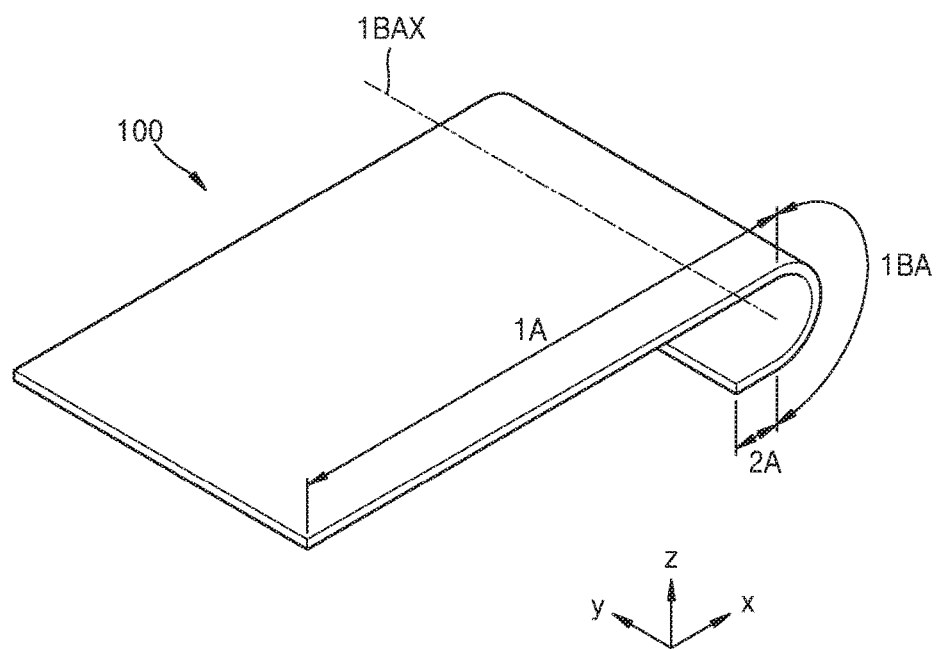
FIG. 1 is a schematic perspective view partially showing a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, the described technology will be described in detail by explaining preferred embodiments with reference to the attached drawings Like reference numerals in the drawings denote like elements.

Sizes of components in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Figure 2:
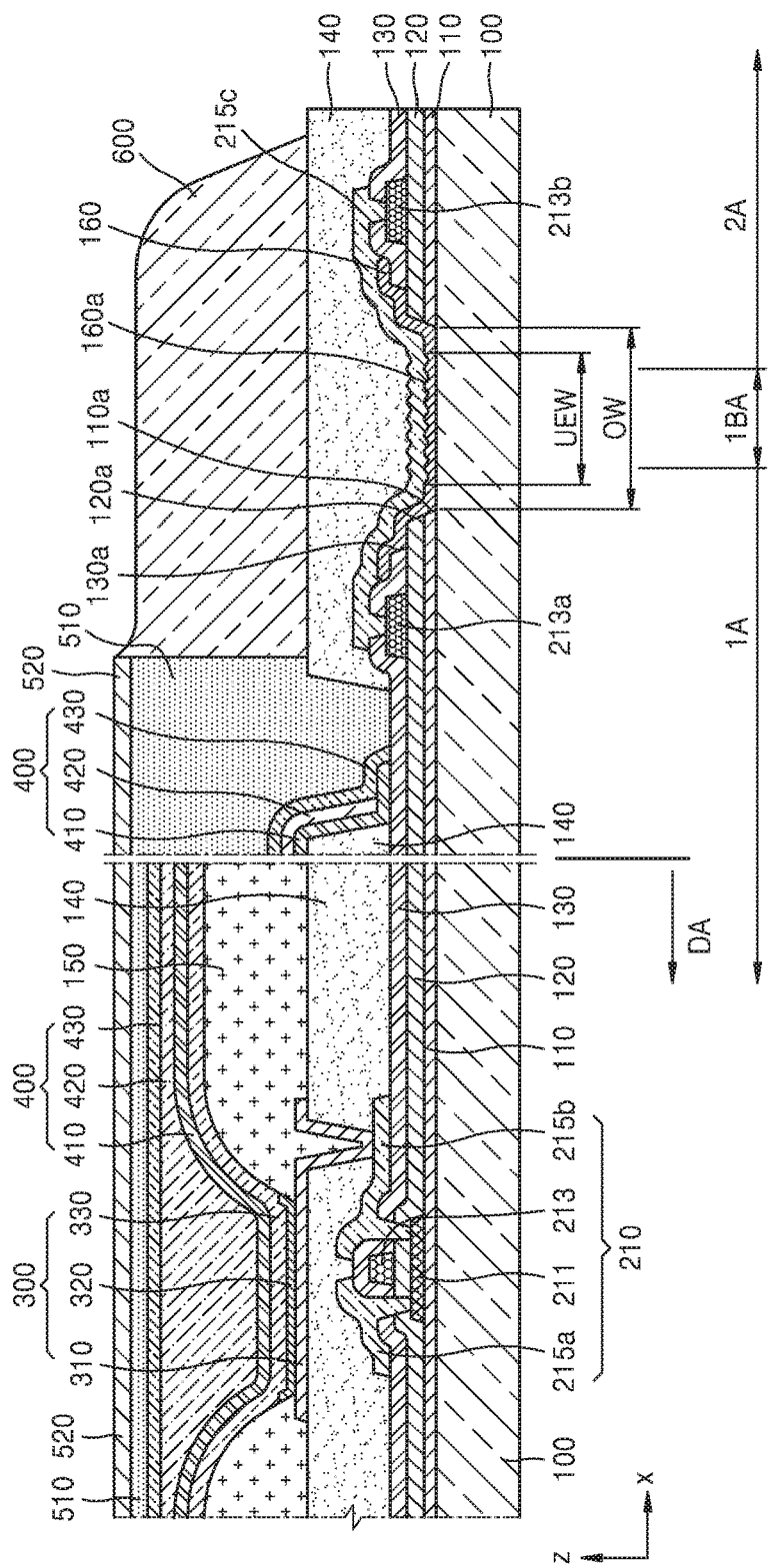
FIG. 2 is a schematic cross-sectional view partially showing the display device of FIG. 1.

FIG. 1 is a schematic perspective view partially showing a display device according to an embodiment, and FIG. 2 is a schematic cross-sectional view partially showing the display device of FIG. 1. In the display device, a substrate 100 that is a part of the display device is partially bent as shown in FIG. 1, and thus, the display device is also bent due to the bent substrate 100. However, FIG. 2 shows the display device that is not bent for convenience of description. Other cross-sectional views and plan views according to one or more embodiments that will be described later also show display devices that are not bent, for convenience of description.

As shown in FIGS. 1 and 2, the substrate 100 included in the display device includes a first bending area 1BA extending in a first direction (+y direction). The first bending area 1BA is located between a first area 1A and a second area 2A, in a second direction (+x direction) crossing the first direction. In addition, as shown in FIG. 1, the substrate 100 is bent about a first bending axis 1BAX extending in the first direction (+y direction). The substrate 100 may include various materials having flexible or bendable characteristics, e.g., a polymer resin such as polyethersulphone (PES), polyacrylate (PAR), polyetherimide (PEI), polyethyelene naphthalate (PEN), polyethyeleneterepthalate (PET), polyphenylene sulfide (PPS), polyallylate, polyimide (PI), polycarbonate (PC), and cellulose acetate propionate (CAP).

The first area 1A includes a display area DA. As shown in FIG. 2, the first area 1A may include a part of a non-display area on an outer portion of the display area DA, as well as the display area DA. The second area 2A also includes the non-display area. The second area 2A may also include an additional display area (not shown), if necessary.

In addition to a display device 300, a thin film transistor (TFT) 210 to which the display device 300 is electrically connected may be located on the display area DA of the substrate 100, as shown in FIG. 2, In FIG. 2, an organic light-emitting diode (OLED) is located on the display area DA as the display device 300. If the second area 2A includes the additional display area, an OLED may be located on the additional display area, the TFT may also be located on the additional display area. Such above electrical connection of the OLED to the TFT 210 may denote that a pixel electrode 310 is electrically connected to the TFT 210. If necessary, a TFT (not shown) may be arranged on a peripheral area outside the display area DA of the substrate 100. The TFT located on the peripheral area may be a part of, for example, a circuit unit for controlling electric signals applied to the display area DA.

The TFT 210 may include a semiconductor layer 211 including amorphous silicon, polycrystalline silicon, or an organic semiconductor material, a gate electrode 213, a source electrode 215a, and a drain electrode 215b. In order to ensure an insulating property between the semiconductor layer 211 and the gate electrode 213, a gate insulating layer 120 formed of an inorganic material such as silicon oxide, silicon nitride, and/or silicon oxynitride may be interposed between the semiconductor layer 211 and the gate electrode 213. In addition, an interlayer insulating layer 130 formed of an inorganic material such as silicon oxide, silicon nitride, and/or silicon oxynitride may be arranged on the gate electrode 213, and the source electrode 215a and the drain electrode 215b may be arranged on the interlayer insulating layer 130. As described above, the insulating layer including the inorganic material may be formed in a chemical vapor deposition (CVD) or an atomic layer deposition (ALD) method. This is applied to one or more embodiments and modified examples thereof that will be described later, as well.

A buffer layer 110 formed of an inorganic material such as silicon oxide, silicon nitride, and/or silicon oxynitride may be arranged between the TFT 210 having the above structure and the substrate 100. The buffer layer 110 may improve smoothness of an upper surface of the substrate 100, or may prevent or reduce infiltration of impurities into the semiconductor layer 211 of the TFT 210.

In addition, a planarization layer 140 may be arranged on the TFT 210. For example, an OLED is arranged on the TFT 210 as shown in FIG. 2, the planarization layer 140 may planarize an upper portion of a protective layer that covers the TFT 210. The planarization layer 140 may be formed of an organic material, for example, benzocyclobutene (BCB) or hexamethyldisiloxane (HMDSO). In FIG. 2, the planarization layer 140 has a single-layered structure, but the planarization layer 140 may have a multi-layered structure. In addition, as shown in FIG. 2, the planarization layer 140 may have an opening on an outer portion of the display area DA so that a part of the planarization layer 140 on the display area DA and a part of the planarization layer 140 on the second area 2A may he physically separate. Thus, the impurities from outside may not infiltrate into the display area DA across the planarization layer 140.

In the display area DA of the substrate 100, an (OLED including a pixel electrode 310, an opposite electrode 330, and an intermediate layer 330 including an emission layer and arranged between the pixel electrode 310 and the opposite electrode 330 may be located on the planarization layer 140. The pixel electrode 310 is electrically connected to the TFT 210 by contacting one of the source electrode 215a and the drain electrode 215b via an opening formed in the planarization layer 140, as shown in FIG. 2.

A pixel defining layer 150 may be arranged on the planarization layer 140. The pixel defining layer 150 has an opening corresponding to each of sub-pixels, that is, an opening exposing at least a center portion of the pixel electrode 310, to define pixels. Also, in the example of FIG. 2, the pixel defining layer 150 increases a distance between an edge of the pixel electrode 310 and the opposite electrode 330 above the pixel electrode 310 to prevent arc from generating at the edge of the pixel electrode 310. The pixel defining layer 150 may include, for example, an organic material such as polyimide or hexamethyldisiloxane (HMDSO).

The intermediate layer 320 of the OLED may be formed of low-molecular weight organic materials or polymer organic materials. When the intermediate layer 320 is formed of a low-molecular weight organic material, the emission layer may include a hole injection layer (HIL), a hole transport layer (HTL), an emission layer (EML), an electron transport layer (ETL), and an electron injection layer (EIL) in a single or multiple-layered structure, and examples of organic materials may include copper phthalocyanine (CuPc), N,N'-Di(naphthalene-1-yl)-N,N'-diphenyl-benzidine (NPB), and tris-8-hydroxyquinoline aluminum (Alq.sub.3)The low-molecular weight organic materials may be deposited by a vacuum deposition method.

When the intermediate layer 320 is formed of a polymer material, the intermediate layer 320 may include a hole transport layer (HTL) and an emission layer (EML). Here, the HTL may include PEDOT, and the EML may include a poly-phenylenevinylene (PPV)-based or polyfluorene-based polymer material. Such above intermediate layer 320 may be formed by a screen printing method, an inkjet printing method, or a laser induced thermal imaging (LITI) method.

The intermediate layer 320 is not limited to the above example, but may have various structures. In addition, the intermediate layer 320 may include a layer that is integrally formed throughout a plurality of pixel electrodes 310, or a layer that is patterned to correspond to each of the pixel electrodes 310.

The opposite electrode 330 is arranged above the display area DA, and as shown in FIG. 2, may cover the display area DA. That is, the opposite electrode 330 may be integrally formed with respect to a plurality of OLEDs, so as to correspond to a plurality of pixel electrodes 310.

Since the OLED may easily be damaged by external moisture or oxygen, an encapsulation layer 400 may cover the OLED to protect the OLED. The encapsulation layer 400 covers the display area DA, and then may extend to outside the display area DA. The encapsulation layer 400 may include a first inorganic encapsulation layer 410, an organic encapsulation layer 420, and a second inorganic encapsulation layer 430 as shown in FIG. 2.

The first inorganic encapsulation layer 410 covers the opposite electrode 330, and may include silicon oxide, silicon nitride, and/or silicon oxynitride. If necessary, other layers such as a capping layer may be arranged between the first inorganic encapsulation layer 410 and the opposite electrode 330. Since the first inorganic encapsulation layer 410 is formed according to a structure arranged thereunder, the first inorganic encapsulation layer 410 may have an uneven upper surface. The organic encapsulation layer 420 covers the first inorganic encapsulation layer 410, and unlike the first inorganic encapsulation layer 410, the organic encapsulation layer 420 may have an even upper surface. For example, the organic encapsulation layer 420 may have a roughly even upper surface at a portion corresponding to the display area DA. The organic encapsulation layer 420 may include at least one material including polyethylene terephthalate, polyethylene naphthalene, polycarbonate, polyimide, polyethylene sulfonate, polyoxymethylene, polyarylate, and hexamethyldisiloxane. The second inorganic encapsulation layer 430 covers the organic encapsulation layer 420, and may include silicon oxide, silicon nitride, and/or silicon oxynitride. The second inorganic encapsulation layer 430 may contact the first inorganic encapsulation layer 410 by an edge thereof at an outer portion of the display area DA, in order not to expose the organic encapsulation layer 420 to outside.

As described above, since the encapsulation layer 400 includes the first inorganic encapsulation layer 410, the organic encapsulation layer 420, and the second inorganic encapsulation layer 430, even if there is a crack in the encapsulation layer 400 in the above multi-layered structure, the crack may be disconnected between the first inorganic encapsulation layer 410 and the organic encapsulation layer 420 or between the organic encapsulation layer 420 and the second inorganic encapsulation layer 430. As such, forming of a path through which the external moisture or oxygen may infiltrated into the display area DA may be prevented or reduced.

A polarization plate 520 may be located on the encapsulation layer 400 by an optically clear adhesive (OCA) 510. The polarization plate 520 may reduce reflection of external light. For example, when the external light passed through the polarization plate 520 is reflected by an upper surface of the opposite electrode 330 and then passes through the polarization plate 520 again, the external light passes through the polarization plate 520 twice and a phase of the external light may be changed. Therefore, a phase of reflected light is different from the phase of the external light entering the polarization plate 520 so that a destructive interference occurs, and accordingly, reflection of the external light may be reduced and visibility may be improved. The OCA 510 and the polarization plate 520 may cover the opening in the planarization layer 140 as shown in FIG. 2. The display device according to the embodiment may not essentially include the polarization plate 520, and if necessary, the polarization plate 520 may be omitted or replaced with another component. For example, the polarization plate 520 may be omitted, and instead, a black matrix and a color filter may be used to reduce the reflection of external light.

In addition, the buffer layer 110, the gate insulating layer 120, and the interlayer insulating layer 130 including the inorganic material may be referred to as a first inorganic insulating layer. The first inorganic insulating layer may include a first opening corresponding to a first bending area 1BA, as shown in FIG. 2. That is, the buffer layer 110, the gate insulating layer 120, and the interlayer insulating layer 130 may respectively include openings 110a, 120a, and 130a corresponding to the first bending area 1BA. That the first opening corresponds to the first bending area 1BA may denote that the first opening overlaps with the first bending area 1BA. Here, an area of the first opening may be greater than that of the first bending area 1BA. To do this, in FIG. 2, a width OW of the first opening is greater than that of the first bending area 1BA. Here, the area of the first opening may be defined as an area of one having the smallest area, from among the openings 110a, 120a, and 130a of the buffer layer 110, the gate insulating layer 120, and the interlayer insulating layer 130. In addition, in FIG. 2, the area of the first opening is described to be defined by an area of the opening 110a in the buffer layer 110.

Figure 3:
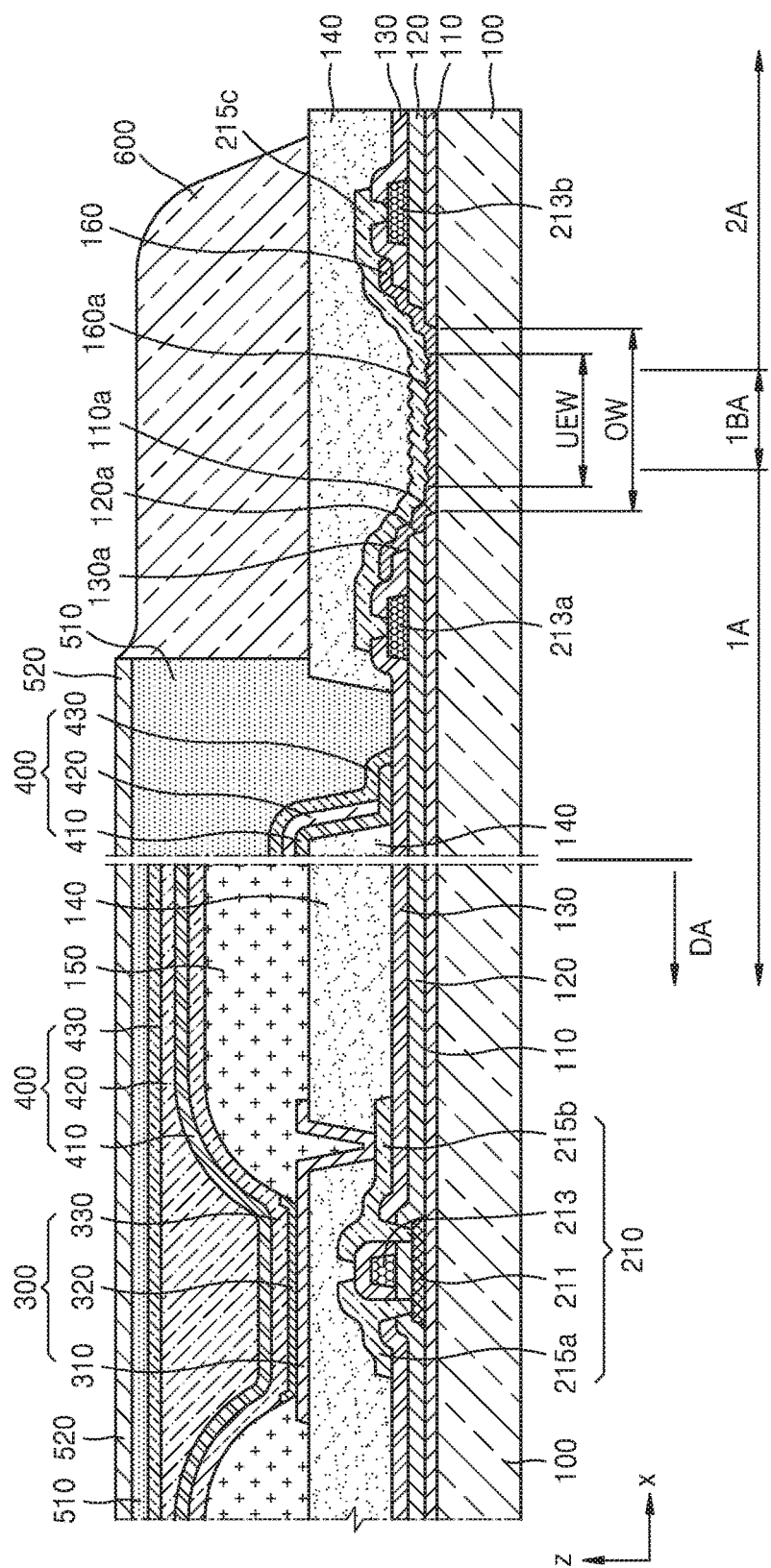
FIG. 3 is a schematic cross-sectional view partially showing a display device according to an embodiment.

In FIG. 2, an internal surface of the opening 110a of the buffer layer 110 and an internal surface of the opening 120a in the gate insulating layer 120 are described to be equal to each other, but one or more embodiments are not limited thereto. For example, as shown in FIG. 3 that is a schematic cross-sectional view of a part of the display device according to another embodiment, an area of the opening 120a of the gate insulating layer 120 may be greater than that of the opening 110a in the buffer layer 110. In this case, the area of the first opening may be also defined as an area of the opening having the smallest area, from among the openings 110a, 120a, and 130a of the buffer layer 110, the gate insulating layer 120, and the interlayer insulating layer 130.

The display device may include an organic material layer 160 that fills at least a part of the first opening of the first inorganic insulating layer. In FIG. 2, the organic material layer 160 fills the first opening entirely. In addition, the display device may include a first conductive layer 215c that extends from the first area 1A toward the second area 2A through the first bending area 1BA to be located on the organic material layer 160. The first conductive layer 215c may be located on the inorganic insulating layer such as the interlayer insulating layer 130 where the organic material layer 160 does not exist. The first conductive layer 215c may be formed simultaneously, or concurrently, with the source electrode 215a or the drain electrode 215b by using the same material as that of the source electrode 215a or the drain electrode 215b.

As described above, although FIG. 2 shows that the display device is not bent for convenience of description, the display device is actually in a state in which the substrate 100 is bent at the first bending area 1BA. To do this, the display device is manufactured so that the substrate 100 is flat as shown in FIG. 2, and then, the substrate 100 is bent at the first bending area 1BA so that the display device may have the shape as shown in FIG. 1. Here, a tensile stress may be applied to the first conductive layer 215c while the substrate 100 is bent at the first bending area 1BA, but the display device may prevent or reduce the occurrence of defects in the first conductive layer 215c during the bending process.

If the first inorganic insulating layer including the buffer layer 110, the gate insulating layer 120, and/or the interlayer insulating layer 130 does not include an opening at the first bending area 1BA, but is formed continuously from the first area 1A to the second area 2A, and if the first conductive layer 215c is located on the first inorganic insulating layer, a large tensile stress is applied to the first conductive layer 215c when the substrate 100 is bent. For example, the first inorganic insulating layer has a higher hardness than that of the organic material layer, cracks are more likely to occur in the first inorganic insulating layer at the first bending area 1BA, and if the crack occurs in the first inorganic insulating layer, the first conductive layer 215c on the first inorganic insulating layer may also have the crack, and thus, there is a high possibility of generating a defect such as a disconnection in the first conductive layer 215c.

However, according to the display device of the embodiment, the first inorganic insulating layer has the first opening at the first bending area 1BA as described above, and the part of the first conductive layer 215c, which corresponds to the first bending area 1BA, is located on the organic material layer 160 that fills at least a part of the first opening of the first inorganic insulating layer. Since the first inorganic insulating layer has the first opening at the first bending area 1BA, a possibility of generating a crack in the first inorganic insulating layer is very low, and the organic material layer 160 has a low possibility of generating the crack due to the organic material included in the organic material layer 160. Therefore, occurrence of the crack in the part of the first conductive layer 215c may be prevented or reduced, wherein the part of the first conductive layer 215c corresponds to the first bending area 1BA and is located on the organic material layer 160. Since the organic material layer 160 has a hardness that is lower than that of the inorganic material layer, the tensile stress generating due to the beriding, of the substrate 100 may be absorbed by the organic material layer 160 so that concentration of the tensile stress onto the first conductive layer 215c may be effectively reduced, The display device may include second conductive layers 213a and 213b, in addition to the first conductive layer 215c. The second conductive layers 213a and 213b may be arranged on the first area 1A or the second area 2A to be located at different layer level from that of the first conductive layer 215c, and may be electrically connected to the first conductive layer 215c. In FIG. 2, the second conductive layers 213a and 213b are located at the same layer level as the gate electrode 213 of the TFT 210, that is, on the gate insulating layer 120, and include the same material as the gate electrode 213. In addition, the first conductive layer 215c contacts the second conductive layers 213a and 213b via contact holes formed in the interlayer insulating layer 130. In addition, the second conductive layer 213a is located on the first area 1A and the second conductive layer 213b is located on the second area 2A.

The second conductive layer 213a located on the first area 1A may be electrically connected to the TFT in the display area DA, and accordingly, the first conductive layer 215c may be electrically connected to the TFT in the display area DA via the second conductive layer 213a. The second conductive layer 213b located on the second area 2A may be electrically connected to the TFT in the display area DA via the first conductive layer 215c, as well. As described above, the second conductive layers 213a and 213b located on the outer portion of the display area DA may be electrically connected to components located in the display area DA, or may extend toward the display area DA so as to be located at least partially in the display area DA.

As described above, FIG. 2 shows the display device that is not bent for convenience of description, but the display device is in a state in which the substrate 100 is actually bent at the first bending area 1BA as shown in FIG. 1. To do this, the display device is manufactured in a state where the substrate 100 is flat as shown in FIG. 2, and after that, the substrate 100 may be bent at the first bending area 1BA so that the display device may have the shape as shown in FIG. 1. Here, while the substrate 100 is bent at the first bending area 1BA, tensile stress may be applied to components located within the first bending area 1BA.

Therefore, the first conductive layer 215c that extends across the first bending area 1BA may include a material having a high strain rate, and thus, occurrence of crack in the first conductive layer 215c or a defect such as a disconnection in the first conductive layer 215c may be prevented. In addition, the second conductive layers 213a and 213b may include a material having a lower strain rate than that of the first conductive layer 215c and electrical/physical characteristics from those of the first conductive layer 215c on the first area 1A or the second area 2A, and thus, an efficiency of transferring electrical signals in the display device may be improved or a defect rate during the manufacturing processes may be reduced. For example, the second conductive layers 213a and 213b may include molybdenum, and the first conductive layer 215c may include aluminum. The first conductive layer 215c and the second conductive layers 213a and 213b may include multi-layered structures, if necessary.

Unlike the example shown in FIG. 2, an upper surface of the second conductive layer 213b located on the second area 2A may not be at least partially covered by the planarization layer 140 but exposed to outside, so as to be electrically connected to various electronic devices or printed circuit boards.

As shown in FIG. 2, the organic material layer 160 may cover an internal surface of the first opening in the first inorganic insulating layer. As described above, since the first conductive layer 215c may have the same material as those of the source and drain electrodes 215a and 215b and may be formed simultaneously with the source and drain electrodes 215a and 215b, and to do this, a conductive layer may be formed on an entire surface of the substrate 100 and patterned to form the source electrode 215a, the drain electrode 215b, and the first conductive layer 215c. If the organic material layer 160 does not cover the internal surface of the opening 110a in the buffer layer 110, the internal surface of the opening 120a in the gate insulating layer 120, or the internal surface of the opening 130a in the interlayer insulating layer 130, a conductive material may not be removed, but may remain on the internal surface of the opening 110a in the buffer layer 110, the internal surface of the opening 120a in the gate insulating layer 120, or the internal surface of the opening 130a in the interlayer insulating layer 130 during patterning the conductive layer. In this case, the conductive material remaining on the internal layer may cause electric short with other conductive layers.

Therefore, when the organic material layer 160 is formed, the organic material layer 160 may cover the internal surface of the first opening in the first inorganic insulating layer. In FIG. 2, the organic material layer 160 is described to have a constant thickness, but the organic material layer 160 may have a thickness that varies depending on locations, so that the organic material layer 160 may have an upper surface having a gentle inclination around the internal surface of the opening 110a of the buffer layer 110, the internal surface of the opening 120a of the gate insulating layer 120, or the internal surface of the opening 130a in the interlayer insulating layer 130. Accordingly, when the conductive layer is patterned in order to form the source electrode 215a, the drain electrode 215b, and the first conductive layer 215c, remaining of the conductive material that should be removed may be prevented effectively.

In addition, the organic material layer 160 may have an uneven surface 160a on at least partial upper surface in a +z direction, as shown in FIG. 2. Since the organic material layer 160 includes the uneven surface 160a, the first conductive layer 215c located on the organic material layer 160 may have an upper surface and/or a lower surface having a shape corresponding to the uneven surface 160a of the organic material layer 160.

As described above, since the tensile stress may be applied to the first conductive layer 215c when the substrate 100 is bent at the first bending area 1BA in the manufacturing processes, when the upper surface and/or the lower surface of the first conductive layer 215c has the shape corresponding to the uneven surface 160a of the organic material layer 160, an amount of the tensile stress applied to the first conductive layer 215c may be reduced. That is, the tensile stress generated during the bending process may be reduced via deformation of the shape of the organic material layer 160 having a smaller hardness. Here, the first conductive layer 215c having the uneven shape at least before the bending process may be transformed to correspond to the shape of the organic material layer 160, which is deformed due to the bending process, and thus, occurrence of the defect such as the disconnection in the first conductive layer 215c may be prevented.

Also, the uneven surface 160a is formed at least partially on the upper surface of the organic material layer 160 (in the +z direction), a surface area of the upper surface of the organic material layer 160 and a surface area of the upper and lower surfaces of the first conductive layer 215c in the first opening may be increased. A large surface area on the upper surface of the organic material layer 160 and the upper and lower surfaces of the first conductive layer 215c may denote that a deformation margin is large in order to reduce the tensile stress caused due to the bending of the substrate 100.

Since the first conductive layer 215c is located on the organic material layer 160, the lower surface of the first conductive layer 215c has a shape corresponding to the uneven surface 160a of the organic material layer 160. However, the upper surface of the first conductive layer 215c may have an uneven surface that is independent from the shape of the uneven surface 160a of the organic material layer 160.

For example, after forming a conductive material layer on the organic material layer 160, photoresist is applied on the conductive material layer and the photoresist is developed while varying an exposure amount according to locations on the photoresist by using a slit mask or a half-tone mask. Accordingly, the conductive material layer exposed due to the developing of the photoresist is etched and then the photoresist is removed, and then, the first conductive layer 215c is formed. Since the exposure amount varies depending on the locations on the photoresist by using the slit mask or the half-tone mask, a degree of etching the conductive material layer may vary depending on locations on the conductive material layer. Therefore, an uneven surface may be artificially formed on the upper surface of the first conductive layer 215c, and in this case, the upper surface of the first conductive layer 215c may have the uneven surface that is independent from the uneven surface 160a of the organic material layer 160. This will be applied to one or more embodiments and modified examples thereof that will be described later. Even if the process of artificially forming the uneven surface on the upper surface of the first conductive layer 215c is performed as described above, the uneven surface on the upper surface of the first conductive layer 215c may correspond to the uneven surface 160a of the organic material layer 160.

The uneven surface 160a on the upper surface of the organic material layer 160 (in the +z direction) may be formed in various ways. For example, a photoresist material is used when the organic material layer 160 is formed, and an exposure amount varies depending on locations on the organic material layer 160, the upper surface of which is flat, by using a slit mask or a half-tone mask so that a certain part may be etched (removed) more than other parts, Here, the part that is etched more may be a depressed portion in the upper surface of the organic material layer 160. The method used when manufacturing the display device according to the embodiment is not limited to the above example. For example, after forming the organic material layer 160 having the flat upper surface, certain portions are removed by a dry etching method, and other various methods may be used In order for the organic material layer 160 to have the uneven surface 160a on the upper surface (in the +z direction), the organic material layer 160 may include a plurality of grooves in the upper surface (in the +z direction), wherein the grooves extend in a first direction (+y direction). Here, the shape of the upper surface of the first conductive layer 215c on the organic material layer 160 corresponds to the shape of the upper surface of the organic material layer 160.

The organic material layer 160 may have the uneven surface 160a only within the first opening of the first inorganic insulating layer. In FIG. 2, a width UEW of the uneven surface 160a of the organic material layer 160 is smaller than a width OW of the first opening of the first inorganic insulating layer. If the organic material layer 160 has the uneven surface 160a throughout the inside and outside the first opening in the first inorganic insulating layer, the organic material layer 160 has the uneven surface 160a near the internal surface of the opening 110a in the buffer layer 110, the internal surface of the opening 120a in the gate insulating layer 120, or the internal surface of the opening 130a in the interlayer insulating layer 130.

Figure 4:
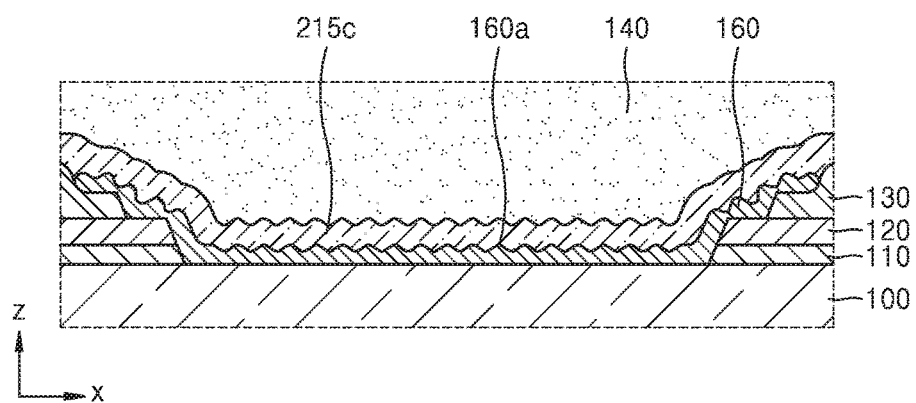
FIG. 4 is a schematic cross-sectional view partially showing a display device according to a comparative example.
Figure 5:
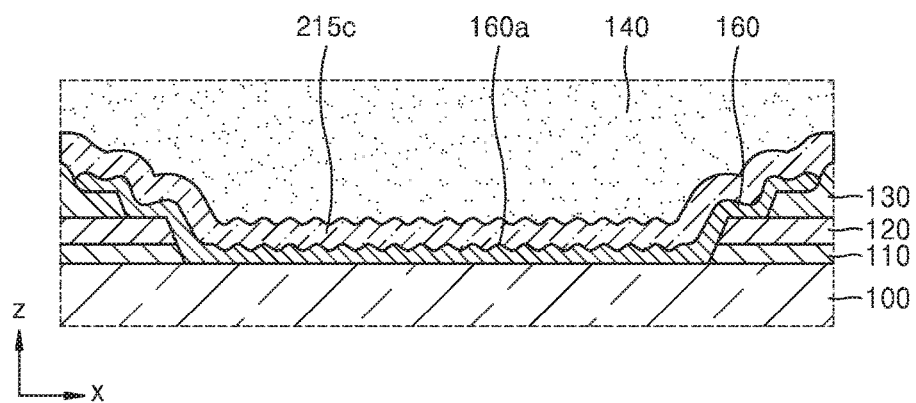
FIG. 5 is a schematic cross-sectional view partially showing a display device according to an embodiment.

In this case, as shown in FIG. 4 showing a part of a display device according to a comparative example, the organic material layer 160 has a relatively smaller thickness on depressed portions than that on protruding portions, and thus, when the depressed portions are located around the internal surface of the opening 110a in the buffer layer 110, the internal surface of the opening 120a in the gate insulating layer 120, or the internal surface of the opening 130a in the interlayer insulating layer 130, the organic material layer 160 may be disconnected. Therefore, the organic material layer 160 may only have the uneven surface 160a within the first opening of the first inorganic insulating layer, the disconnection of the organic material layer 160 around the internal surface of the opening 110a in the buffer layer 110, the internal surface of the opening 120a of the gate insulating layer 120, or the internal surface of the opening 130a in the interlayer insulating layer 130 may be prevented.

As described above, in order not to generate the disconnection in the first conductive layer 215c at the first bending area 1BA, the organic material layer 160 may have the uneven surface 160a on the first bending area 1BA. Therefore, an area of the uneven surface 160a of the organic material layer 160 may be greater than that of the first bending area 1BA and smaller than that of the first opening. That is, as shown in FIG. 2, the width UEW of the uneven surface 160a of the organic material layer 160 is greater than the width of the first bending area 1BA and smaller than the width OW of the first opening.

Figure 6:
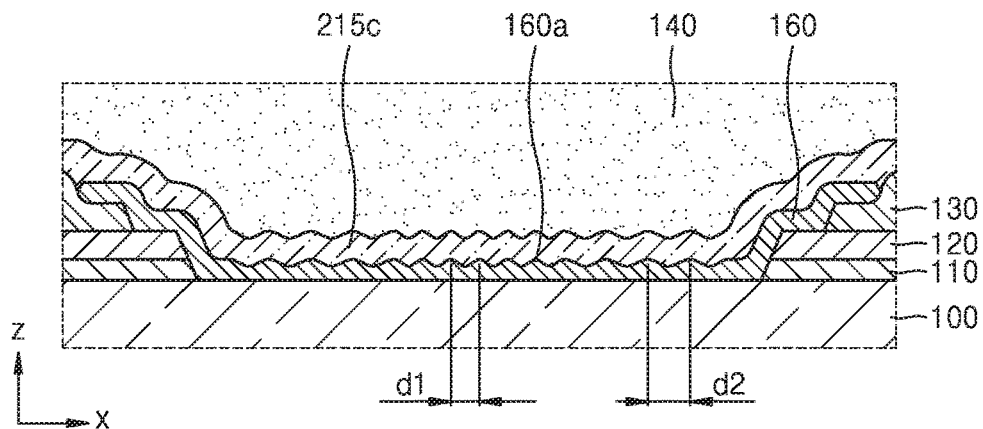
FIG. 6 is a schematic cross-sectional view partially showing a display device according to an embodiment.

In addition, as shown in FIG. 6 showing a part of a display device according to an embodiment, even if the organic material layer 160 has the uneven surface 160a throughout the inside and outside the first opening of the first inorganic insulating layer, the protruding portions in the organic material layer 160 may be located around the internal surface of the opening 110a in the buffer layer 110, the internal surface of the opening 120a in the gate insulating layer 120, or the internal surface of the opening 130a in the interlayer insulating layer 130. In this case, since the protruding portions of the organic material layer 160 are relatively thicker than the depressed portions of the organic material layer 160, the disconnection of the organic material layer 160 around the internal surface of the opening 110a in the buffer layer 110, the internal surface of the opening 120a in the gate insulating layer 120, or the internal surface of the opening 130a in the interlayer insulating layer 130 may be prevented.

In addition, a stress neutralization layer (SNL) 600 may be located on an outer portion of the display area DA. That is, the SNL 600 may be located over the first conductive layer 215c to correspond to at least the first bending area 1BA.

When a stack structure is bent, there is a stress neutral plane in the stack structure. If there is no SNL 600, when the substrate 100 is bent, an excessive tensile stress may be applied to the first conductive layer 215c in the first bending area 1BA, because the location of the first conductive layer 215c may not correspond to a stress neutral plane. However, by forming the SNL 600 and adjusting a thickness and a modulus of the SNL 600, a location of the stress neutral plane in the structure including the substrate 100, the first conductive layer 215c, and the SNL 600 may be adjusted. Therefore, the stress neutral plane may be adjusted to be located around the first conductive layer 215c via the SNL 600, and thus, the tensile stress applied to the first conductive layer 215c may be reduced.

The SNL 600 may extend to an end of the substrate 100 in the display device, unlike the example of FIG. 2. For example, in the second area 2A, the first conductive layer 215c, the second conductive layer 213b, and/or other conductive layers electrically connected to the first and second conductive layers are not covered at least partially by the interlayer insulating layer 130 or the planarization layer 140, but are electrically connected to various electronic devices or printed circuit boards. Accordingly, the first conductive layer 215c, the second conductive layer 213b, and/or the other conductive layers electrically connected to the first and second conductive layers may have portions that are electrically connected to the various electronic devices or the printed circuit boards. Here, the electrically connected portions need to be protected against external impurities such as moist, and thus, the SNL 600 may cover the electrically connected portions so as to perform as a protective layer as well. To do this, the SNL 600 may extend to, for example, the end of the substrate 100 of the display device.

In addition, in FIG. 2, an upper surface of the SNL 600 in a direction toward the display area DA (−x direction) coincides with an upper surface of the polarization plate 520 (in +z direction), but one or more embodiments are not limited thereto. For example, an end of the SNL 600 in the display area DA direction (−x direction) may partially cover an upper surface at the edge of the polarization plate 520. Otherwise, the end of the SNL 600 in the display area DA direction (−x direction) may not contact the polarization plate 520 and/or the OCA 510. In the latter case, during or after forming the SNL 600, degradation of a display device such as an OLED due to gas generated from the SNL 600 and moving toward the display area DA (−x direction) may be prevented.

As shown in FIG. 2, if the upper surface of the SNL 600 in a direction toward the display area DA (−x direction) coincides with the upper surface of the polarization plate 520 in the +z direction, if the end of the SNL 600 in the display area DA direction (−x direction) partially covers the upper surface at the end of the polarization plate 520, or if the end of the SNL 600 in the display area DA direction (−x direction) contacts the OCA 510, a thickness of the end of the SNL 600 adjacent to the display area DA (−x direction) may be greater than that of the other portions in the SNL 600. Since a liquid phase material or a paste-type material may be applied and hardened to form the SNL 600, a volume of the SNL 600 may be reduced through the hardening process. Here, if the end of the SNL 600 adjacent to the display area DA (−x direction) is in contact with the polarization plate 520 and/or the OCA 510, the end of the SNL 600 is fixed at the location, and thus, a volume reduction occurs in remaining portion of the SNL 600. Therefore, the thickness of the end of the SNL 600 adjacent to the display area DA (−x direction) may be greater than that of the other portion in the SNL 600.

FIG. 6 is a schematic cross-sectional view showing a part of a display device according to an embodiment, and for example, around the first opening in the first inorganic insulating layer. In the display device, the uneven surface 160a of the organic material layer 160 have a plurality of protrusions in a second direction (+x direction) that crosses the first direction (+y direction), as described above. Here, a distance d1 between two adjacent protrusions from among the protrusions at the center portion of the first opening is less than a distance d2 between two adjacent protrusions from among the protrusions on the other portion in the first opening.

As described above with reference to FIG. 1, the substrate 100 of the display device is bent about the first bending axis 1BAX extending in the first direction (+y direction). Accordingly, the substrate 100, the organic material layer 160, and the first conductive layer 215c are bent at the first bending area 1BA, and at this time, the largest tensile stress may be applied to the first conductive layer 215c at the center portion of the first bending area 1BA, that is, at the center portion of the first opening. Therefore, by reducing the distance d1 between the protrusions at the center portion of the first opening to be smaller than the distance d2 between the protrusions at the other portion in the first opening, the surface area of the upper surface on the organic material layer 160 at the center portion of the first opening and the surface area of the upper and lower surfaces of the first conductive layer 215c at the center portion of the first opening may be relatively greater than that of the other portion in the first opening. The large surface area on the upper surface of the organic material layer 160 and the upper and lower surfaces of the first conductive layer 215c may denote a large deformation margin for reducing the tensile stress caused by the bending of the substrate 100. Here, a point where the distance d1 between the protrusions is changed to the distance d2 may be located within the first bending area 1BA.

In other portion of the first opening than the center portion or the portion adjacent to the edge in the first opening, the distance between the adjacent protrusions may be different from the distance d1 or the distance d2. Moreover, the distance between the adjacent protrusions from among the protrusions may be gradually increased from the center portion of the first opening toward the edge of the first opening. This will be applied to other embodiments and modified examples thereof that will be described later.

Figure 7:
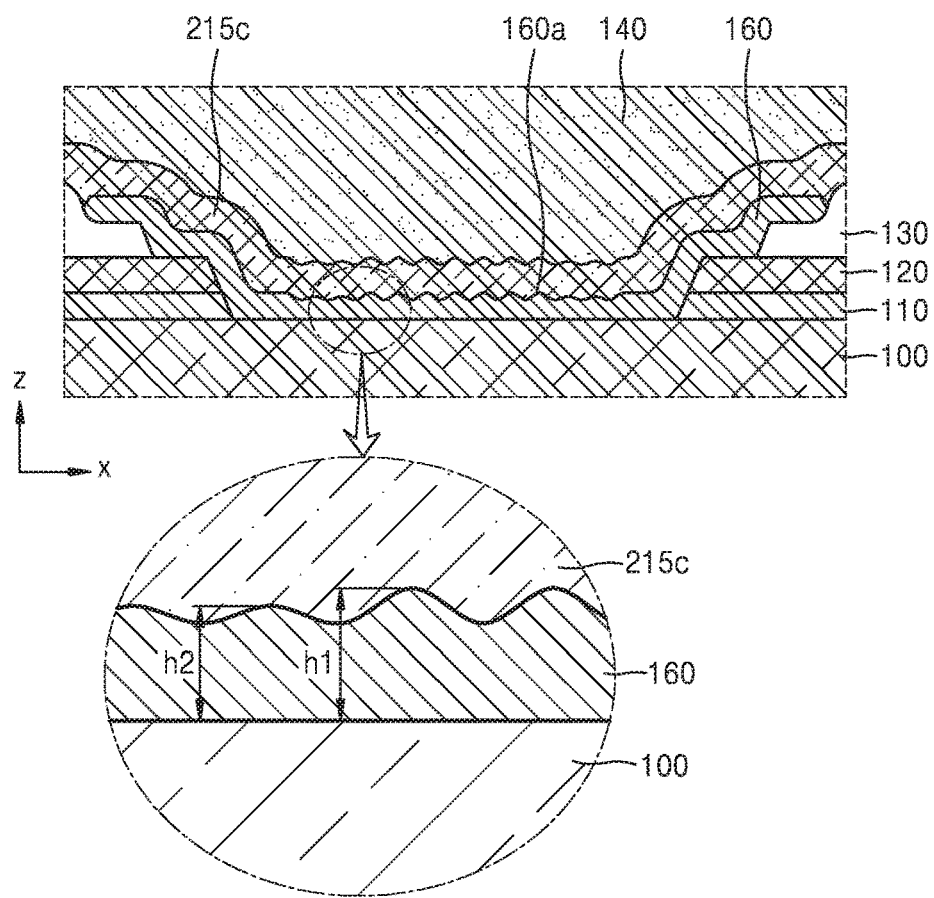
FIG. 7 is a schematic cross-sectional view partially showing a display device according to an embodiment.

FIG. 7 is a schematic cross-sectional view of a part of a display device according to an embodiment, and for example, around the first opening in the first inorganic insulating layer. In the display device, the uneven surface 160a of the organic material layer 160 may have a plurality of protrusions in the second direction (+x direction) crossing the first direction (+y direction) as described above. Here, a height h1 from the upper surface of the substrate 100 to the protrusions at the center portion of the first opening is greater than a height h2 from the upper surface of the substrate 100 to the protrusions at the other portion in the first opening.

As described above with reference to FIG. 1, the substrate 100 of the display device is bent about the first bending axis 1BAX extending in the first direction (+y direction). Accordingly, the substrate 100, the organic material layer 160, and the first conductive layer 215c are bent at the first bending area 1BA, and at this time, the largest tensile stress may be applied to the first conductive layer 215c at the center portion of the first bending area 1BA, that is, at the center portion of the first opening. Therefore, by increasing the height h1 from the upper surface of the substrate 100 to the protrusions at the center portion of the first opening to be greater than the height h2 from the upper surface of the substrate 100 to the protrusions at the other portion in the first opening, the surface area of the upper surface on the organic material layer 160 at the center portion of the first opening and the surface area of the upper and lower surfaces of the first conductive layer 215c at the center portion of the first opening may be relatively greater than that of the other portion in the first opening. The large surface area on the upper surface of the organic material layer 160 and the upper and lower surfaces of the first conductive layer 215c may denote a large deformation margin for reducing the tensile stress caused by the bending of the substrate 100. Here, a point where the height h1 from the upper surface of the substrate 100 to the protrusions is changed to the height h2 may be located within the first bending area 1BA.

In other portion of the first opening than the center portion or the portion adjacent to the edge in the first opening, the height from the upper surface of the substrate 100 to the protrusions may be different from the height h1 or the height h2. Moreover, the height from the upper surface of the substrate 100 to the protrusions may be gradually reduced from the center portion of the first opening toward the edge of the first opening. This will be applied to other embodiments and modified examples thereof that will be described later.

Figure 8:
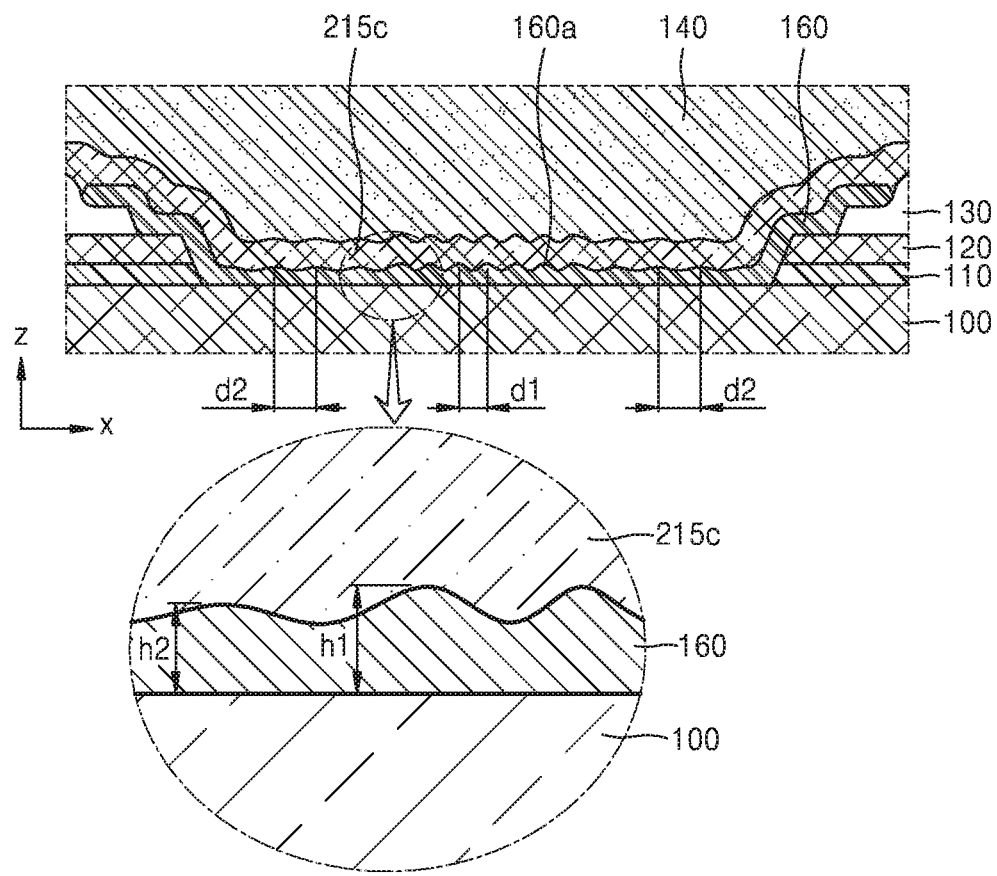
FIG. 8 is a schematic cross-sectional view partially showing a display device according to an embodiment.

As shown in FIG. 8 schematically illustrating a part of a display device according to an embodiment, examples shown in FIGS. 6 and 7 may be applied simultaneously to the display device.

For example, the distance d1 between the adjacent protrusions from among the protrusions at the center portion of the first opening is less than the distance d2 between the protrusions at the other portion in the first opening, and at the same time, the height h1 from the upper surface of the substrate 100 to the protrusions at the center portion of the first opening may be greater than the height h2 from the upper surface of the substrate 100 to the protrusions at the other portion in the first opening. As such, increasing in the surface area of the upper surface of the organic material layer 160 at the center portion of the first opening and the surface area of the upper and lower surface of the first conductive layer 215c at the center portion of the first opening may be maximized so that the surface areas of the above layers at the center portion in the first opening may be relatively greater than that of the other portion. The large surface area on the upper surface of the organic material layer 160 and the upper and lower surfaces of the first conductive layer 215c may denote a large deformation margin for reducing the tensile stress caused by the bending of the substrate 100. In this case, the heights of the protrusions or the distances among the protrusions may be changed gradually. Here, a point where the distance d1 between the protrusions is changed to the distance d2 may be located within the first bending area 1BA.

Figure 9:
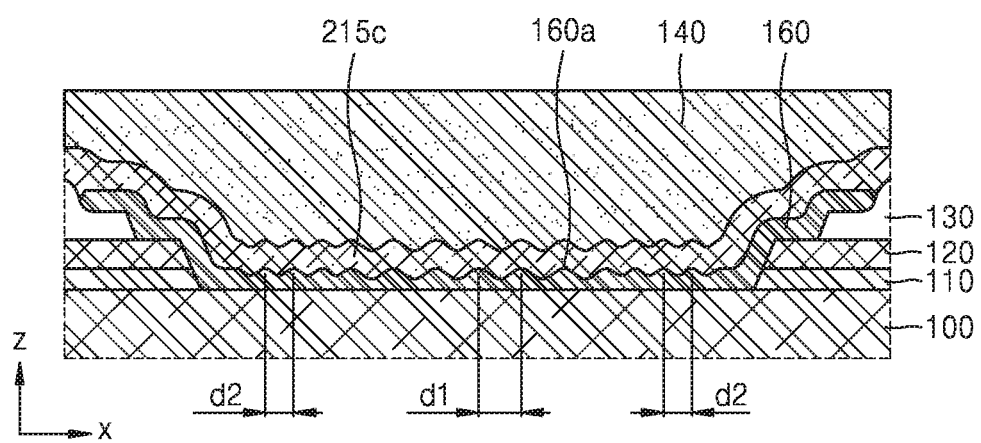
FIG. 9 is a schematic cross-sectional view partially showing a display device according to an embodiment.

FIG. 9 is a schematic cross-sectional view of a part of a display device according to an embodiment, and for example, around the first opening of the first inorganic insulating layer. In the display device, the uneven surface 160a of the organic material layer 160 may have a plurality of protrusions in the second direction (+x direction) crossing the first direction (+y direction). Here, a distance d2 between adjacent protrusions from among the protrusions adjacent to the inner side surface of the first opening may be less than a distance d1 between the adjacent protrusions at the other portion in the first opening.

As described above with reference to FIG. 1, the substrate 100 of the display device is bent about the first bending axis 1BAX extending in the first direction (+y direction). Accordingly, the substrate 100, the organic material layer 160, and the first conductive layer 215c are bent at the first bending area 1BA, and at this time, the tensile stress may be applied to the organic material layer 160 and the first conductive layer 215c. For example, since the buffer layer 110, the gate insulating layer 120, and/or the interlayer insulating layer 130 referred to as the first inorganic insulating layer including the inorganic material have the first opening, the first inorganic insulating layer does not exist in the first bending area 1BA. However, a part of the organic material layer 160, which is adjacent to the inner side surface of the first opening, is in contact with the first inorganic insulating layer or adjacent to the first inorganic insulating layer, and thus, the part of the organic material layer 160 may be affected by the first inorganic insulating layer having a relatively greater hardness, and accordingly, may be likely to be damaged due to the tensile stress.

Therefore, by reducing the distance d2 between the protrusions at the portion adjacent to the inner side surface of the first opening to be less than the distance d1 between the protrusions at the other portion in the first opening, a surface area of the upper surface of the organic material layer 160 at the portion adjacent to the inner side surface of the first opening and a surface area of the upper and lower surfaces of the first conductive layer 215c at the portion adjacent to the inner side surface of the first opening may be relatively greater than that at the other portion of the first opening. The large surface area on the upper surface of the organic material layer 160 and the upper and lower surfaces of the first conductive layer 215c may denote a large deformation margin for reducing the tensile stress caused by the bending of the substrate 100. Here, a point where the distance d1 between the protrusions is changed to the distance d2 may be located within the first bending area 1BA.

In other portion of the first opening than the center portion or the portion adjacent to the edge in the first opening, the distance between the adjacent protrusions may be different from the distance d1 or the distance d2. Moreover, the distance between the adjacent protrusions from among the protrusions may be gradually reduced from the center portion of the first opening toward the edge of the first opening.

A display device according to an embodiment may have a structure to which examples illustrated in FIGS. 6 and 9 are both applied. For example, a distance between the adjacent protrusions at the center portion of the first opening and a distance between the adjacent protrusions to the portion adjacent to the inner side surface of the first opening may be less than the distance d2 between the adjacent protrusions at the other portion in the first opening.

Figure 10:
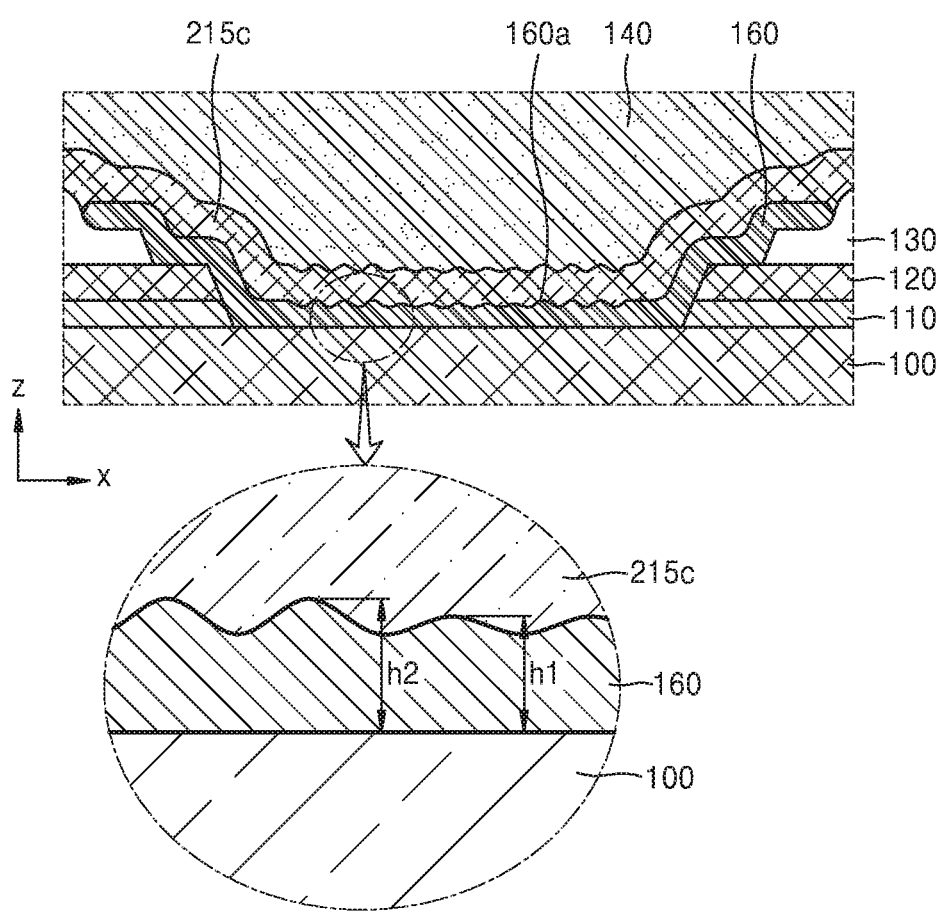
FIG. 10 is a schematic cross-sectional view partially showing a display device according to an embodiment.

FIG. 10 is a schematic cross-sectional view of a part of a display device according to an embodiment, and for example, around the first opening of the first inorganic insulating layer. In the display device, the uneven surface 160a of the organic material layer 160 may have a plurality of protrusions in the second direction (+x direction) crossing the first direction (+y direction) as described above. Here, the height h2 from the upper surface of the substrate 100 to the plurality of protrusions at the portion adjacent to the inner side surface of the first opening may be greater than the height h1 from the upper surface of the substrate 100 to the protrusions at the other portion in the first opening.

As described above with reference to FIG. 1, the substrate 100 of the display device is bent about the first bending axis 1BAX extending in the first direction (+y direction). Accordingly, the substrate 100, the organic material layer 160, and the first conductive layer 215c are bent at the first bending area 1BA, and at this time, the tensile stress may be applied to the organic material layer 160 and the first conductive layer 215c. For example, since the buffer layer 110, the gate insulating layer 120, and/or the interlayer insulating layer 130 referred to as the first inorganic insulating layer including the inorganic material have the first opening, the first inorganic insulating layer does not exist in the first bending area 1BA. However, a part of the organic material layer 160, which is adjacent to the inner side surface of the first opening, is in contact with the first inorganic insulating layer or adjacent to the first inorganic insulating layer, and thus, the part of the organic material layer 160 may be affected by the first inorganic insulating layer having a relatively greater hardness, and accordingly, may be likely to be damaged due to the tensile stress.

Therefore, by setting the height h2 from the upper surface of the substrate 100 to the protrusions at the portion adjacent to the inner side surface of the first opening to be greater than the height h1 from the upper surface of the substrate 100 to the protrusions at the other portion in the first opening, a surface area of the upper surface of the organic material layer 160 at the portion adjacent to the inner side surface of the first opening and a surface area of the upper and lower surfaces of the first conductive layer 215c at the portion adjacent to the inner side surface of the first opening may be relatively greater than that at the other portion of the first opening. The large surface area on the upper surface of the organic material layer 160 and the upper and lower surfaces of the first conductive layer 215c may denote a large deformation margin for reducing the tensile stress caused by the bending of the substrate 100. Here, a point where the height h1 from the upper surface of the substrate 100 to the protrusions is changed to the height h2 may be located within the first bending area 1BA.

In other portion of the first opening than the center portion or the portion adjacent to the edge in the first opening, the height from the upper surface of the substrate 100 to the protrusions may be different from the height h1 or the height h2. Moreover, the height from the upper surface of the substrate 100 to the protrusions may be gradually increased from the center portion of the first opening toward the edge of the first opening. This will be applied to other embodiments and modified examples thereof that will be described later.

A display device according to an embodiment may have a structure to which examples illustrated in FIGS. 7 and 10 are both applied. For example, the height from the upper surface of the substrate 100 at the center portion of the first opening and the height from the upper surface of the substrate 100 to the protrusions at the portion adjacent to the inner side surface of the first opening may be greater than the height from the upper surface of the substrate 100 to the protrusions at the other portion in the first opening.

Figure 11:
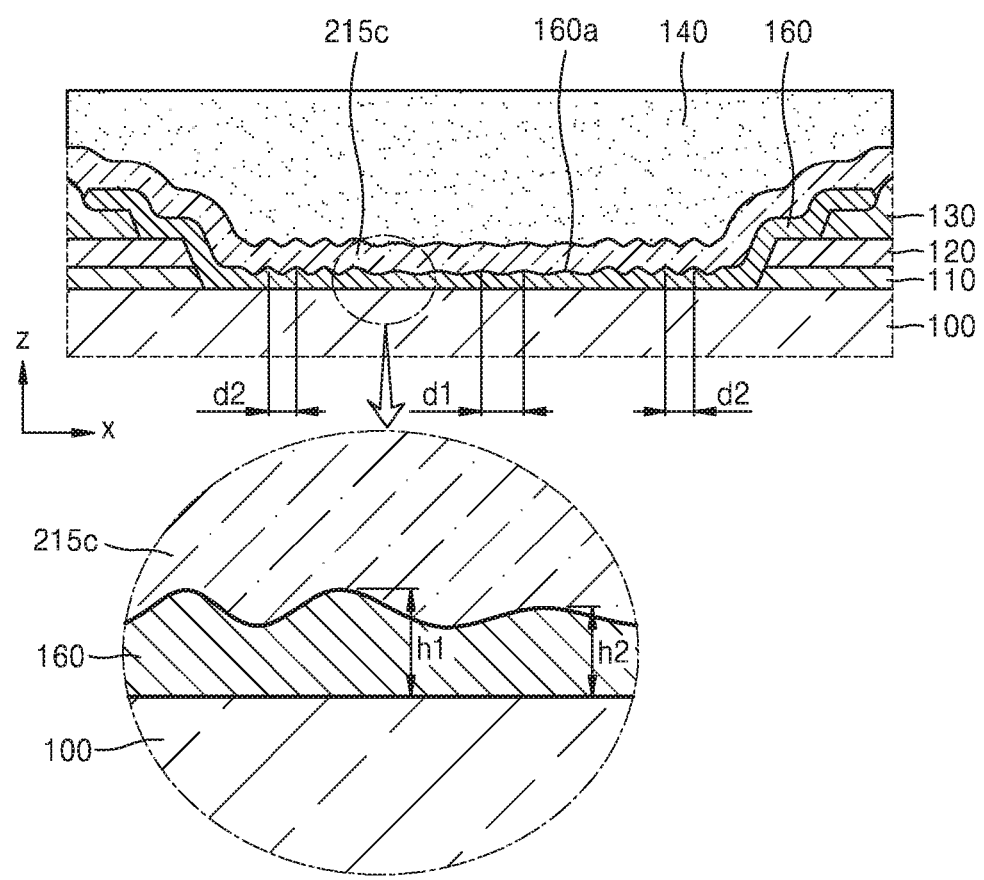
FIG. 11 is a schematic cross-sectional view partially showing a display device according to an embodiment.

In addition, as shown in FIG. 11 schematically illustrating a part of a display device according to an embodiment, the structures illustrated in FIGS. 9 and 10 may be both applied. For example, the distance d2 between the adjacent protrusions at the portion adjacent to the inner side surface of the first opening is less than the distance d1 between the adjacent protrusions at the other portion in the first opening, and moreover, the height h2 from the upper surface of the substrate 100 to the protrusions at the portion adjacent to the inner side surface of the first opening may be greater than the height h1 from the upper surface of the substrate 100 to the protrusions at the other portion in the first opening. As such, increasing in the surface area of the upper surface of the organic material layer 160 at the center portion of the first opening and the surface area of the upper and lower surface of the first conductive layer 215c at the portion adjacent to the inner side surface of the opening may be maximized so that the surface areas of the above layers at the portion adjacent to the inner side surface of the first opening may be relatively greater than that of the other portion. The large surface area on the upper surface of the organic material layer 160 and the upper and lower surfaces of the first conductive layer 215c may denote a large deformation margin for reducing the tensile stress caused by the bending of the substrate 100. In this case, the heights of the protrusions or the distances among the protrusions may be changed gradually.

Figure 12:
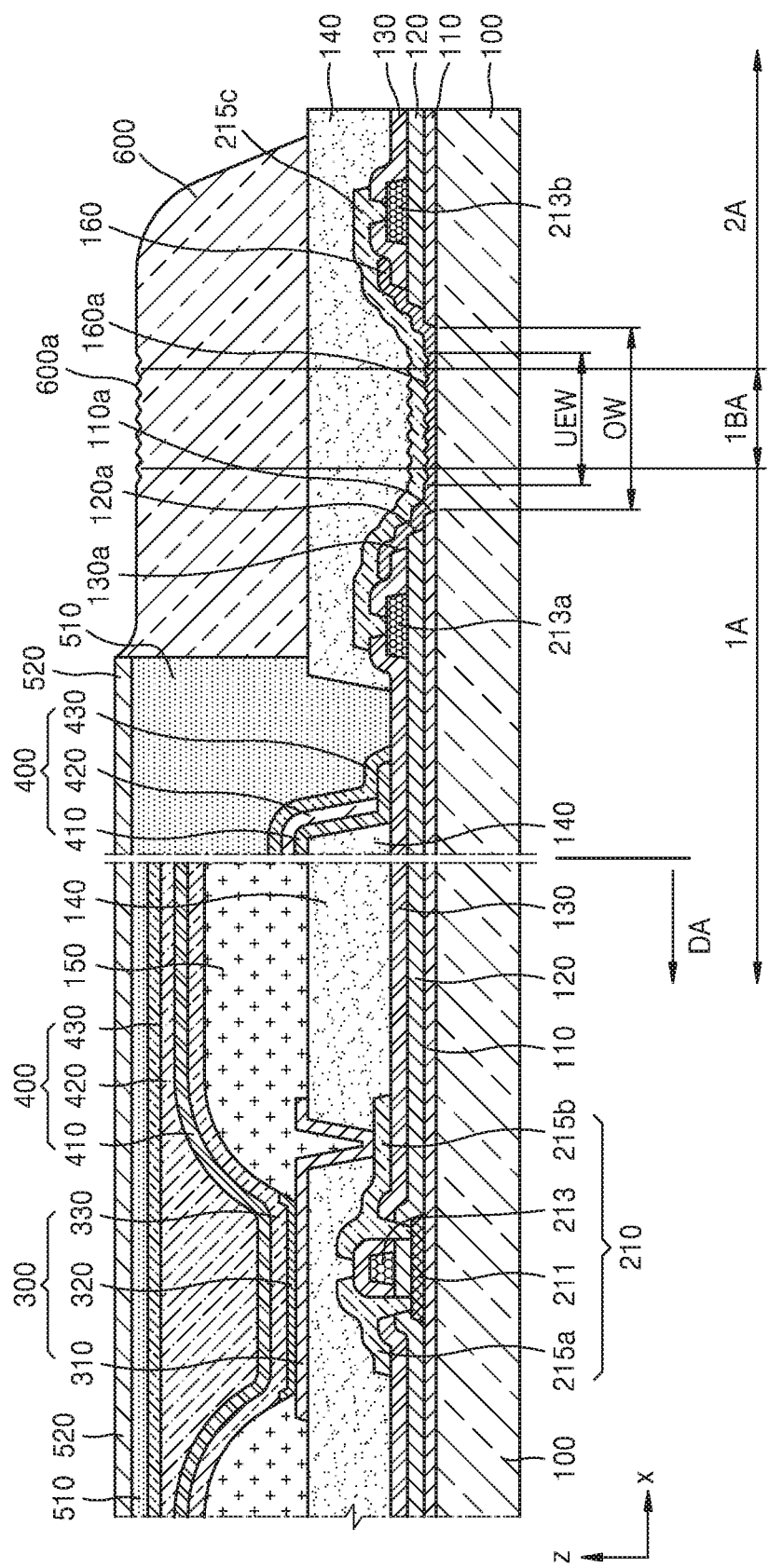
FIG. 12 is a schematic cross-sectional view partially showing a display device according to an embodiment.

FIG. 12 is a schematic cross-sectional view of a part of a display device according to an embodiment. As shown in FIG. 12, the SNL 600 includes an uneven surface 600a on at least a part of an upper surface thereof. The uneven surface 600a may correspond to at least the first bending area 1BA, or may have a greater area than that of the first bending area 1BA. Here, the uneven surface 600a of the SNL 600 may have a shape corresponding to that of the uneven surface 160a of the organic material layer 160.

As described above, the SNL 600 may adjust a location of the stress neutral plane in the stack structure including the substrate 100, the first conductive layer 215c, and the SNL 600. Therefore, the SNL 600 may allow the stress neutral plane to be located around the first conductive layer 215c so as to reduce the tensile stress applied to the first conductive layer 215c. Here, as shown in FIG. 12, since the uneven surface 600a of the SNL 600 has the shape corresponding to that of the uneven surface 160a of the organic material layer 160, the stress neutral plane may be exactly located on the first conductive layer 215c having a shape corresponding to the uneven surface 160a of the organic material layer 160.

As such, the tensile stress that is applied to the first conductive layer 215c when the substrate 100 is bent at the first bending area 1BA may be reduced so as to prevent or reduce occurrence of defects in the first conductive layer 215c.

The SNL 600 is formed of an organic material, and may be formed by various methods.

Figure 13:
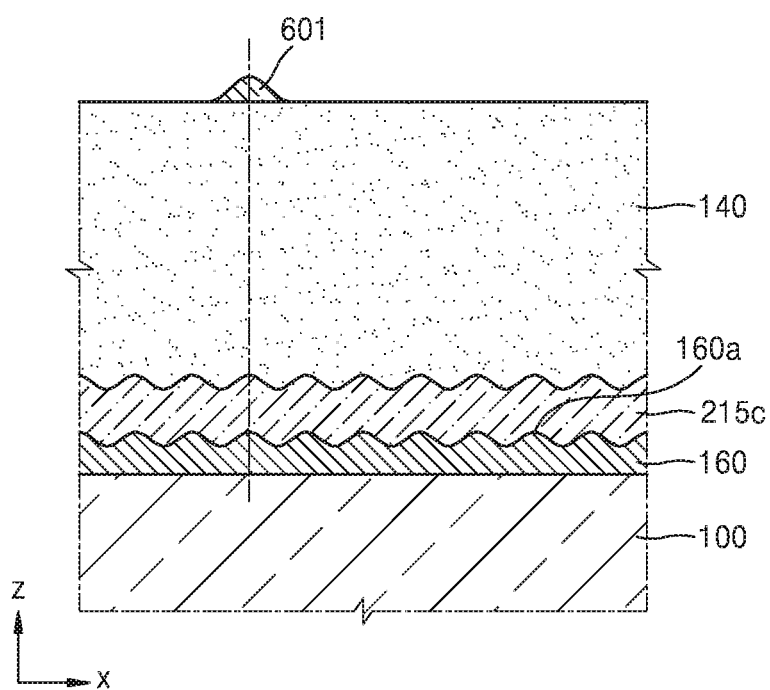
FIGS. 13, 14 and 15 are schematic cross-sectional views illustrating processes of manufacturing the display device of FIG. 12.
Figure 14:
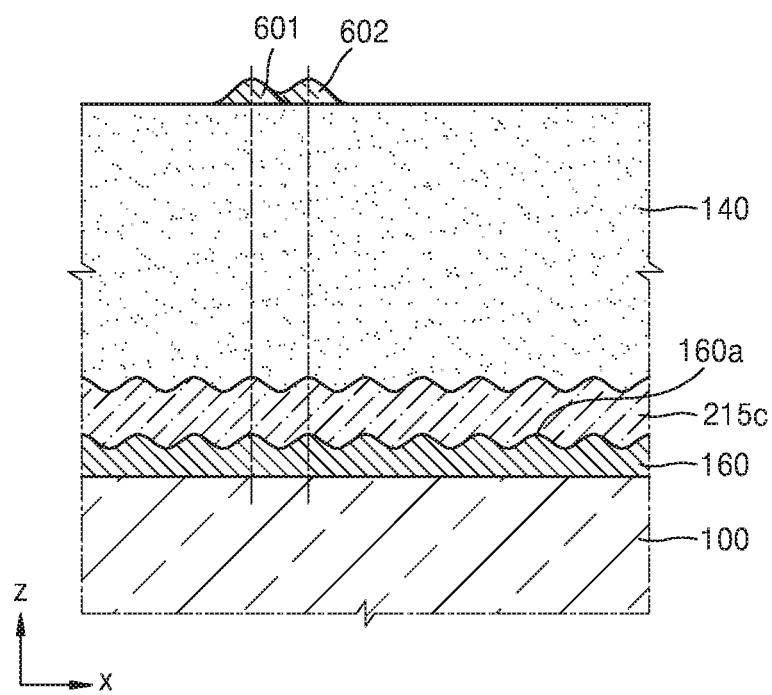
Figure 15:
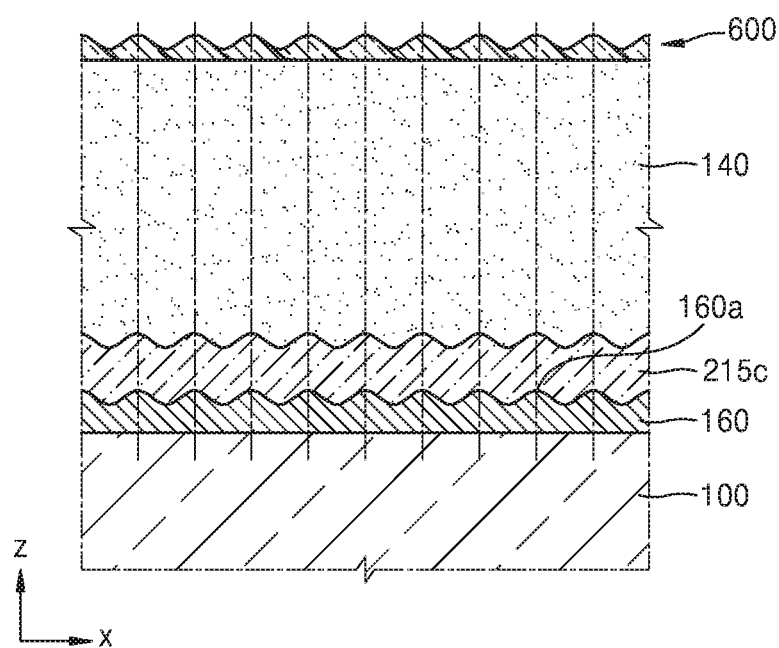

For example, as shown in FIG. 13, a first portion 601 extending in a y-axis direction along with an edge of the substrate 100 so as to correspond to a first protrusion that is one of the protrusions on the uneven surface 160a of the organic material layer 160 is formed by an inkjet printing method, a jetting method, or a dotting method, and then, ultraviolet (UV) rays are irradiated onto the first portion 601 to harden the first portion 601, In addition, as shown in FIG. 14, a second portion 602 extending in the y-axis direction along with the edge of the substrate 100 to correspond to a second protrusion that is adjacent to the first protrusion from among the protrusions of the uneven surface 160a of the organic material layer 160 is formed, and then, UV rays may be irradiated to the second portion 602 to harden the second portion 602. Here, a contact portion between the first portion 601 and the second portion 602 is a concave portion, and the first portion 601 and the second portion 602 have convex portions at center portions thereof. When the first and second portions 601 and 602 are formed, the center portions of the first and second portions 601 and 602 are convex due to characteristics of the organic material included in the first and second portions 601 and 602. By repeatedly performing the above processes, the uneven surface 600a of the SNL 600 may correspond to the uneven surface 160a of the organic material layer 160 as shown in FIG. 15. However, unlike the example shown in FIG.15, there may be no boundary between the first portion and the second portion because the first and second portions are formed by using the same organic material.

Figure 16:
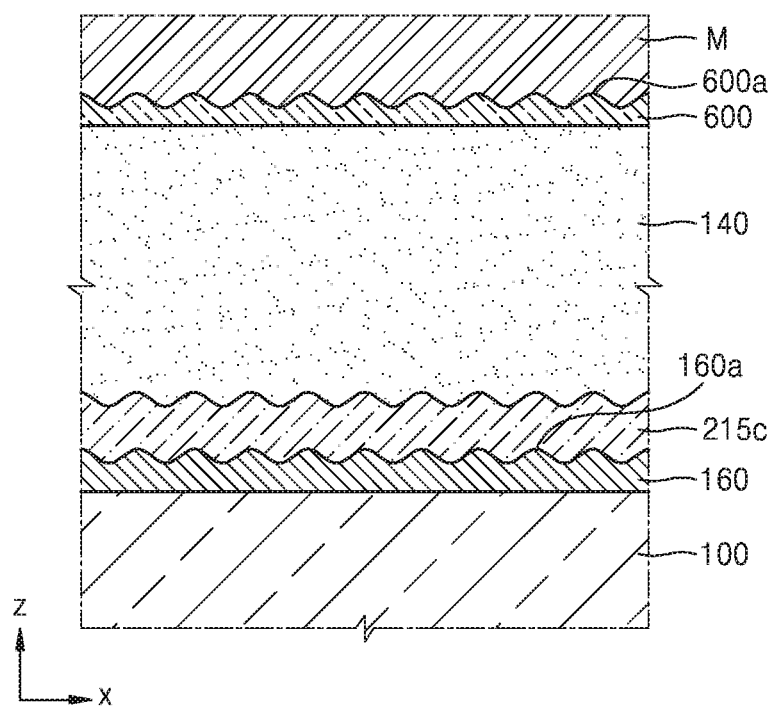
FIG. 16 is a schematic cross-sectional view illustrating processes of manufacturing the display device of FIG. 12.

Otherwise, an organic material for forming the SNL 600 is located on the first conductive layer 215c so as to at least correspond to the first bending area 1BA, and a mold M having a lower surface corresponding to the uneven surface 160a of the organic material layer 160 may contact the organic material for forming the SNL 600 as shown in FIG. 16. In the above state, the UV rays are irradiated to the organic material for forming the SNL 600 to harden the organic material, and then, the mold M is removed. Thus, the uneven surface 600a of the SNL 600 may correspond to the uneven surface 160a of the organic material layer 160. If necessary, the UV rays are irradiated onto the organic material for forming the SNL 600 to firstly harden the organic material before contacting the mold M with the organic material for forming the SNL 600 and after that, the lower surface of the mold M contacts the organic material for forming the SNL 600. Then, the UV rays are irradiated again to the organic material for forming the SNL 600 to secondarily harden the organic material, and then, the mold M may be removed.

FIGS. 13 to 16, as well as FIG. 12, schematically illustrate the display device according to the embodiment, and thus, thicknesses of the components may be exaggerated or simplified for convenience of description, and this is the same in the one or more embodiments and modified examples thereof that will be described later.

Figure 17:
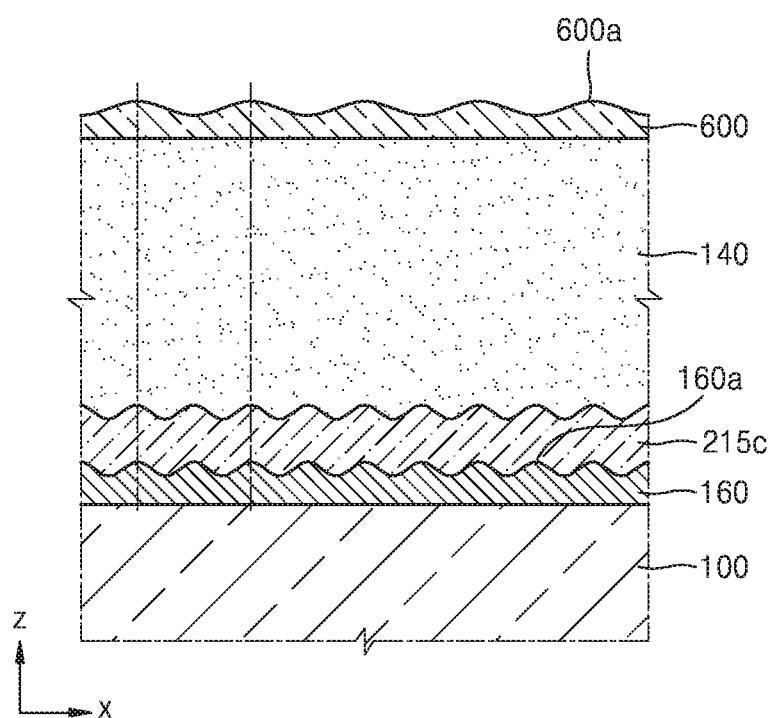
FIG. 17 is a schematic cross-sectional view partially showing a display device according to an embodiment.

Although the uneven surface 600a of the SNL 600 may precisely correspond to the uneven surface 160a of the organic material layer 160 as shown in FIG. 12, the uneven surface 600a of the SNL 600 may roughly correspond to the uneven surface 160a of the organic material layer 160 as shown in FIG. 17 that is a schematic cross-sectional view of a display device according to an embodiment.

For example, as shown in FIG. 17, an interval between the protrusions on the uneven surface 600a of the SNL 600 may be integer-times, e.g., twice, greater than that of the uneven surface 160a of the organic material layer 160. In this case, all of the protrusions on the uneven surface 600a of the SNL 600 correspond to at least some of the protrusions on the uneven surface 160a of the organic material layer 160, and thus, the tensile stress applied to the first conductive layer 215c during bending the substrate 100 at the first bending area 1BA may be reduced. Accordingly, occurrence of defects in the first conductive layer 215c may be reduced or prevented. On the contrary, the interval between the protrusions on the uneven surface 160a of the organic material layer 160 may be integer-times greater than that of the protrusions on the uneven surface 600a of the SNL 600. In this case, all of the protrusions on the uneven surface 160a of the organic material layer 160 correspond to at least some of the protrusions on the uneven surface 600a of the SNL 600, and thus, the tensile stress applied to the first conductive layer 215c during bending the substrate 100 at the first bending area 1BA may be reduced. Accordingly, occurrence of defects in the first conductive layer 215c may be reduced or prevented.

Figure 18:
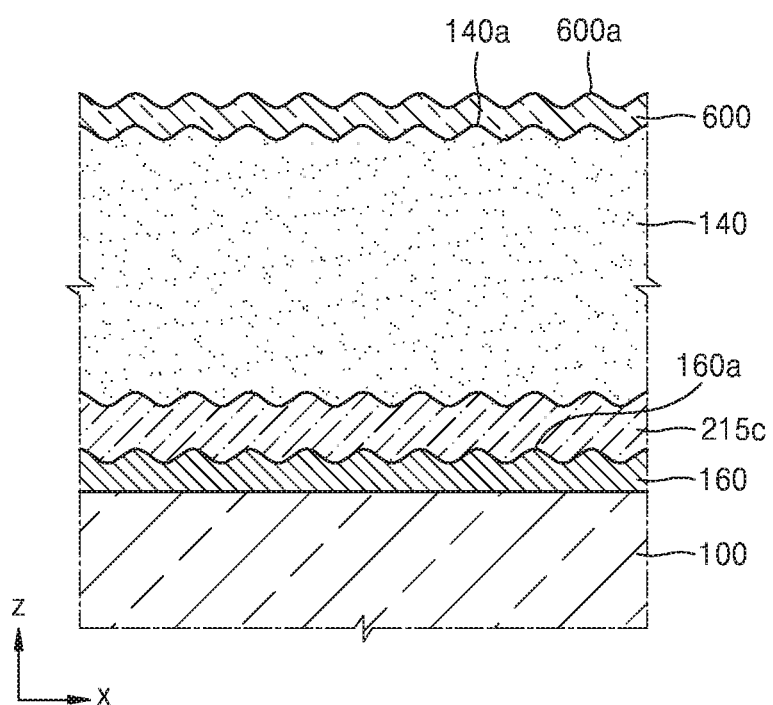
FIG. 18 is a schematic cross-sectional view partially showing a display device according to an embodiment.

In addition, the upper surface of the planarization layer 140 may be flat as shown in FIG. 12, or may have an uneven surface 140a as shown in FIG. 18 that is a schematic cross-sectional view of a part of a display device according to an embodiment. A method of forming the uneven surface 140a on the upper surface of the planarization layer 140 may be the same as/similar to that of forming the uneven surface 160a on the upper surface of the organic material layer 160.

The structure of the SNL 600 described above with reference to FIGS. 12 to 18 may be applied to the display devices according to the above described embodiments and other embodiments that will be described below.

Figure 19:
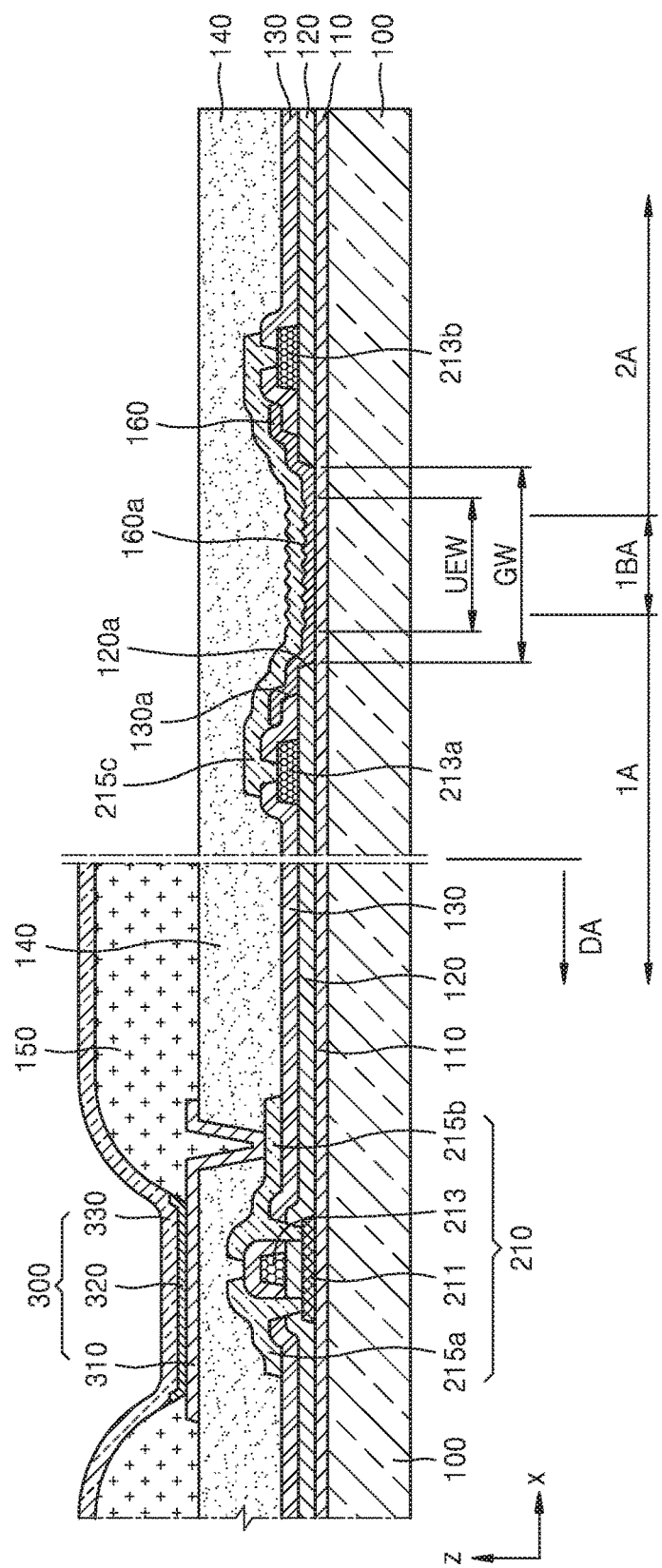
FIG. 19 is a schematic cross-sectional view partially showing a display device according to an embodiment.

So far, the first inorganic insulating layer is described to have the opening, but one or more embodiments are not limited thereto. For example, the first inorganic insulating layer may not include the first opening that penetrates completely through the first inorganic insulating layer, but may include a first groove at a location corresponding to the first bending area 1BA. FIG. 19 is a schematic cross-sectional view of a part of a display device according to an embodiment.

As shown in FIG. 19, the buffer layer 110 may be continuously formed throughout the first area 1A, the first bending area 1BA, and the second area 2A. In addition, the gate insulating layer 120 includes the opening 120a corresponding to the first bending area 1BA, and the interlayer insulating layer 130 also includes the opening 130a corresponding to the first bending area 1BA. Accordingly, the first inorganic insulating layer that includes the buffer layer 110, the gate insulating layer 120, and the interlayer insulating layer 130 may be described to have the first groove corresponding to the first bending area 1BA. The first inorganic insulating layer may include a first groove of a different type. For example, the upper surface of the buffer layer 110 (in +z direction) may be partially removed, or a lower surface of the gate insulating layer 120 (in −z direction) may not be removed.

Figure 20:
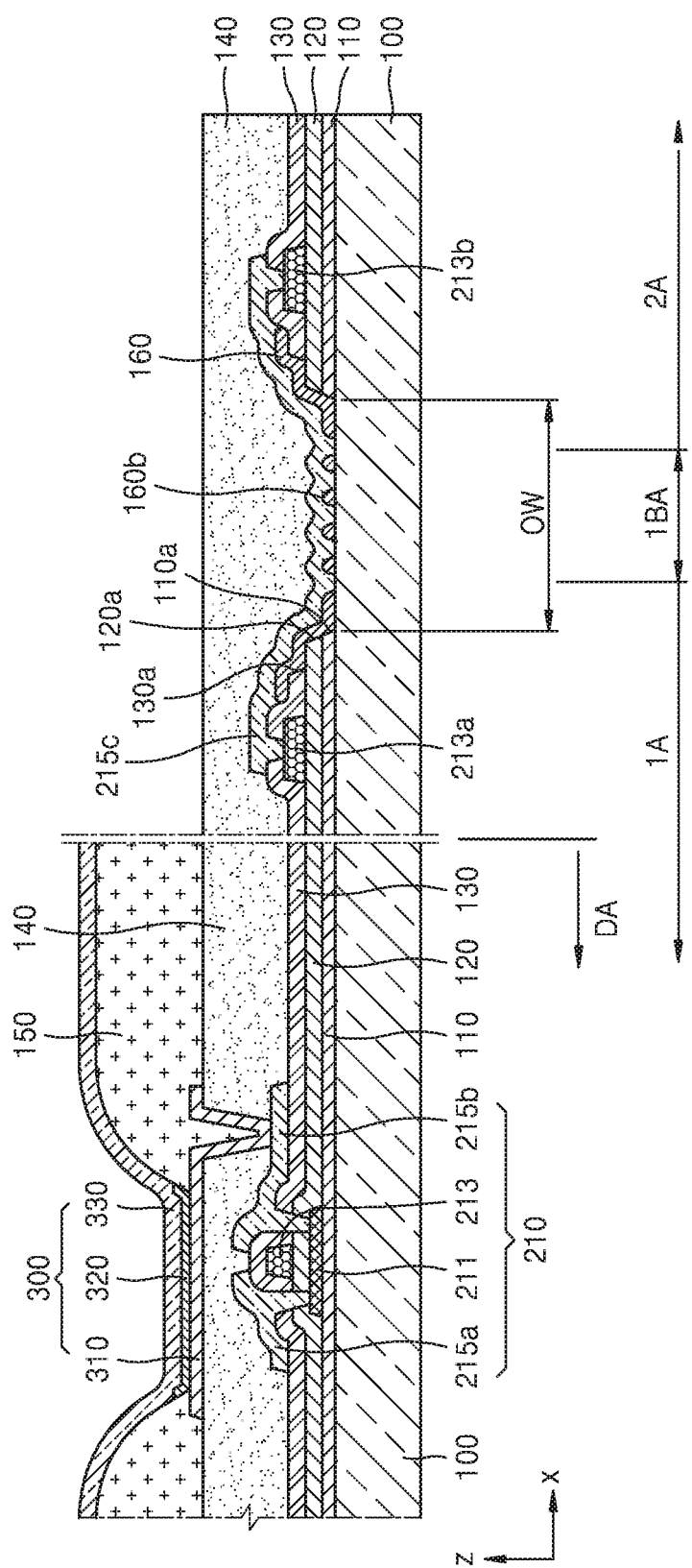
FIG. 20 is a schematic cross-sectional view partially showing a display device according to an embodiment.

That the first groove corresponds to the first bending area 1BA may denote that the first groove overlaps with the first bending area 1BA. Here, an area of the first groove may be greater than that of the first bending area 1BA. To do this, a width GW of the first groove is shown to be greater than a width of the first bending area 1BA in FIG. 19. Here, the area of the first groove may be defined as an area of the opening having the smallest area, between the openings 120a and 130a of the gate insulating layer 120 and the interlayer insulating layer 130. In FIG. 20, the area of the first groove is defined by the area of the opening 120a in the gate insulating layer 120.

In the display device, the organic material layer 160 may fill at least partially the first groove. In addition, the first conductive layer 215c is located on the organic material layer 160 in a region where the organic material layer 160 is formed.

In FIG. 19, the display device is not in bent state for convenience of description, but the substrate 100 in the display device according to the embodiment is actually bent at the first bending area 1BA as shown in FIG. 1. To do this, the display device in which the substrate 100 is flat is manufactured as shown in FIG. 19, and after that, the substrate 100 is bent at the first bending area 1BA so that the display device may be in a state shown in FIG. 1. Here, when the substrate 100 is bent at the first bending area 1BA, the tensile stress may be applied to the first conductive layer 215c, but in the display device, the first inorganic insulating layer includes the first groove corresponding to the first bending area 1BA, and the portion of the first conductive layer 215c corresponding to the first bending area 1BA is located on the organic material layer 160 that fills the first groove of the first inorganic insulating layer at least partially. Therefore, occurrence of a crack in the portion of the first conductive layer 215c located on the organic material layer 160, wherein the portion corresponds to the first bending area 1BA, may be prevented, or a possibility of generating the crack may be reduced.

Also, the above description about the case in which the first inorganic insulating layer includes the first opening may be applied to the case in which the first inorganic insulating layer has the first groove. For example, the organic material layer 160 may cover an inner side surface of the first groove. In addition, the organic material layer 160 may have the uneven surface 160a at least partially on the upper surface thereof within the first groove. In addition, the area of the uneven surface 160a in the organic material layer 160 may be greater than that of the first bending area 1BA, and may be less than that of the first groove. The above descriptions about pitches or heights of the protrusions on the uneven surface 160a of the organic material layer 160 with reference to FIGS. 6 to 10 may be also applied to the case in which the first inorganic insulating layer includes the first groove. In addition, hereinafter the case in which the first inorganic insulating layer includes the first opening will be described for convenience of description, but the descriptions below may be applied to the case in which the first inorganic insulating layer includes the first groove.

FIG. 20 is a schematic cross-sectional view of a part of a display device according to an embodiment. In the display device, the organic material layer 160 includes a plurality of islands 160b. The islands 160b extend in the first direction (+y direction), and are spaced apart from one another in the second direction (+x direction). The first conductive layer 215c covers the islands 160b, and accordingly, the first conductive layer 215c located on the islands 160b has an upper surface corresponding to shapes of the islands 160b. Therefore, a surface area of the upper surface of the first conductive layer 215c (+z direction) is increased.

During the manufacturing processes, the substrate 100 is bent at the first bending area 1BA, and then, the tensile stress may be applied to the first conductive layer 215c. Accordingly, when the upper surface and/or the lower surface of the first conductive layer 215c may have the shape corresponding to the islands 160b of the organic material layer 160, the amount of the tensile stress applied to the first conductive layer 215c may be reduced. That is, the tensile stress that may generate during the bending process may be reduced through deformation of the islands 160b of the organic material layer 160 having a relatively less strength. Here, the shape of the first conductive layer 215c that has an uneven shape at least before the bending process is deformed to correspond to the shape of the organic material layer 160 that has been deformed due to the bending process, and thus, defects such as disconnection may be effectively prevented from occurring in the first conductive layer 215c.

Since the first conductive layer 215c is located on the organic material layer 160, the lower surface of the first conductive layer 215c corresponds to the islands 160b of the organic material layer 160. However, the upper surface of the first conductive layer 215c may have the uneven surface, but the uneven surface may he independently formed from the islands 160b of the organic material layer 160.

For example, a conductive material layer is formed on the organic material layer 160, and a photoresist is applied onto the conductive material layer. Then, the photoresist is developed varying an exposure amount according to locations on the photoresist by using a slit mask or a half-tone mask, and accordingly, exposed conductive material layer is etched and the photoresist is removed to form the first conductive layer 215c. Since the exposure amount varies depending on the locations of the photoresist by using the slit mask or the half-tone mask, the conductive material layer has an etching degree that varies depending on locations thereof. Therefore, the uneven surface may be artificially formed on the upper surface of the first conductive layer 215c in the above manner, and in this case, the uneven surface of the upper surface of the first conductive layer 215c may have a shape that does not correspond to the islands 160b of the organic material layer 160. This will be applied to the embodiments and modifies examples thereof that will be described later. However, even if the process of artificially forming the uneven surface in the upper surface of the first conductive layer 215c is performed, the uneven surface of the first conductive layer 215c may correspond to the islands 160b of the organic material layer 160.

Figure 21:
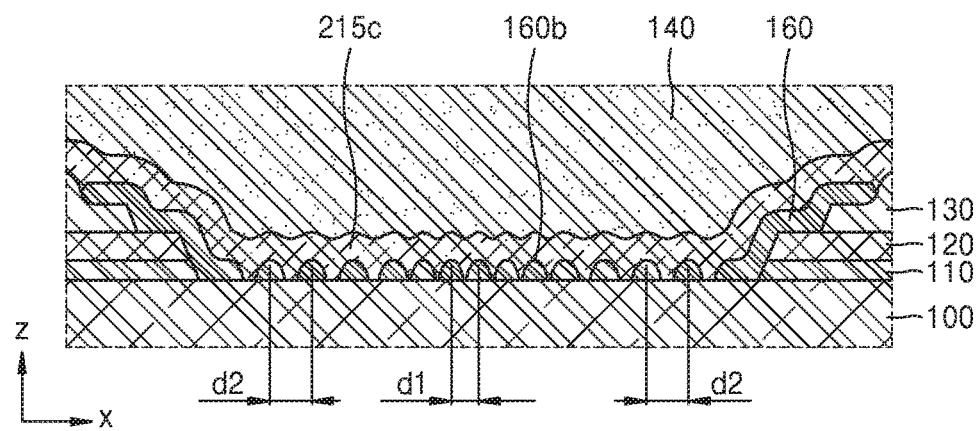
FIG. 21 is a schematic cross-sectional view partially showing a display device according to an embodiment.

FIG. 21 is a schematic cross-sectional view of a part of a display device according to an embodiment, and for example, around the first opening of the first inorganic insulating layer. In the display device, the islands 160b of the organic material layer 160 are spaced apart from one another in the second direction (+x direction) as described above. Here, a distance d1 between adjacent islands 160b from among the islands 160b at the center portion of the first opening is less than a distance d2 between adjacent islands 160b from among the islands 160b at the other portion in the first opening.

As described above with reference to FIG. 1 the substrate 100 of the display device is bent about the first bending axis 1BAX extending in the first direction (+y direction). Accordingly, the substrate 100, the organic material layer 160, and the first conductive layer 215c are bent at the first bending area 1BA, and at this time, the largest tensile stress may he applied to the first conductive layer 215c at the center portion of the first bending area 1BA, that is, the center portion of the first opening. Therefore, when the distance d1 between the islands 160b at the center portion of the first opening is less than the distance d2 between the islands 160b at the other portion of the first opening, a surface area of the islands 160b at the center portion of the first opening and a surface area of the upper and lower surfaces of the first conductive layer 215c at the center portion of the first opening may be relatively greater than that of the other portion in the first opening. The large surface area of the islands 160b and the upper and lower surfaces of the first conductive layer 215c may denote a large deformation margin for reducing the tensile stress caused by the bending of the substrate 100.

Figure 22:
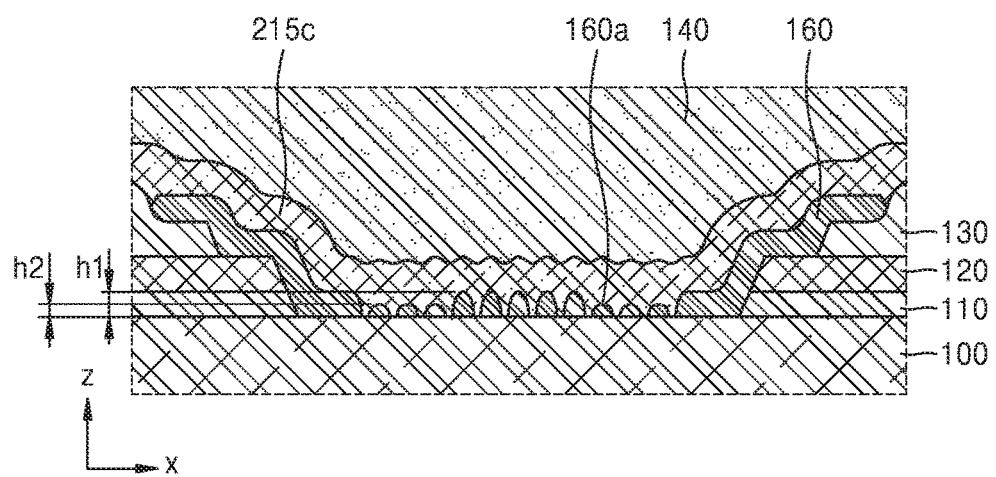
FIG. 22 is a schematic cross-sectional view partially showing a display device according to an embodiment.

FIG. 22 is a schematic cross-sectional view of a part of a display device according to an embodiment, and for example, around the first opening of the first inorganic insulating layer. In the display device, a height h1 from the upper surface of the substrate 100 to the islands 160b at the center portion of the first opening is greater than a height h2 from the upper surface of the substrate 100 to the plurality of islands 160b at the other portion in the first opening.

As described above with reference to FIG. 1, the substrate 100 of the display device is bent about the first bending axis 1BAX extending in the first direction (+y direction). Accordingly, the substrate 100, the organic material layer 160, and the first conductive layer 215c are bent at the first bending area 1BA, and at this time, the largest tensile stress may be applied to the first conductive layer 215c at the center portion of the first bending area 1BA, that is, the center portion of the first opening. Therefore, when the height h1 from the upper surface of the substrate 100 to the islands 160b at the center portion of the first opening is greater than the height h2 from the upper surface of the substrate 100 to the islands 160b at the other portion in the first opening, a surface area of the islands 160b at the center portion of the first opening and a surface area of the upper and lower surfaces of the first conductive layer 215c at the center portion of the first opening may be relatively greater than that of the other portion in the first opening.

Figure 23:
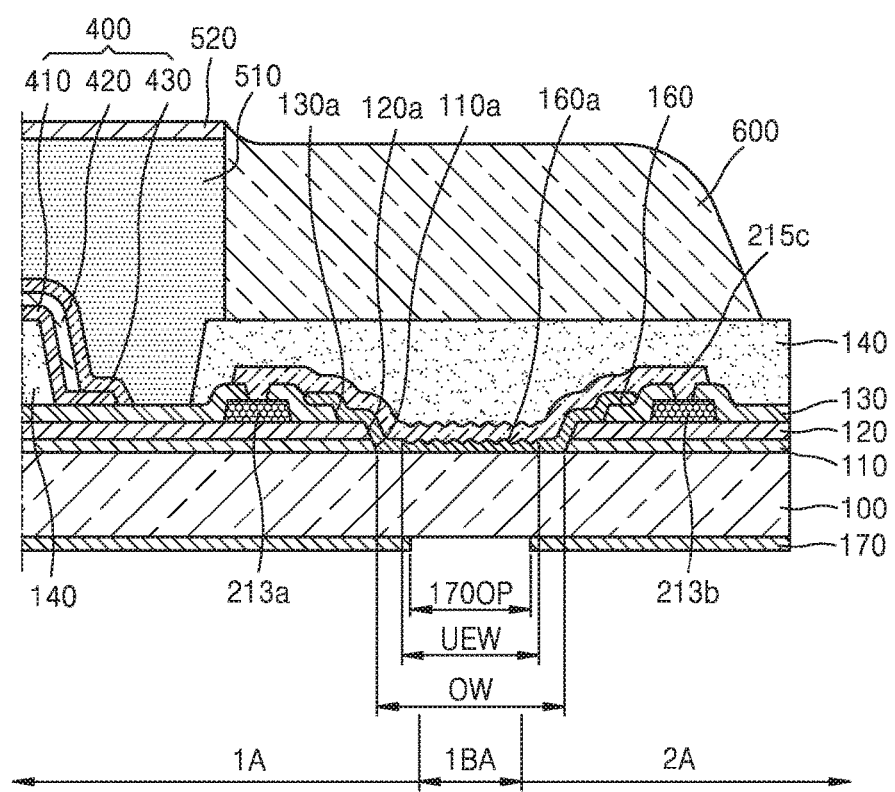
FIG. 23 is a schematic cross-sectional view partially showing a display device according to an embodiment.

In addition, as shown in FIG. 23 that is a schematic cross-sectional view of a part of a display device according to an embodiment, the display device may further include a protective film 170 for protecting the substrate 100. The protective film 170 is a lower protective film for protecting a lower surface of the substrate 100, and as shown in FIG. 23, the protective film 170 may include an opening 170OP. The opening 170OP corresponds to the first bending area 1BA, and an area of the opening 170OP may be greater than that of the first bending area 1BA. In FIG. 23, a width of the opening 170OP is greater than the width of the first bending area 1BA.

Since the protective film 170 protects the lower surface of the substrate 100, the protective film 170 may have a strength on its own. Accordingly, if the protective film 170 has a low level of flexibility, the protective film 170 may be isolated from the substrate 100 when the substrate 100 is bent. Therefore, as shown in FIG. 23, when the protective film 170 includes the opening 170OP corresponding to the first bending area 1BA, occurrence of the isolation between the protective film 170 and the substrate 100 may be effectively prevented. To do this, as described above, the area of the opening 170OP of the protective film 170 needs to be greater than that of the first bending area 1BA.

However, considering that the protective film 170 has to protect the lower surface of the substrate 100 as much as possible, the area of the opening 170OP of the protective film 170 needs to be reduced. Therefore, the area of the opening 170OP in the protective film 170 may be greater than that of the first bending area 1BA, and at the same time, may be smaller than that of the first opening in the first inorganic insulating layer. Moreover, the area of the opening 170OP in the protective film 170 may be smaller than that of the uneven surface 160a of the organic material layer 160. Thus, in FIG. 23, the width of the opening 170OP is greater than that of the first bending area 1BA, whereas the width of the opening 170OP is less than the width OW of the first opening in the first inorganic insulating layer and the width UEW of the uneven surface 160a of the organic material layer 160. The protective film 170 having the above-described shape may be applied to display devices according to the previous embodiments and the other embodiments that will be described later.

If necessary, unlike the protective film 170 shown in FIG. 23, the protective film 170 may not cover the edge of the substrate 100. That is, the protective film 170 may not exist on the second area 2A.

So far, the example in which the first conductive layer 215c is formed of the same material as the source or drain electrode 215a or 215b in the TFT 210 at the same time is described above, but one or more embodiments are not limited thereto.

Figure 24:
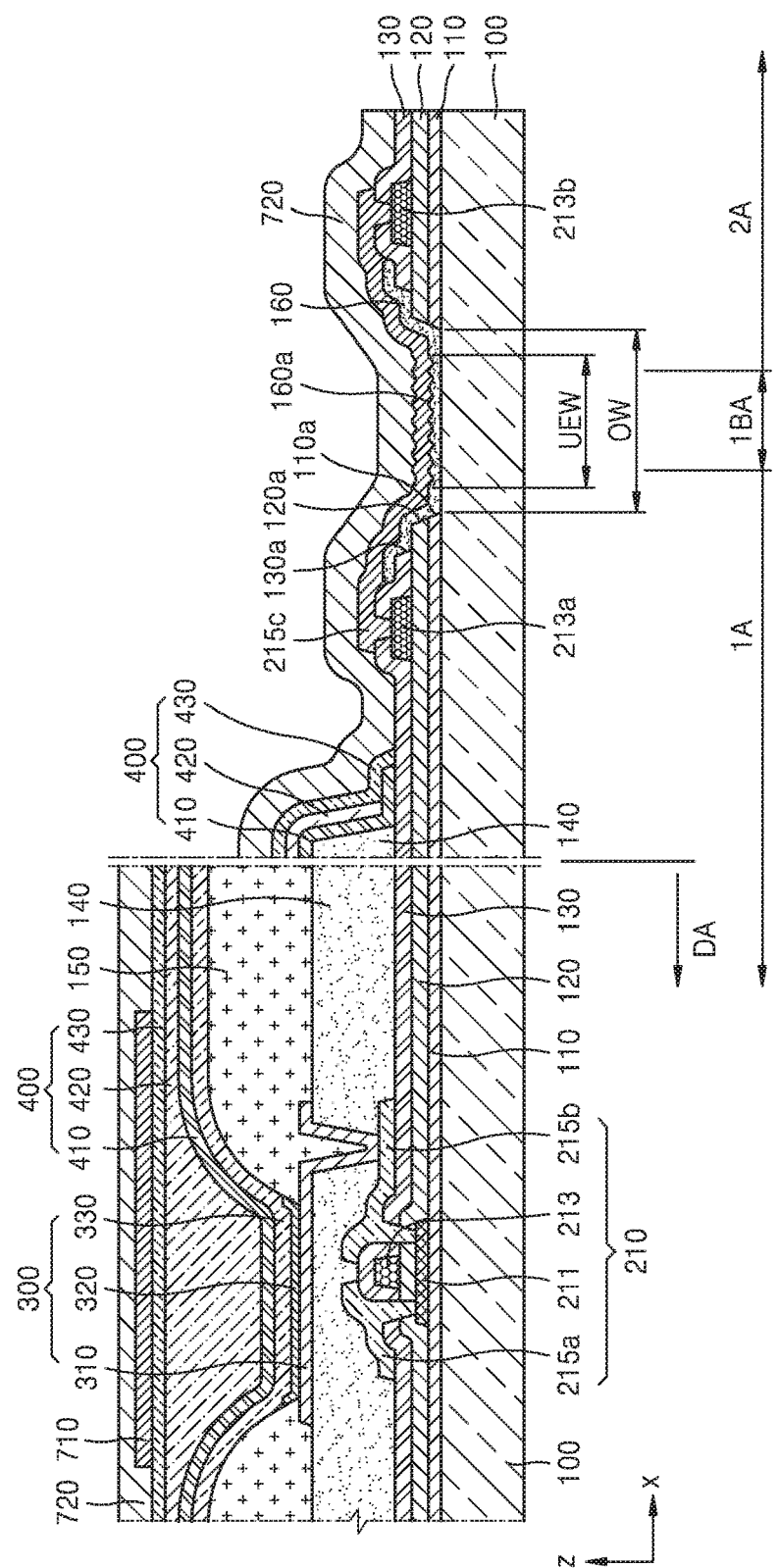
FIG. 24 is a schematic cross-sectional view partially showing a display device according to an embodiment.

For example, as shown in FIG. 24 that is a schematic cross-sectional view of a part of a display device according to an embodiment, a touch electrode 710 having various patterns may be located on the encapsulation layer 400 for implementing a touch sensing function. That is, the touch electrode 710 may be a part of touch sensing layer. When the touch electrode 710 is formed, the first conductive layer 215c may be simultaneously formed by using the same material as that of the touch electrode 710. Also, when a touch protective layer 720 for protecting the touch electrode 710 is formed, a protective layer covering the first conductive layer 215c may be simultaneously formed. If necessary, the touch protective layer 720 may integrally extend from the display area DA to at least the first bending area 1BA, as shown in FIG. 24. As described above, the structure of forming the first conductive layer 215c simultaneously with the touch electrode 710 may be applied to display devices described above or will be described later. Unlike the above example, the first conductive layer 215c may be formed simultaneously with the opposite electrode 330 by using the same material as that of the opposite electrode 330.

Figure 25:
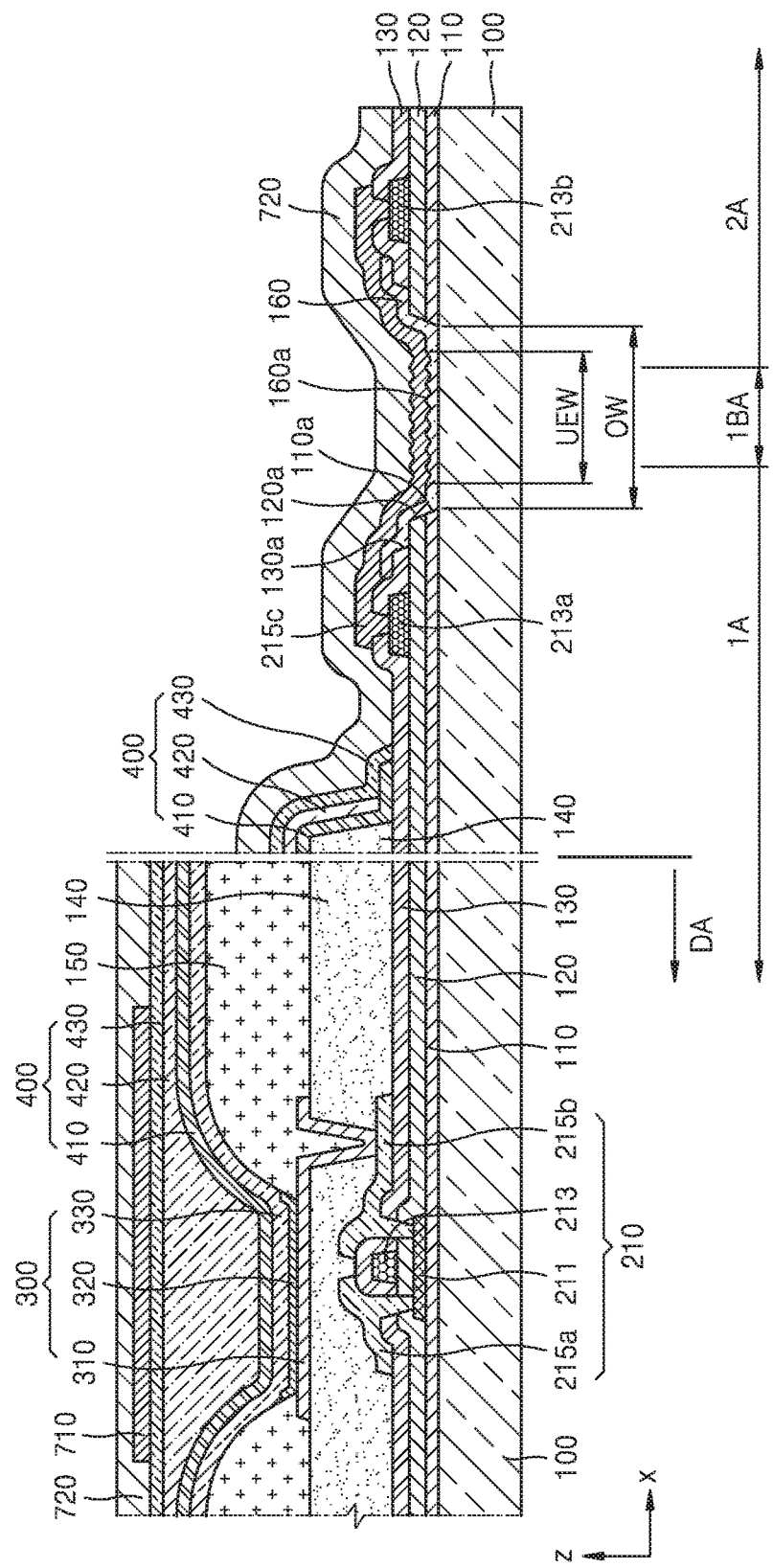
FIG. 25 is a schematic cross-sectional view partially showing a display device according to an embodiment.

In addition, the organic material layer 160 may be formed simultaneously with the planarization layer 140 by using the same material as that of the planarization layer 140. If necessary, the organic material layer 160 may be formed in a separate process, without regard to the planarization layer 140. Otherwise, as shown in FIG. 25 that is a schematic cross-sectional view of a part of a display device according to an embodiment, the organic material layer 160 may be formed simultaneously with the organic encapsulation layer 420 in the encapsulation layer 400 by using the same material as that of the organic encapsulation layer 420.

Figure 26:
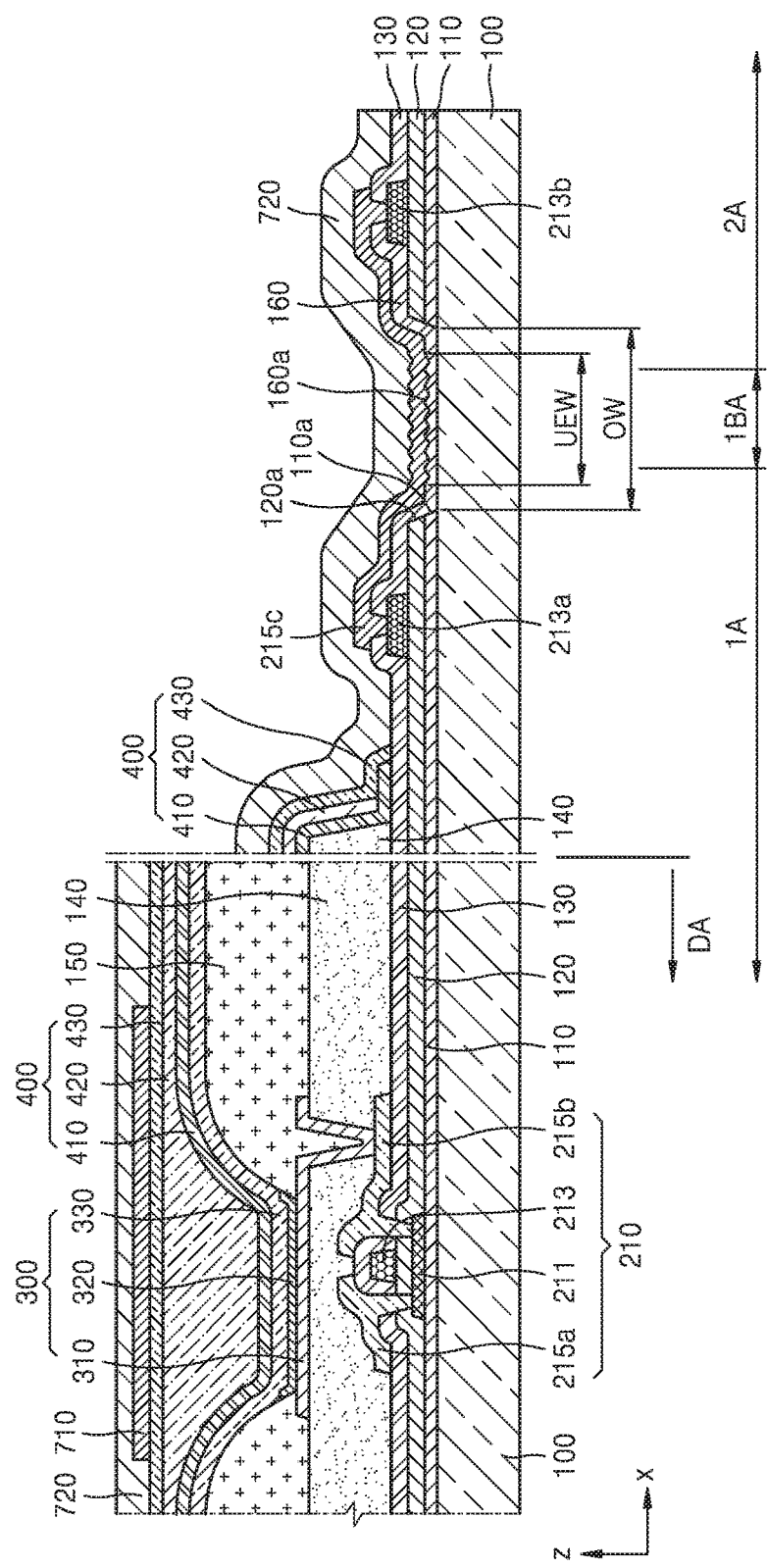
FIG. 26 is a schematic cross-sectional view partially showing a display device according to an embodiment.

The organic material layer 160 may be formed simultaneously with other layers than the planarization layer 140 by using the same material. For example, as shown in FIG. 26 that is a schematic cross-sectional view of a part of a display device according to an embodiment, when the interlayer insulating layer 130 includes an organic insulating material, the organic material layer 160 may be formed simultaneously with the interlayer insulating layer 130 by using the same material as the interlayer insulating layer 130. Since FIG. 26 is a cross-sectional view, the interlayer insulating layer 130 and the organic material layer 160 are shown as separate layers from each. other due to the contact hole through which the first conductive layer 215c is connected to the second conductive layers 213a and 213b However, the interlayer insulating layer 130 and the organic material layer 160 may be integrally formed with each other, except the area where the contact hole is formed.

As described above, the structure in which the organic material layer 160 is formed simultaneously with the interlayer insulating layer 130 when the interlayer insulating layer 130 is formed of the organic material, may be applied to other display devices that are described above or will be described later. Here, the first conductive layer 215c may he formed simultaneously with the touch electrode 710 by using the same material as that of the touch electrode 710, as shown in FIG. 26. In this case, as shown in FIG. 26, the touch protective layer 720 may cover the first conductive layer 215c. Otherwise, an organic insulating layer in addition to the touch protective layer 720 may be necessary for implementing the touch sensing function. For example, an additional touch electrode, besides the touch electrode 710, may be formed, and an organic insulating layer may be interposed between the touch electrode 710 and the additional touch electrode. In this case, the organic insulating layer may extend to cover the first conductive layer 215c, or a layer that is formed simultaneously with the organic insulating layer by using the same material as the organic insulating layer may cover the first conductive layer 215c.

The first conductive layer 215c may be modified variously, for example, the first conductive layer 215c may be simultaneously formed with the source electrode 215a or the drain electrode 215b, not with the touch electrode 710. In addition, in this case, the first conductive layer 215c may be covered by the planarization layer 140 or another insulating layer.

Figure 27:
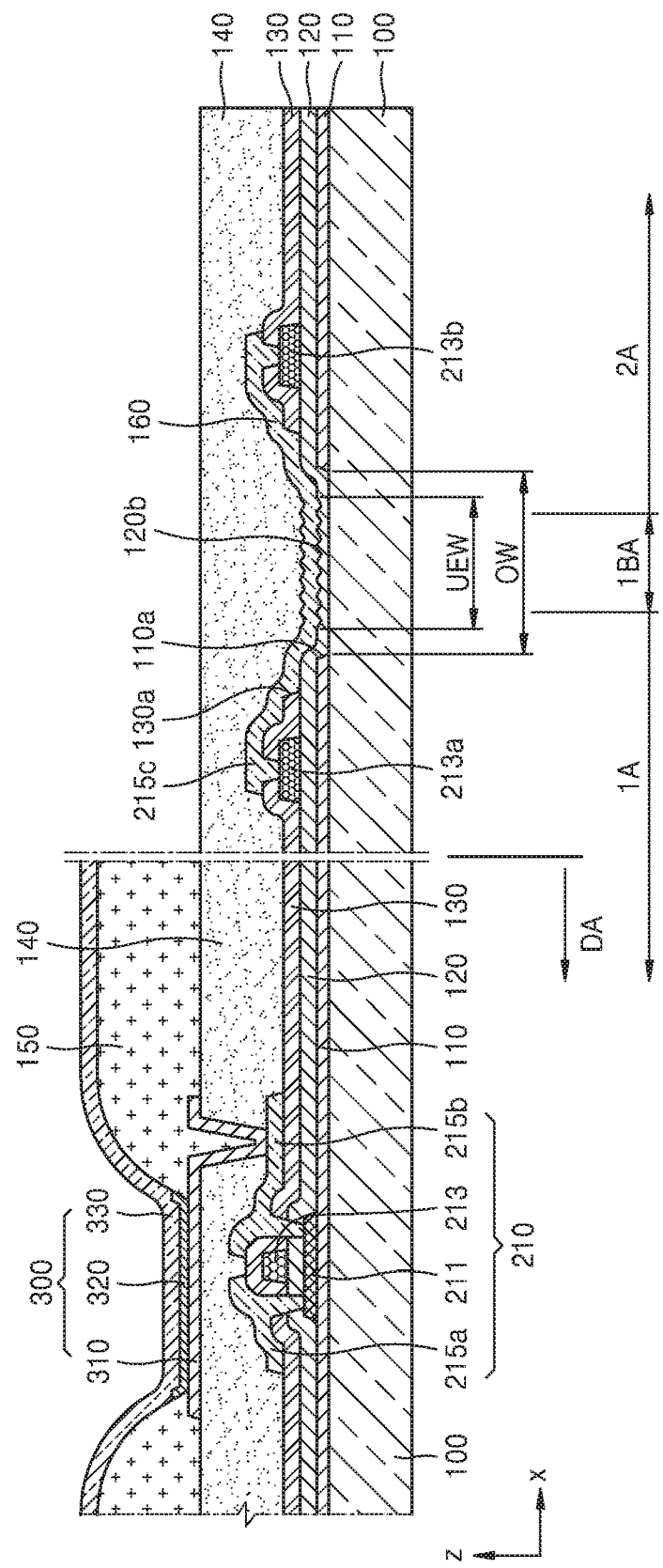
FIG. 27 is a schematic cross-sectional view partially showing a display device according to an embodiment.

So far, the case in which the first inorganic insulating layer includes the gate insulating layer 120 that is interposed between the semiconductor layer 211 and the gate electrode 213 is described, but one or more embodiments are not limited thereto. For example, as shown in FIG. 27 that is a schematic cross-sectional view of a part of a display device according to an embodiment, the first inorganic insulating layer may only include the buffer layer 110 that is arranged between the TFT 210 and the substrate 100. In this case, the buffer layer 110 includes the opening 110a that may be referred to as the first opening. In addition, the gate insulating layer 120 may function as the organic material layer 160 that is described in the previous embodiments. That is, the gate insulating layer 120 may include an insulating organic material.

In this case, the gate insulating layer 120 may have an uneven surface 120b in at least a part of an upper surface thereof within the first opening as shown in FIG. 27. A shape of the uneven surface 120b of the gate insulating layer 120, and pitches or heights of a plurality of protrusions included in the uneven surface 120b may adopt the description about the shape of the uneven surface 160a of the organic material layer 160, and the pitches and heights of the protrusions in the uneven surface 160a with reference to FIGS. 6 to 10. Moreover, similarly to the organic material layer 160 including the islands 160b that are spaced apart from one another as shown in FIG. 20, the gate insulating layer 120 may include a plurality of islands that are spaced apart from one another, unlike the example illustrated in FIG. 27. In this case, the description about the pitches or heights of the islands 160b described above with reference to FIGS. 21 and 22 may be applied to the islands of the gate insulating layer 120.

As described above, when the gate insulating layer 120 functions as the organic material layer, the first conductive layer 215c may be formed simultaneously with the source electrode 215a or the drain electrode 215b by using the same material as that of the source electrode 215a or the drain electrode 215b, as shown in FIG. 27. As illustrated with reference to FIGS. 24 to 26, if the touch electrode 710 of various patterns is located on the encapsulation layer 400 that covers the OLED 300 for implementing the touch sensing function, the first conductive layer 215c may be simultaneously formed with the touch electrode 710 by using the same material as the touch electrode 710.

Figure 28:
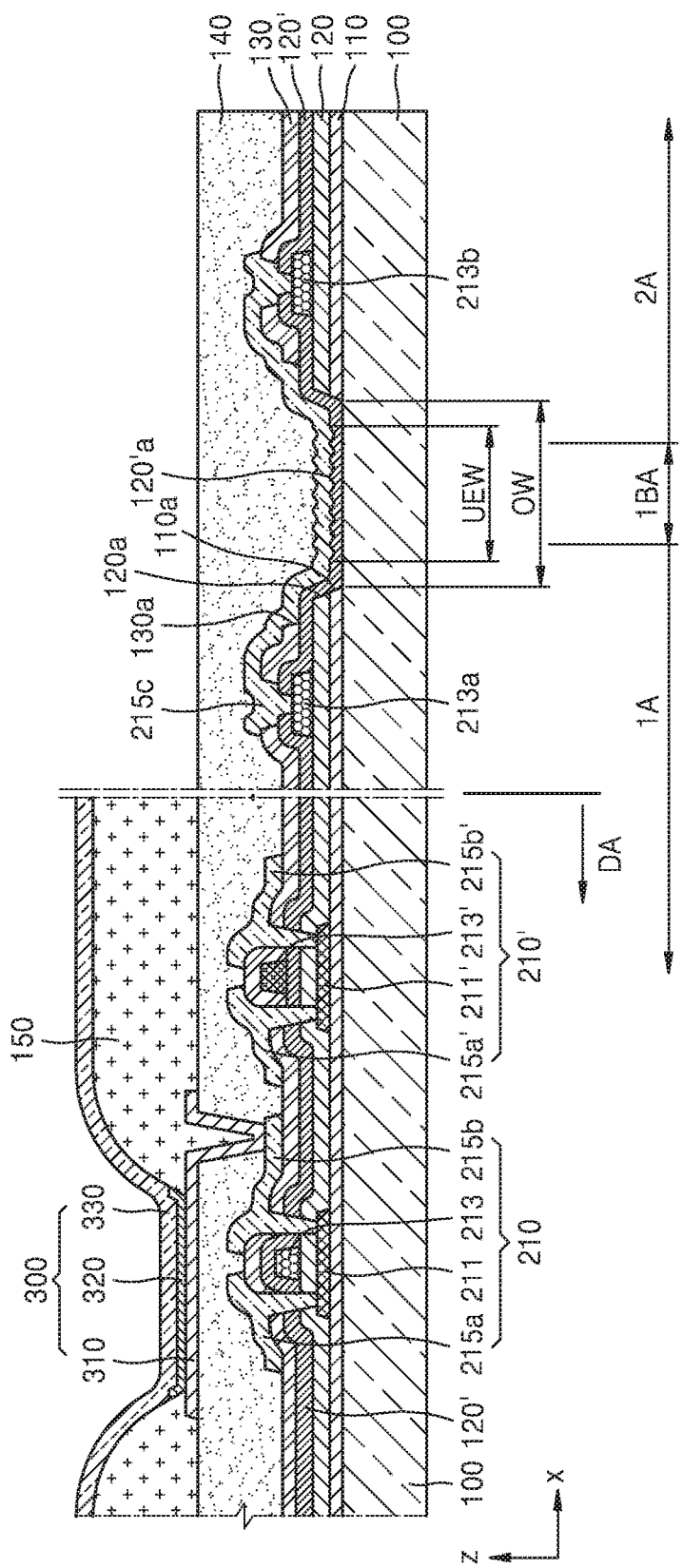
FIG. 28 is a schematic cross-sectional view partially showing a display device according to an embodiment.

FIG. 28 is a schematic cross-sectional view of a part of a display device according to an embodiment. The display device may include a TFT 210' on the display area DA, in addition to the TFT 210. The TFT 210' may include a semiconductor layer 211', a source electrode 215a', a drain electrode 215b', and a gate electrode 213'. Here, the semiconductor layer 211' may include the same material as the semiconductor layer 211, and may be located at the same layer level as the semiconductor layer 211. The source electrode 215a' and the drain electrode 215b' may include the same material as that of the source electrode 215a and the drain electrode 215b as well, and may be located at the same layer level as that of the source electrode 215a and the drain electrode 215b. However, the gate electrode 213' may be located at a different layer level from that of the gate electrode 213.

For example, a gate insulating layer 120' is located on the gate insulating layer 120, and the source electrode 215a, the drain electrode 215b, the source electrode 215a', and the drain electrode 215b' may be located on the interlayer insulating layer 130 that covers the gate insulating layer 120'. In addition, the gate electrode 213 is located on the gate insulating layer 120, the gate insulating layer 120' covers the gate electrode 213, and the gate electrode 213 ' may be located on the gate insulating layer 120'. Here, the buffer layer 110 and the gate insulating layer 120 respectively include the opening 110a and the opening 120a, and the gate insulating layer 120' may function as the organic material layer 160 described above with reference to the previous embodiments. That is, the gate insulating layer 120' may include an insulating organic material.

In this case, the gate insulating layer 120' may have an uneven surface 120'a at least partially in an upper surface thereof within the first opening, as shown in FIG. 28. A shape of the uneven surface 120'a of the gate insulating layer 120', and pitches or heights of a plurality of protrusions in the uneven surface 120'a may adopt the description about the shape of the uneven surface 160a of the organic material layer 160, and the pitches or heights of the protrusions of the uneven surface 160a described above with reference to FIGS. 6 to 10. In addition, similarly to the islands 160b that are spaced apart from one another in the organic material layer 160 as shown in FIG. 20, the gate insulating layer 120' may include a plurality of islands that are spaced apart from one another, unlike the example shown in FIG. 28. In this case, the above descriptions about the pitches or heights of the islands 160b with reference to FIGS. 21 and 22 may be applied to the islands of the gate insulating layer 120'.

In the above structure, the first conductive layer 215c may be formed simultaneously when the source electrode 215a or the drain electrode 215b is formed as shown in FIG. 28. However, one or more embodiments are not limited thereto, and the first conductive layer 215c may be formed simultaneously when the gate electrode 213' is formed by using the same material as the gate electrode 213'. Moreover, as described above with reference to FIGS. 24 to 26, when the touch electrode 710 of the various pattern for implementing the touch sensing function is located on the encapsulation layer 400 that covers the OLED 300, the first conductive layer 215c may be formed simultaneously with the touch electrode 710 by using the same material as the touch electrode 710.

In the embodiment illustrated in FIG. 28, the interlayer insulating layer 130 is located on the gate insulating layer 120' that functions as the organic material layer, and thus, the interlayer insulating layer 130 includes an opening 130a corresponding to the first opening of the first inorganic insulating layer including the buffer layer 110 and the gate insulating layer 120. Such above interlayer insulating layer may be defined as a second inorganic insulating layer and the opening 130a may be defined as a second opening of the second inorganic insulating layer.

Figure 29:
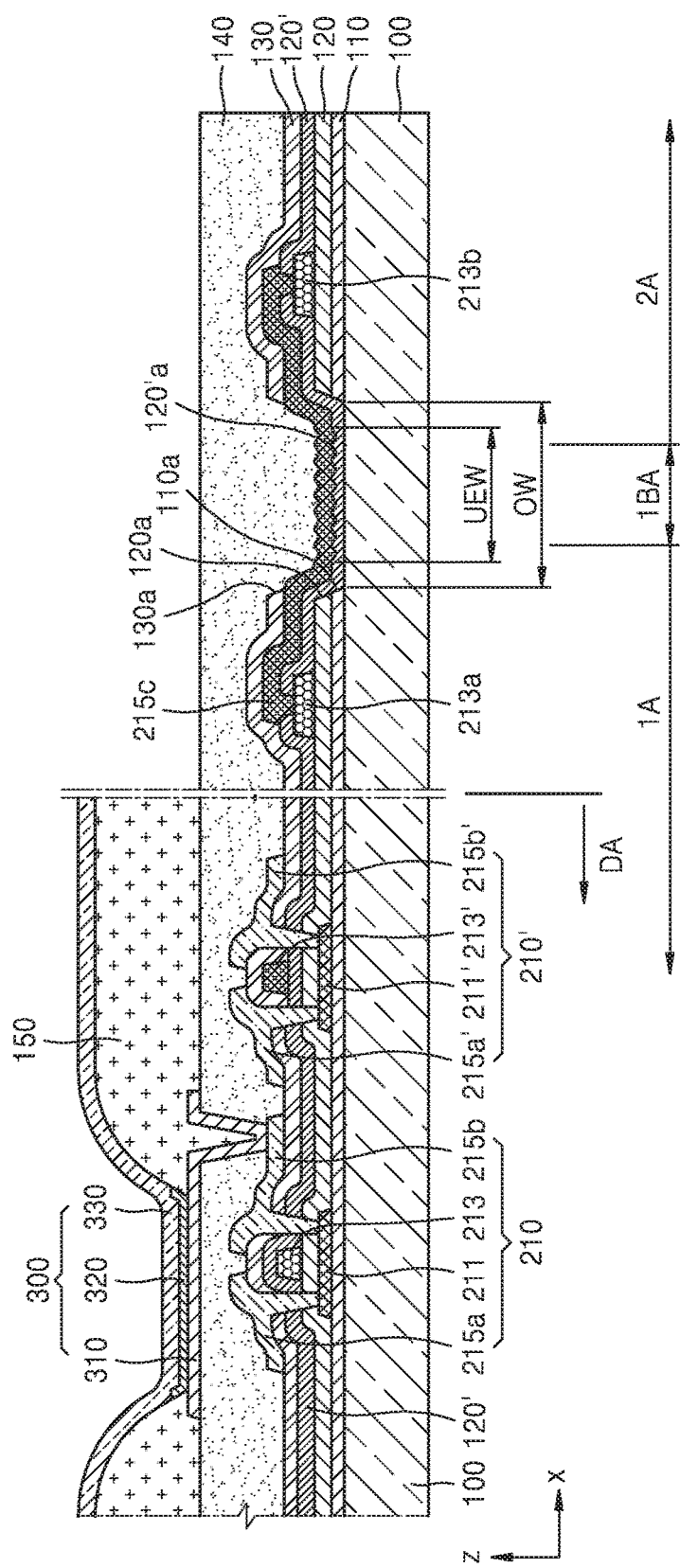
FIG. 29 is a schematic cross-sectional view partially showing a display device according to an embodiment.

FIG. 29 is a schematic cross-sectional view of a part of a display device according to an embodiment. The display device is different from the display device illustrated in FIG. 28 in that the first conductive layer 215c is formed simultaneously with the gate electrode 213' by using the same material as the gate electrode 213', not with the source electrode 215a or the drain electrode 215b.

Since the gate electrode 213' is located on the gate insulating layer 120' that covers the gate electrode 213, the first conductive layer 215c that is formed simultaneously with the gate electrode 213' by using the same material as the gate electrode 213' is located on the second conductive layers 213a and 213b that are formed simultaneously with the gate electrode 213 by using the same material as the gate electrode 213 and the uneven surface 120'a of the gate insulating layer 120'; including an organic material. Here, the interlayer insulating layer 130 may cover a part of the first conducive layer 215c, if necessary. The interlayer insulating layer 130 includes opening 130a corresponding to the openings 110a and 120a of the buffer layer 110 and the gate insulating layer 120 so that the bending may be performed easily on the first bending area 1BA.

As described above, the location, the material, and the method of forming the first conductive layer 215c may be modified variously.

Figure 30:
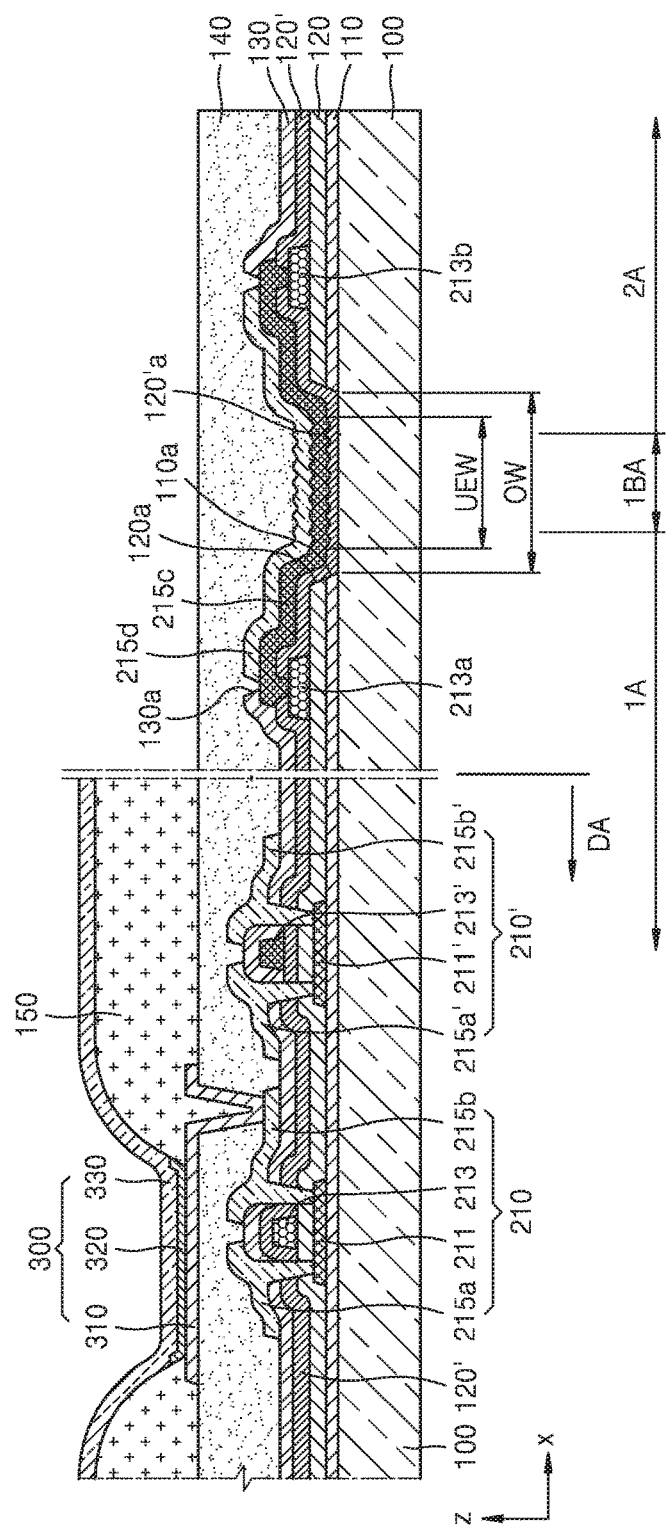
FIG. 30 is a schematic cross-sectional view partially showing a display device according to an embodiment.

FIG. 30 is a schematic cross-sectional view of a part of a display device according to an embodiment. The display device of the embodiment is different from the display device described above with reference to FIG. 29 in view of further including an additional conductive layer 215d on the first conductive layer 215c. As described above, when the first conductive layer 215c is formed simultaneously with the gate electrode 213' by using the same material as that of the gate electrode 213', the additional conductive layer 215d may be simultaneously formed with the source electrode 215a or the drain electrode 215b by using the same material as the source electrode 215a or the drain electrode 215b. The additional conductive layer 215d may be located on the first conductive layer 215c in the first bending area 1BA, so as to be electrically connected to the first conductive layer 215c.

In the display device, since the first conductive layer 215c and the additional conductive layer 215d exist on the first bending area 1BA, multi-layered conductive layer structure is formed on the first bending area 1BA. Therefore, even when a defect such as a crack occurs in the first conductive layer 215c on the first bending area 1BA, electric signals may be transferred to the display area DA via the additional conductive layer 215d . Also, even if a defect such as a crack occurs in the additional conductive layer 215d , the electric signal may be transferred to the display area DA via the first conductive layer 215c.

According to the above description, the organic material layer 160 is described to be simultaneously formed with the gate insulating layer 120, the gate insulating layer 120', the interlayer insulating layer 130, and/or the planarization layer 140. However, one or more embodiments are not limited thereto. For example, the organic material layer 160 may be formed by a separate process, from the processes of forming the gate insulating layer 120, the gate insulating layer 120', the interlayer insulating layer 130, and/or the planarization layer 140. Also, even when the gate insulating layer 120, the gate insulating layer 120', the interlayer insulating layer 130, and/or the planarization layer 140 include the organic material, the organic material layer 160 may include a different material from those of the gate insulating layer 120, the gate insulating layer 120', the interlayer insulating layer 130, and/or the planarization layer 140.

Figure 31:
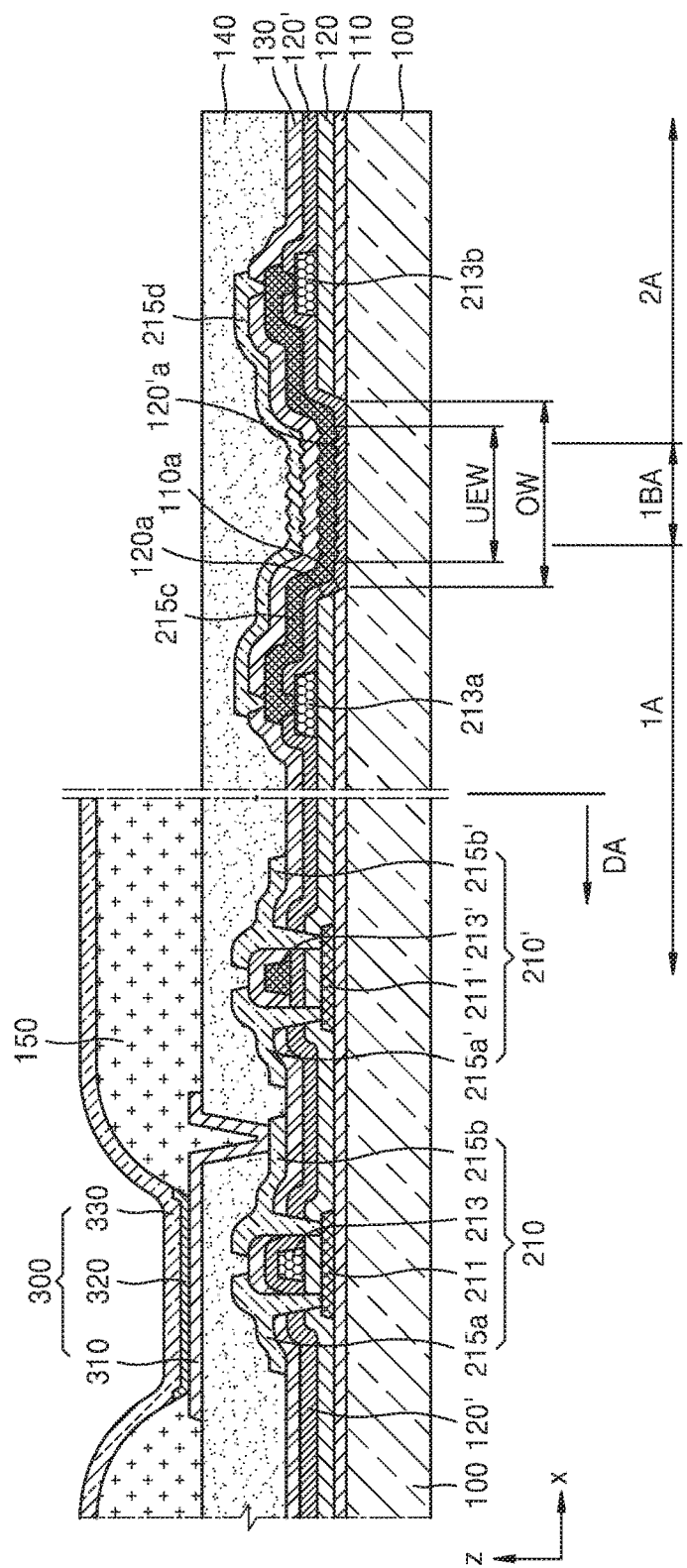
FIG. 31 is a schematic cross-sectional view partially showing a display device according to an embodiment.

FIG. 31 is a schematic cross-sectional view of a part of a display device according to an embodiment. The display device according to the embodiment is different from the display device described above with reference to FIG. 30 in that the interlayer insulating layer 130 is arranged between the first conductive layer 215c and the additional conductive layer 215d. Here, since the interlayer insulating layer 130 includes the insulating organic material, damages on the interlayer insulating layer 130, the first conductive layer 215c, and/or the additional conductive layer 215d due to the bending process may be prevented even when the interlayer insulating layer 130 exists in the first bending area 1BA.

In addition, the additional conductive layer 215d on the interlayer insulating layer 130 is electrically connected to the first conductive layer 215c under the interlayer insulating layer 130 via the contact hole in the interlayer insulating layer 130, wherein the contact hole is formed on an outer portion of the first bending area 1BA. As such, even if the defect such as crack occurs in the first conductive layer 215c on the first bending area 1BA, the electric signal may be transferred to the display area DA via the additional conductive layer 215d. Also, even if the defect such as crack occurs in the additional conductive layer 215d, the electric signal may be transferred to the display area DA via the first conductive layer 215c. In addition, since the interlayer insulating layer 130 is arranged between the first conductive layer 215c and the additional conductive layer 215d, growth of the crack occurring in one of the first conductive layer 215c and the additional conductive layer 215d to the other layer may be effectively prevented.

In the structure illustrated with reference to FIGS. 30 and 31, a width of the first conductive layer 215c and a width of the additional conductive layer 215d in the first direction (+y direction) may be different from each other. For example, the first conductive layer 215c and the additional conductive layer 215d may include different materials from each other, and accordingly, a flexibility (elongation rate) of the material forming the first conductive layer 215c and a flexibility (elongation rate) of the material forming the additional conductive layer 215d may be different from each other. A greater flexibility (elongation rate) may denote less probability of generating disconnection even when the tensile stress is applied. Therefore, between the first conductive layer 215c and the additional conductive layer 215d, one including a material having a relatively greater flexibility (elongation rate) than the other may have a smaller width than the other.

Figure 32:
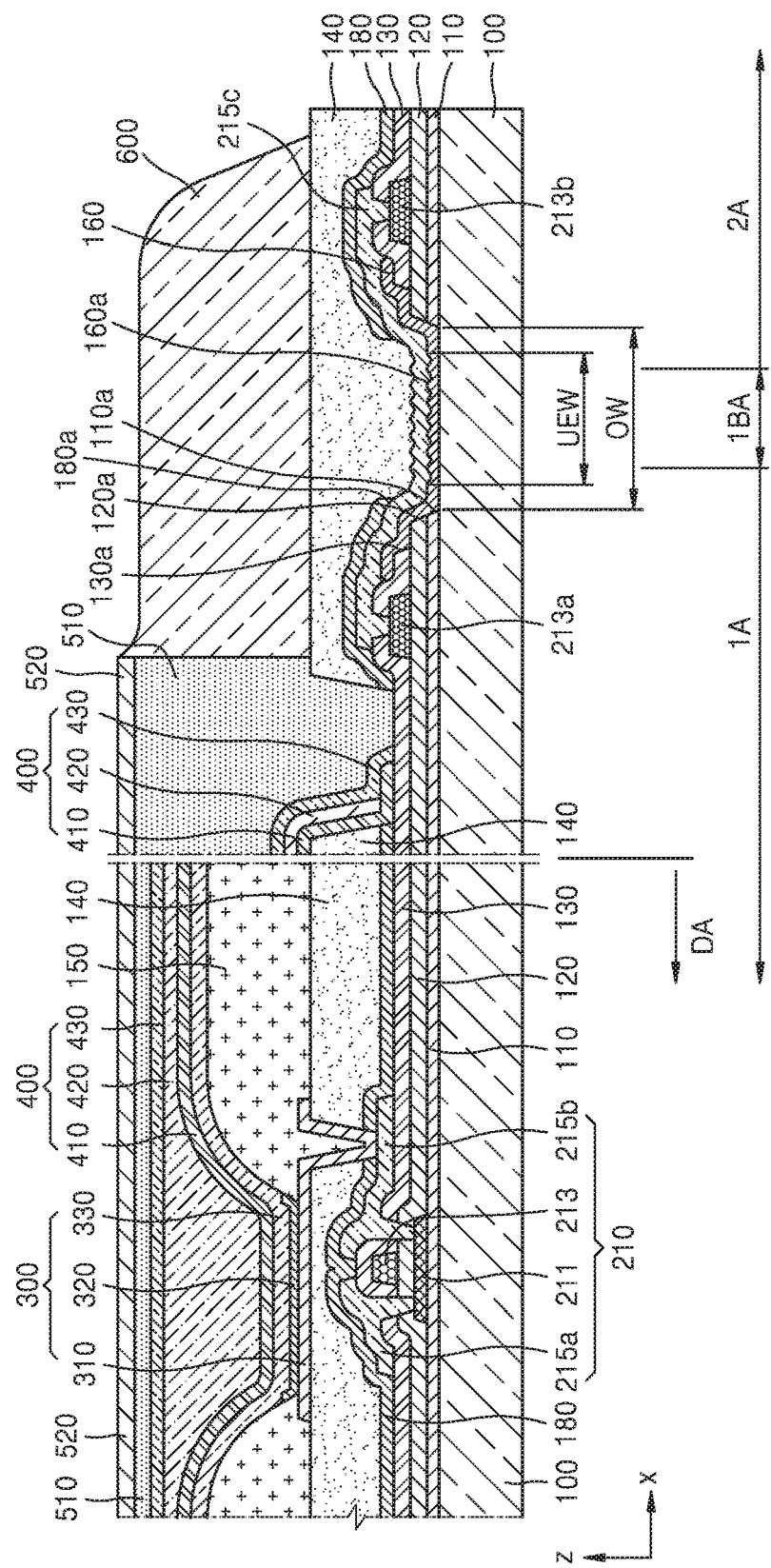
FIG. 32 is a schematic cross-sectional view partially showing a display device according to an embodiment.

FIG. 32 is a schematic cross-sectional view of a part of a display device according to an embodiment. The display device according to the embodiment is different from the display device described above with reference to FIG. 2 in view of further including a protective layer 180 covering the TFT 210. The protective layer 180 may cover a lower layer under the protective layer 180, e.g., the interlayer insulating layer 130, on a portion where the TFT 210 does not exist. The protective layer 180 may include an inorganic material such as silicon nitride, silicon oxide, and/or silicon oxynitride, and may have a single-layered structure or a multi-layered structure, As described above, since the buffer layer 110, the gate insulating layer 120, and the interlayer insulating layer 130 including the inorganic material may he referred to as the inorganic insulating layer, the protective layer 180 including the inorganic material may he referred to as an additional inorganic insulating layer, As described above, the protective layer 180, e.g., the additional inorganic insulating layer, may cover most of the first area 1A and the second 2A on the substrate 100 and include an additional opening 180a corresponding to the first bending area 1BA. Here, that the additional opening 180a corresponds to the first bending area 1BA may denote that the additional opening 180a overlaps with the first bending area 1BA. Here, an area of the additional opening 180a may be greater than that of the first bending area 1BA. To do this, in FIG. 32, a width of the additional opening 180a is shown to be greater than that of the first bending area 1BA.

As described above, the display device shown in FIG. 32 is not in a bent state, but the display device is actually bent, that is, the substrate 100 is bent at the first bending area 1BA as shown in FIG. 1. To do this, the display device is manufactured so that the substrate 100 is flat as shown in FIG. 32, and after that, the substrate 100 is bent at the first bending area 1BA so that the display device has the shape shown in FIG. 1.

If the protective layer 180 does not include the additional opening 180a and is located on the first conductive layer 215c in the first bending area 1BA, the tensile stress may be applied to the protective layer 180 in the first bending area 1BA during bending the substrate 100 at the first bending area 1BA, and then, a crack may occur in the protective layer 180. When the crack occurs in the protective layer 180, the crack may extend to the first conductive layer 215c covered by the protective layer 180, and accordingly, a possibility of generating defects such as disconnection in the first conductive layer 215c may be greatly increased.

However, according to the display device of the embodiment, the protective layer 180, that is, the additional inorganic insulating layer, includes the additional opening 180a corresponding to the first bending area 1BA. Therefore, damages on the first conductive layer 215c may be prevented or reduced.

Figure 33:
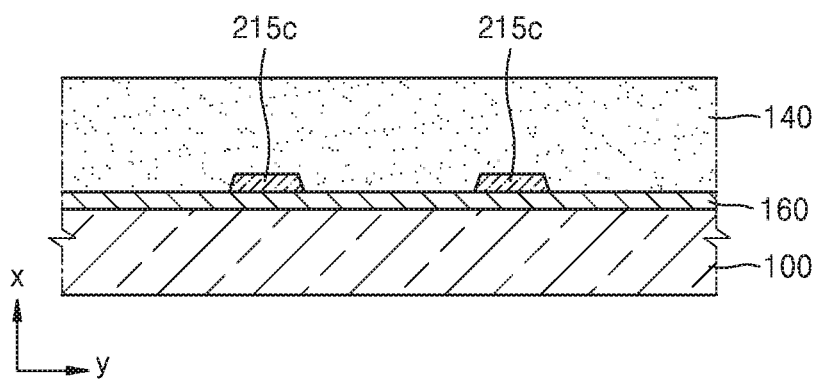
FIG. 33 is a schematic cross-sectional view of the display device of FIG. 32 taken along a first bending axis in a first bending region.

FIG. 33 is a schematic cross-sectional of the display device of FIG. 32 taken along the first bending axis 1BAX in the first bending area 1BA. Based on FIG. 1, FIG. 33 may be understood to show a part of the cross-section of the display device on the first bending area 1BA, taken along a plane that is in parallel with an xy plane and includes the first bending axis 1BAX. As shown in FIG. 33, the protective layer 180 may not exist within the first bending area 1BA. In FIG. 33, there are a plurality of first conductive layers 215c, and thus, the display device may include a plurality of first conductive layers 215c that are wires extending in a direction. As described above, the protective layer 180 may not exist in the first bending area 1BA, but is not limited thereto.

Figure 34:
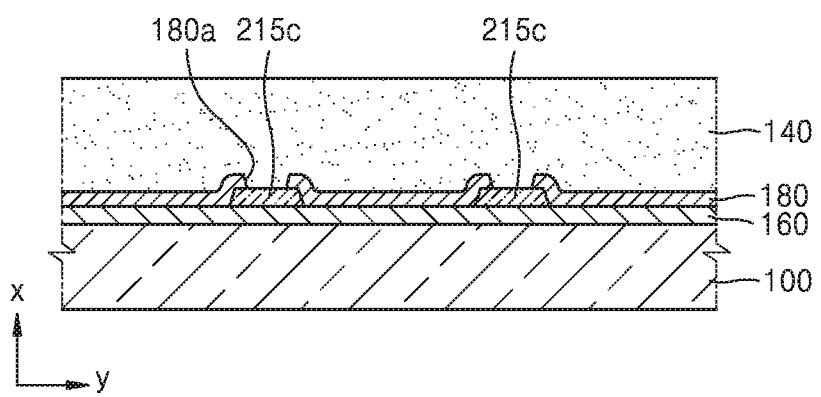
FIG. 34 is a schematic cross-sectional view partially showing a display device according to an embodiment.

For example, as shown in FIG. 34 that is a schematic cross-sectional view of a part of a display device according to an embodiment, the protective layer 180 may be formed in the first bending area 1BA. That is, that the protective layer 180, e.g., the additional inorganic insulating layer, has the additional opening 180a corresponding to the first bending area 1BA denote that the additional opening 180a corresponds to the first bending area 1BA, and it is not limited to that the protective layer 180 should not exist on the first bending area 1BA.

Here, the additional opening 180*a* may correspond to the first conductive layer 215*c* within the first bending area 1BA, as shown in FIG. 34. For example, the additional opening 180*a* may overlap with the first conductive layer 215*c* in the first bending area 1BA. In FIG. 34, the additional opening 180*a* overlaps with most of the upper surface of the first conductive layer 215*c*, so that the protective layer 180 may cover an edge of the first conductive layer 215*c*.

In the display device according to the embodiment, most of the upper surface of the first conductive layer 215*c* may not be covered by the protective layer 180. Therefore, even when the tensile stress is applied to the protective layer 180 in the first bending area 1BA during the substrate 100 is being bent at the first bending area 1BA and the crack may occur in the protective layer 180, a possibility that the crack extends to the first conductive layer 215*c* and causes damage on the first conductive layer 215*c* may be reduced. In the first bending area 1BA, the organic material layer 160 is located under the protective layer 180, and the planarization layer 140 including the organic material is located on the protective layer 180. Therefore, even if the crack occurs in the protective layer 180 in the first bending area 1BA, extending of the crack toward the upper and/or lower portion of the protective layer 180 may be prevented.

Figure 35:
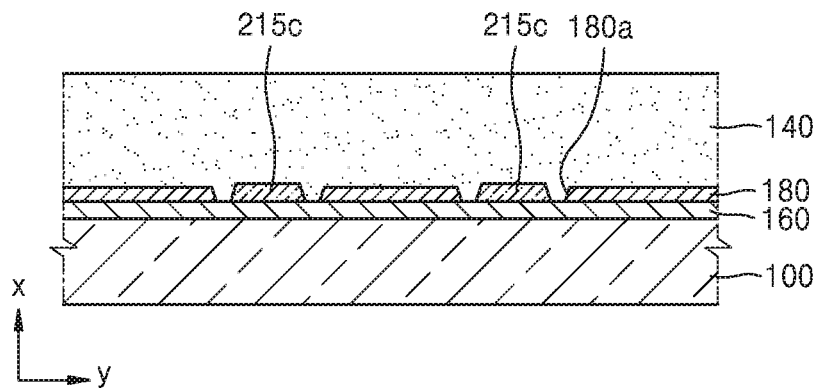
FIG. 35 is a schematic cross-sectional view partially showing a display device according to an embodiment.

One or more embodiments are not limited to the above example, that is, as shown in FIG. 35 that is a schematic cross-sectional view of a part of a display device according to an embodiment, an area of the additional opening 180*a* may be greater than an area of the upper surface of the first conductive layer 215*c* within the first bending area 1BA, so that the first conductive layer 215*c* may not be covered by the protective layer 180 within the first bending area 1BA. In this case, as shown in FIG. 35, the protective layer 180 may cover the upper surface of the organic material layer 160 at least partially on an outer portion of the first conductive layer 215*c*, within the first bending area 1BA.

Figure 36:
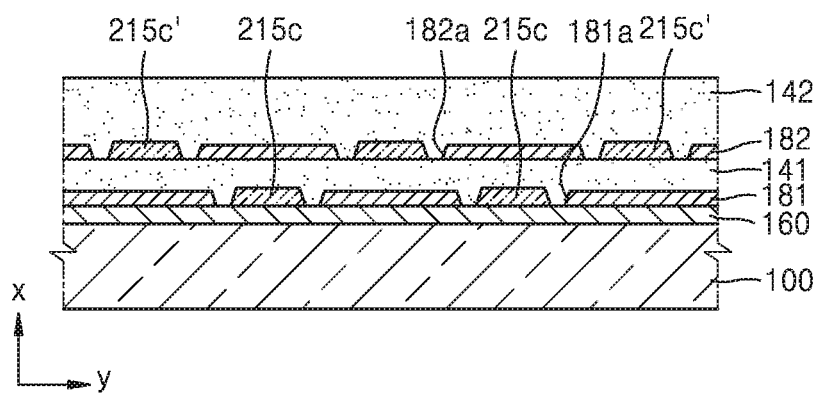
FIG. 36 is a schematic cross-sectional view partially showing a display device according to an embodiment.

As shown in FIG. 36 that is a schematic cross-sectional view of a part of a display device according to an embodiment, an upper conductive layer 215*c*' that is located at different layer level from the first conductive layer 215*c* may exist in the first bending area 1BA. The upper conductive layer 215*c*' may be a wire extending in a direction that is the same as or similar to that of the first conductive layer 215*c*. In addition, a protective layer may have a dual-layered structure including a first protective layer 181 including an inorganic material and a second protective layer 182 including an inorganic material. The first protective layer 181 and the second protective layer 182 include the same material as that of the protective layer 180. In FIG. 36, the first conductive layer 215*c* and the first protective layer 181 are covered by a first planarization layer 141, and the upper conductive layer 215*c*' and the second protective layer 182 are located on the first planarization layer 141. In addition, the upper conductive layer 215*c*' and the second protective layer 182 are covered by a second planarization layer 142.

Figure 37:
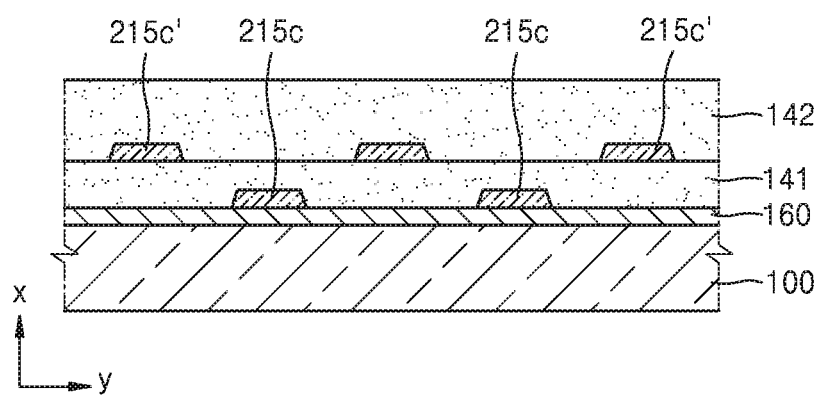
FIG. 37 is a schematic cross-sectional view partially showing a display device according to an embodiment.

In the display device according to the embodiment, the first protective layer 181 does not cover the first conductive layer 215*c* and the second protective layer 182 does not cover the upper conductive layer 215*c*' in the first bending area 1BA, and thus, damage to the first conductive layer 215*c* and/or the upper conductive layer 215*c*' due to the bending may be prevented or reduced. However, similarly to the above description with reference to FIG. 34, the first protective layer 181 may cover an edge of the first conductive layer 215*c* and the second protective layer 182 may cover an edge of the upper conductive layer 215*c*'. In addition, as shown in FIG. 37 that is a schematic cross-sectional view of a part of a display device according to an embodiment, the first protective layer 181 and the second protective layer 182 may not exist within the first bending area 1BA.

Figure 38:
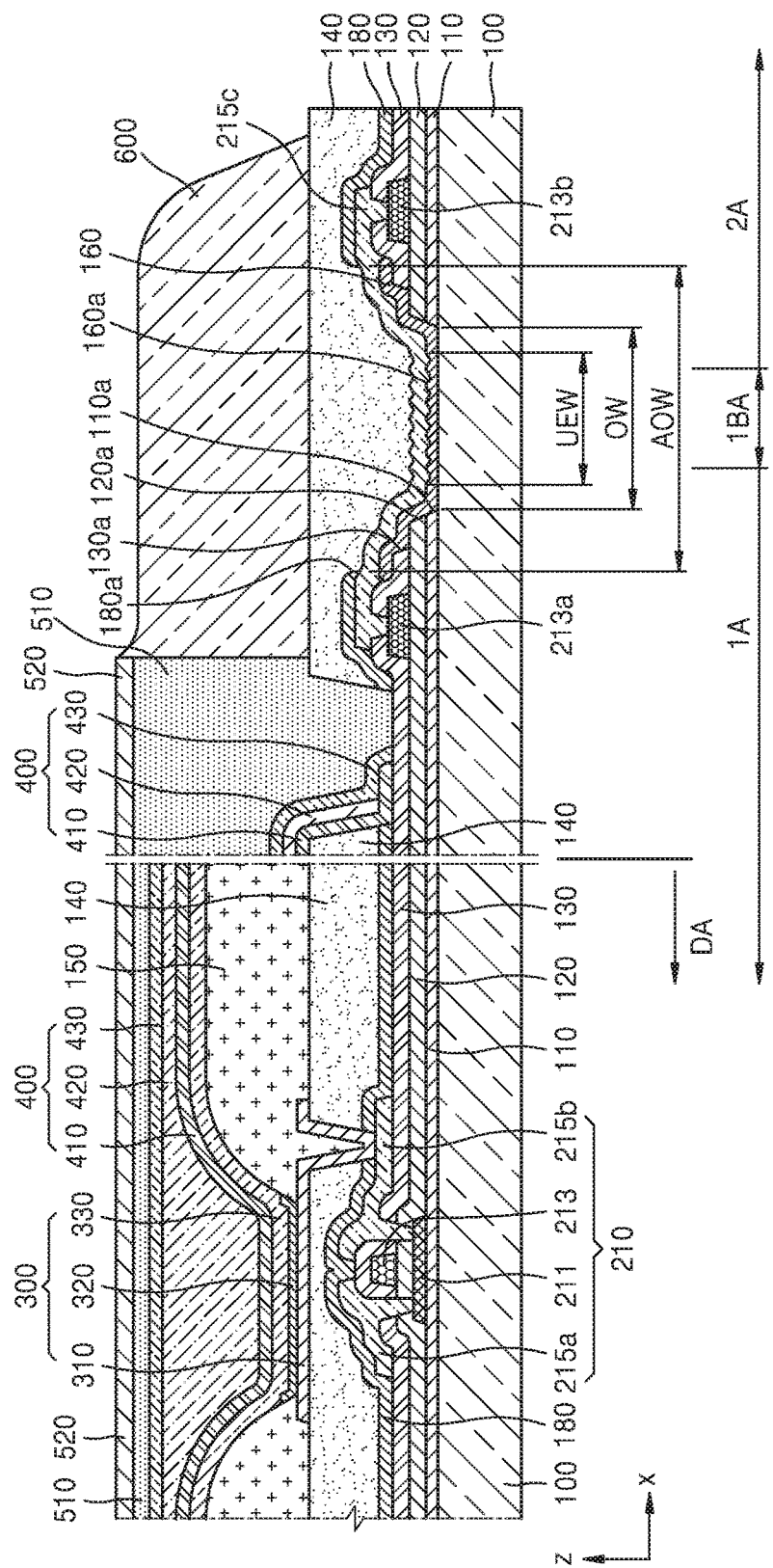
FIG. 38 is a schematic cross-sectional view partially showing a display device according to an embodiment.

In addition, as shown in FIG. 38 that is a schematic cross-sectional view of a part of a display device according to an embodiment, the additional opening 180*a* of the protective layer 180 that is the additional inorganic insulating layer does not only correspond to the first bending area 1BA, but may also have an area that is greater than that of the first opening in the inorganic insulating layer. In FIG. 38, a width AOW of the additional opening 180*a* is greater than the width OW of the first opening. As described above, although the display device of FIG. 38 is described not to be bent, the display device according to the embodiment is actually bent, that is, the substrate 100 is bent at the first bending area 1BA. When the substrate 100 is bent at the first bending area 1BA, a relatively larger tensile stress may be applied to the inorganic insulating layer located at a higher level than to the inorganic insulating layer located at a lower level. Therefore, when the area of the additional opening 180*a* of the protective layer 180 is sufficiently greater than that of the first opening in the inorganic insulating layer, damage to the protective layer 180 located above the inorganic insulating layer may be prevented or reduced. However, one or more embodiments are not limited thereto, that is, the area of the additional opening 180*a* of the protective layer 180 may be smaller than that of the first opening in the inorganic insulating layer as shown in FIG. 32, if necessary.

Figure 39:
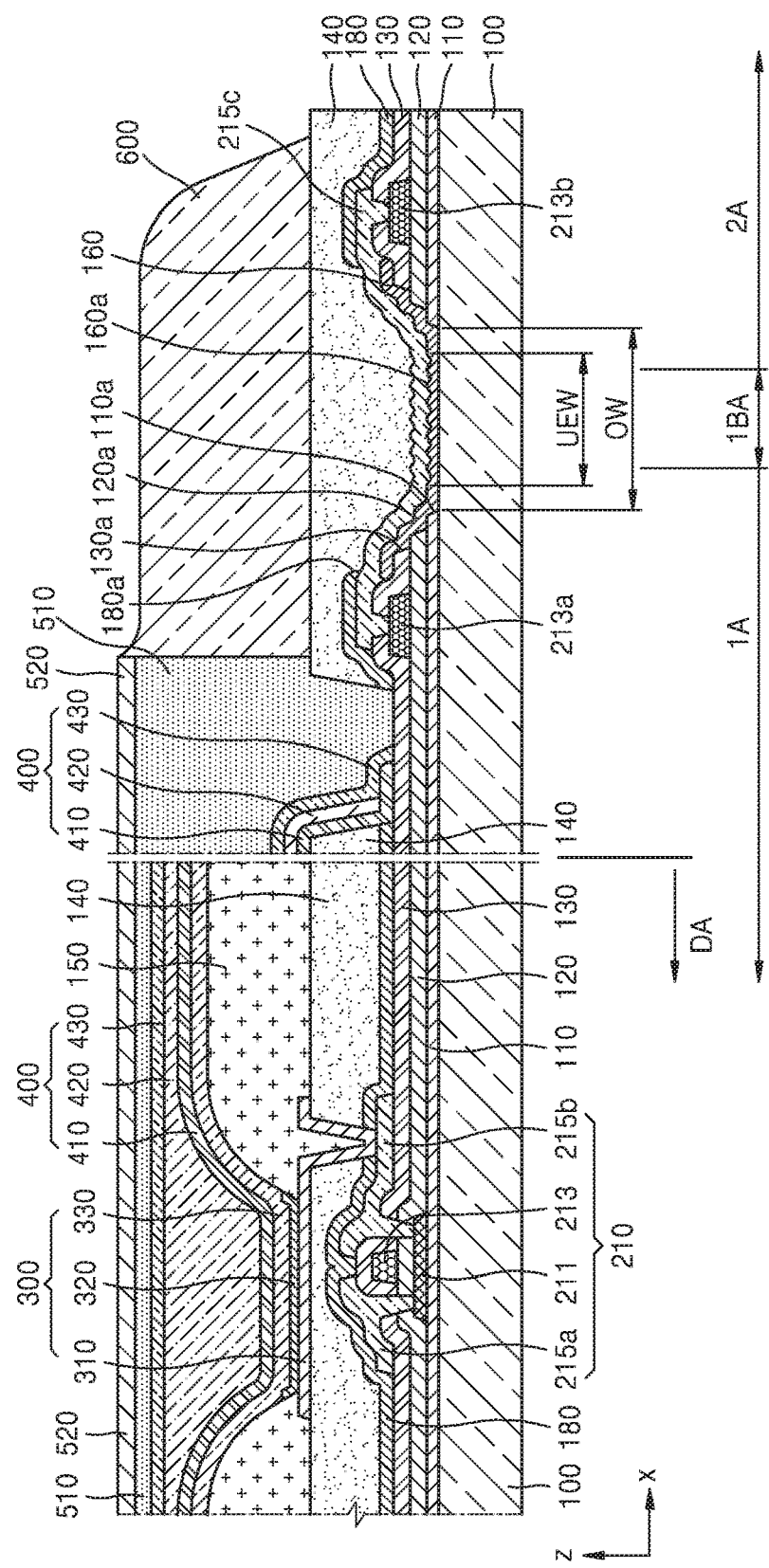
FIG. 39 is a schematic cross-sectional view partially showing a display device according to an embodiment.

In FIGS. 32 and 38, the inner side surface of the opening 110*a* in the buffer layer 110 and the inner side surface of the opening 120*a* in the gate insulating layer 120 correspond to each other, but are not limited thereto. For example, as shown in FIG. 39 that is a schematic cross-sectional view of a part of a display device according to an embodiment, the opening 110*a* in the buffer layer 110 may have an area that is smaller than that of the opening 120*a* in the gate insulating layer 120. In this case, the area of the first opening may be defined as an area of one having the smallest area from among the openings 110*a*, 120*a*, and 130*a* of the buffer layer 110, the gate insulating layer 120, and the interlayer insulating layer 130. Unlike the example shown in FIG. 39, the inner side surface of the opening 120*a* in the gate insulating layer 120 and the inner side surface of the opening 130*a* in the interlayer insulating layer 130 may be equal to each other.

Figure 40:
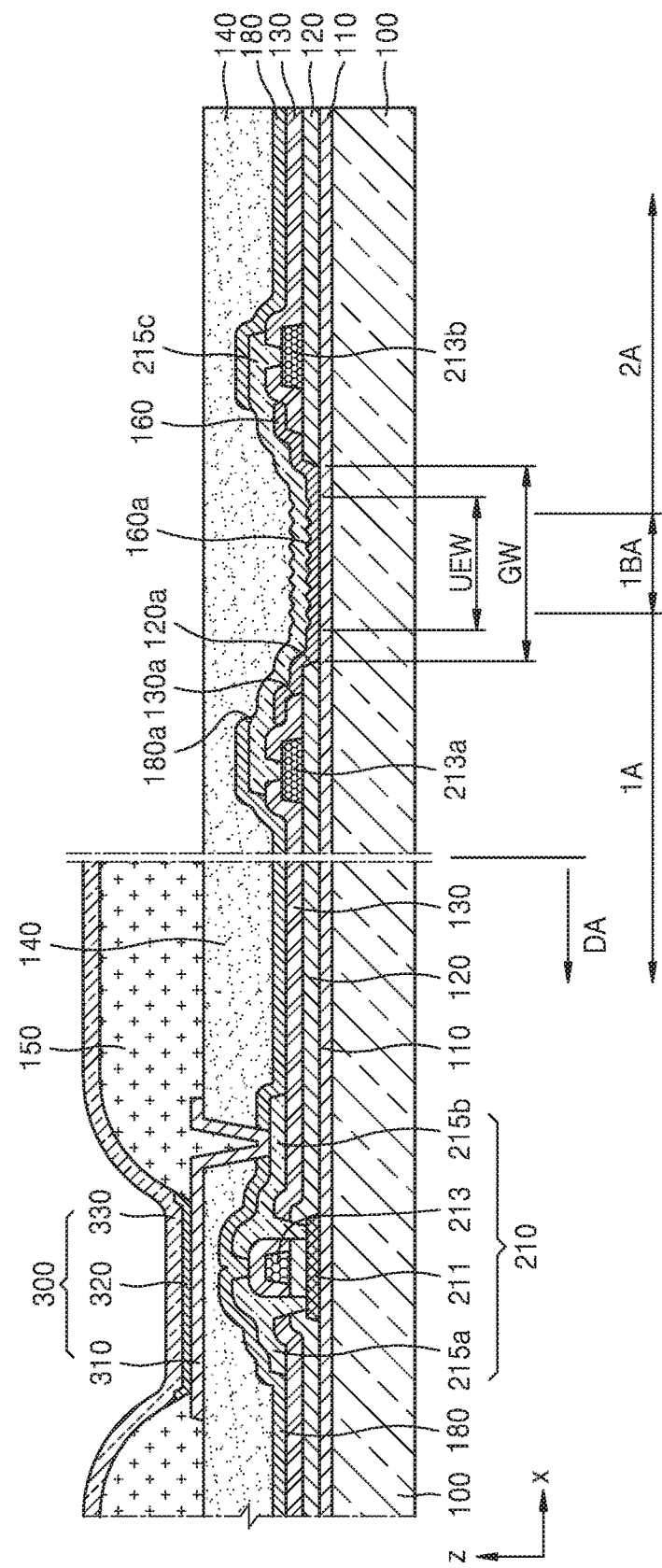
FIG. 40 is a schematic cross-sectional view partially showing a display device according to an embodiment.

So far, the inorganic insulating layer is described to have the opening, but one or more embodiments are not limited thereto. For example, the inorganic insulating layer may not include the first opening that completely penetrates through the inorganic insulating layer at a portion corresponding to the first bending area 1BA, but may include a first groove corresponding to the first bending area 1BA. FIG. 40 is a schematic cross-sectional view of a part of a display device according to an embodiment, that is, showing the above example.

As shown in FIG. 40, the buffer layer 110 may be continuously formed through the first area 1A, the first bending area 1BA, and the second area 2A. In addition, the gate insulating layer 120 may have the opening 120*a* corresponding to the first bending area 1BA, and the interlayer insulating layer 130 may have the opening 130*a* corresponding to the first bending area 1BA. Accordingly, the inorganic insulating layer including the buffer layer 110, the gate insulating layer 120, and the interlayer insulating layer 130 may be appreciated to have the first groove corresponding to the first bending area 1BA. The inorganic insulating layer may include the first groove of various shapes. For example, an upper surface of the buffer layer 110 (in +z direction) may be partially removed, but a lower surface of the gate insulating layer 120 (in −z direction) may not be removed.

That the first groove corresponds to the first bending area 1BA may denote that the first groove may overlap with the first bending area 1BA. Here, an area of the first groove may be greater than that of the first bending area 1BA. To do this, in FIG. 40, a width GW of the first groove is shown to be greater than the width of the first bending area 1BA. Here, the area of the first groove may be defined as an area of one having the smaller area, between the openings 120a and 130a of the gate insulating layer 120 and the interlayer insulating layer 130. In FIG. 40, the area of the first groove is defined by the area of the opening 120a of the gate insulating layer 120.

In the display device according to the embodiment, the organic material layer 160 may fill at least a part of the first groove. In addition, the first conductive layer 215c is located on the organic material layer 160, in the region where the organic material layer 160 exists. In addition, the protective layer 180, that is, an additional inorganic insulating layer, includes the additional opening 180a corresponding to the first bending area 1BA, and covers the first conductive layer 215c.

In FIG. 40, the display device is not bent for convenience of description, but in the display device according to the embodiment, the substrate 100 is actually bent at the first bending area 1BA as shown in FIG. 1. To do this, the display device is manufactured in a state that the substrate 100 is flat as shown in FIG. 40, and after that, the substrate 100 is bent at the first bending area 1BA so that the display device may be in the state shown in FIG. 1.

Here, the tensile stress may be applied to the first conductive layer 215c when the substrate 100 is bent at the first bending area 1BA, but in the display device, the inorganic insulating layer includes the first groove on the first bending area 1BA, and the portion of the first conductive layer 215c, wherein the portion corresponds to the first bending area 1BA, is located on the organic material layer 160 that fills at least a part of the first groove in the inorganic insulating layer. Therefore, occurrence of crack in the first conductive layer 215c corresponding to the first bending area 1BA and located on the organic material layer 160 may be prevented, or a possibility of generating the crack may be reduced. In addition, since the protective layer 180, that is, the additional inorganic insulating layer, includes the additional opening 180a corresponding to the first bending area 1BA, occurrence of the crack in the first conductive layer 215c located on the organic material layer 160 and corresponding to the first bending area 1BA may be prevented or reduced. In addition, since the protective layer 180, that is, the additional inorganic insulating layer, includes the additional opening 180a corresponding to the first bending area 1BA, occurrence of the crack in the protective layer 180 may be prevented or even when the crack occurs in the protective layer 180, transferring the crack to the first conductive layer 215c and generating defects in the first conductive layer 215c may be prevented effectively.

The above descriptions about the case in which the inorganic insulating layer includes the first opening may be all applied to the case in which the inorganic insulating layer includes the first groove. For example, the structure described above with reference to FIGS. 33 to 37 may be applied to the structure shown in FIG. 40. Hereinafter, the case in which the inorganic insulating layer includes the first opening will be described below for convenience of description, but the descriptions below may be also applied to the case in which the inorganic insulating layer includes the first groove.

Figure 41:
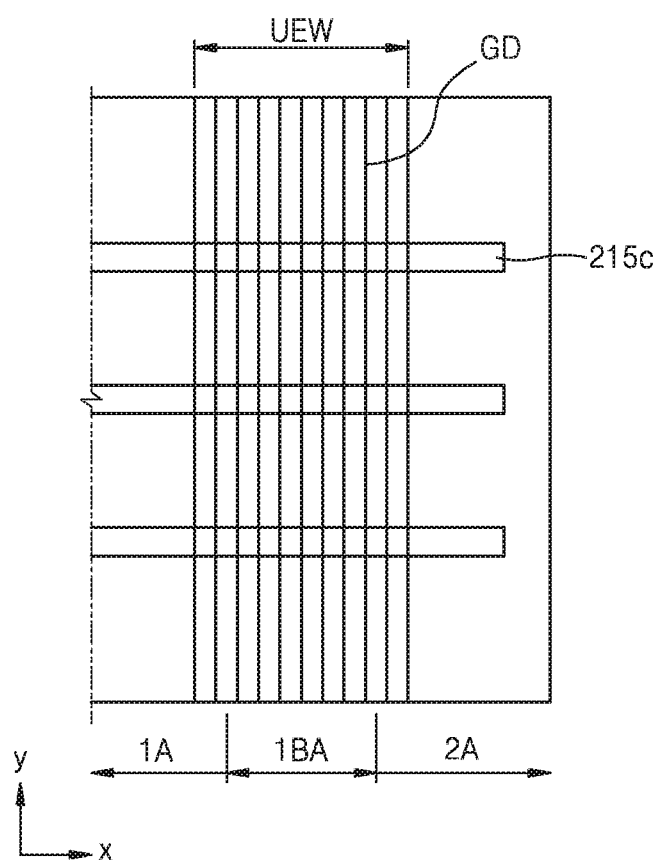
FIG. 41 is a schematic plan view partially showing a display device according to an embodiment.
Figure 42:
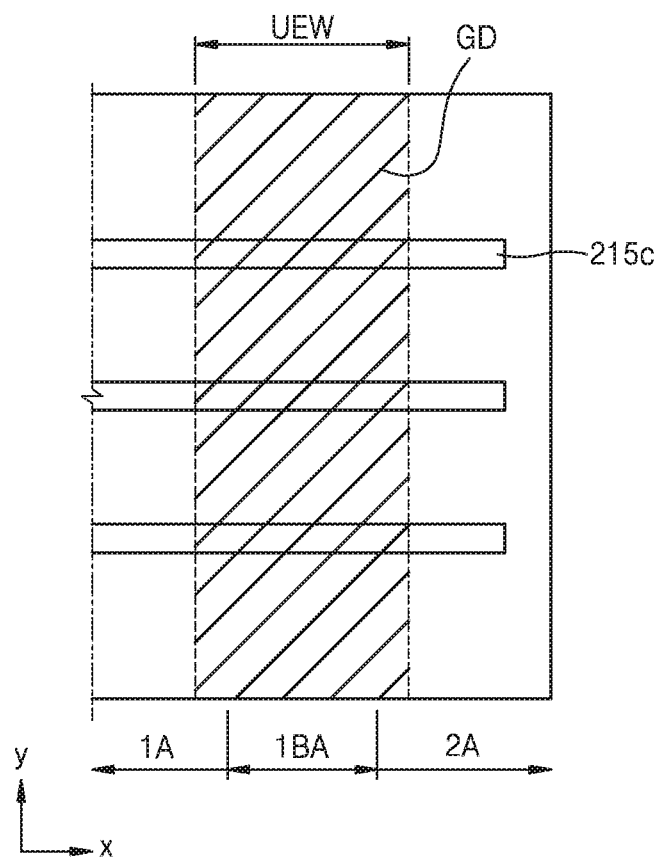
FIG. 42 is a schematic plan view partially showing a display device according to an embodiment.

In the above-described embodiments, the first conductive layer 215c extends in the second direction (+x direction) and crosses the first direction (+y direction) in which the uneven surface 160a in the upper surface of the organic material layer 160 extends. A crossing angle may be 90° as shown in FIG. 41 that is a plan view of a part of a display device according to an embodiment, or may be an angle other than 90° as shown in FIG. 42. In FIGS. 41 and 42, a reference numeral GD denotes a direction in which the uneven surface 160a in the upper surface of the organic material layer 160 extends. When comparing with FIG. 41, FIG. 42 shows that the direction in which the uneven surface 160a in the upper surface of the organic material layer 160 extends is inclined toward the second direction (+x direction), but one or more embodiments are not limited thereto. For example, the uneven surface 160a in the upper surface of the organic material layer 160 extends in the first direction (+y direction), and the first conductive layer 215c extends in a direction inclined with respect to the second direction (+x direction) (e.g., a direction forming an angle of 45° with the second direction (+x direction)), not in the second direction (+x direction). If there are a plurality of first conductive layers 215c, the direction in which some of the first conductive layers 215c extend may form a different angle with the second direction (+x direction) from that of the direction in which some other of the first conductive layers 215c extend.

In addition, FIGS. 41 and 42 show that the first conductive layer 215c extends straightly in the second direction (+x direction), but one or more embodiments are not limited thereto. For example, the first conductive layer 215c extends straightly in the second direction (+x direction), and at the same time, may include a plurality of through holes extending in +z direction. That is, at least a part of the first conductive layer 215c may have a plane (xy plane) that crosses the first direction (+y direction) and the second direction (+x direction), wherein the plane has a honeycomb shape. Otherwise, the first conductive layer 215c may not extend straightly in the second direction (+x direction), but may have a zigzag shape or a wave shape on the plane (xy plane) crossing the first direction (+y direction) and second direction (+x direction).

In addition, as shown in FIGS. 41 and 42, there may be a plurality of first conductive layers 215c extending in the second direction (+x direction). Here, unlike the examples shown in FIGS. 41 and 42, a distance between centers in the first conductive layers 215c in the first bending area 1BA may be greater than a distance between centers of the first conductive layers 215c on at least a region except the first bending area 1BA. Accordingly, a width of each first conductive layer 215c in the first bending area 1BA in the first direction (+y direction) may be greater than a width of each first conductive layer 215c in the first direction (+y direction) on the at least a region except the first bending area 1BA. As described above, when the widths of the first conductive layers 215c in the first bending area 1BA are increased, a probability of generating disconnection in the first conductive layer 215c due to the stress caused by the bending at the first bending area 1BA may be greatly reduced.

The distance between the first conductive layers 215c on the first bending area 1BA and the distance between the first conductive layers 215c on at least a region except the first bending area 1BA may be substantially equal to each other. In this case, the width of the first conductive layer 215c in the first direction (+y direction) on the first bending area 1BA may be formed to be greater than that of the first conductive layer 215c in the first direction (+y direction) on at least a region except the first bending area 1BA, and thus, the probability of generating disconnection in the first conductive layer 215c due to a stress caused by the bending at the first bending area 1BA may be greatly reduced.

Figure 43:
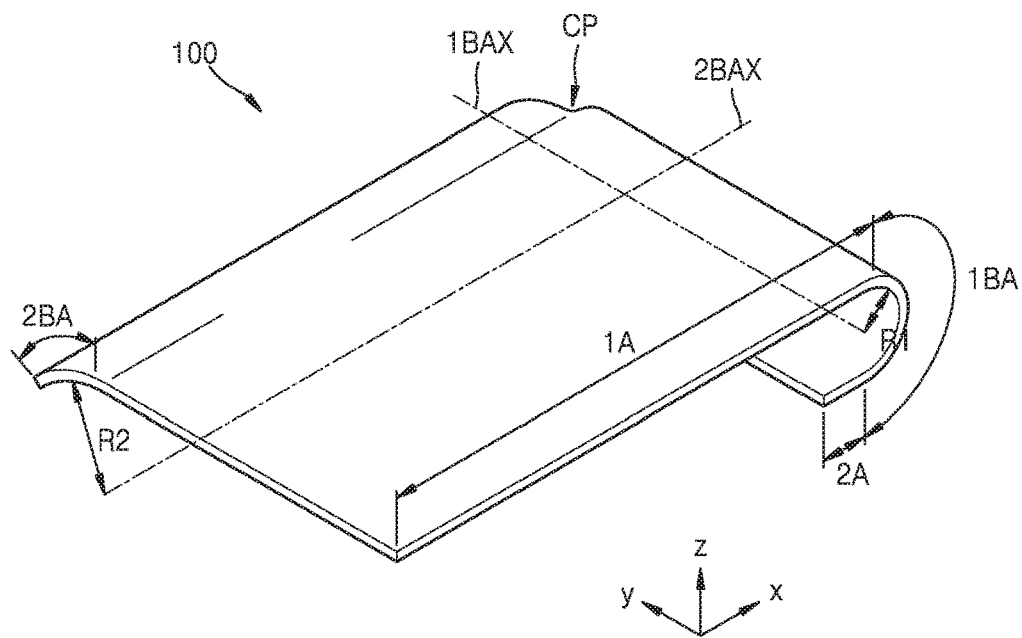
FIG. 43 is a schematic perspective view partially showing a display device according to an embodiment.
Figure 44:
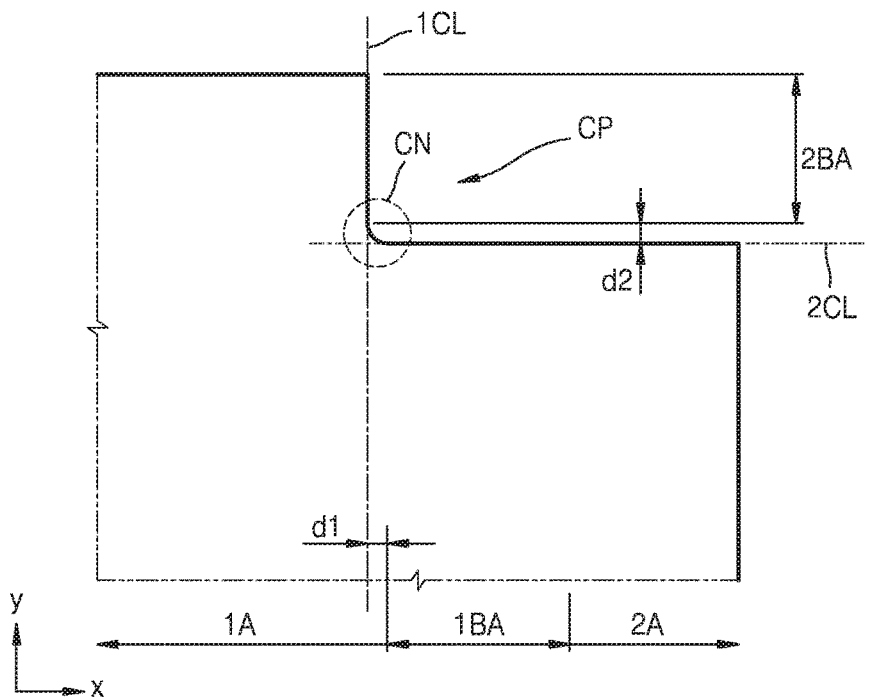
FIG. 44 is a schematic plan view partially showing the display device of FIG. 43.

FIG. 43 is a schematic perspective view of a part of a display device according to an embodiment, for example, the substrate 100. In addition, FIG. 44 is a schematic plan view of the substrate 100 of FIG. 43 before being bent.

Unlike the example illustrated with reference to FIG. 1, the display device includes a second bending area 2BA, in addition to the first bending area 1BA. The second bending area 2BA is located within the first area 1A. As the substrate 100 is bent about the first bending axis 1BAX extending in the first direction (+y direction) at the first bending area 1BA, the substrate 100 is also bent about a second bending axis 2BAX extending in the second direction (+x direction). Here, a corner of the substrate 100 is chamfered, wherein the corner is closest to a portion where the first bending axis 1BAX and the second bending axis 2BAX cross each other, and thus, the substrate 100 has a chamfered portion CP Since the chamfered portion CP exists, the substrate 100 may he bent not only about the first bending axis 1BAX, but also about the second bending axis 2BAX at the same time.

Here, a radius of curvature R1 of the first bending area 1BA may be smaller than a radius of curvature R2 of the second bending area 2BA, This is understood that the substrate 100 is bent at the second bending area 2BA more gently than at the first bending area 1BA. Therefore, in the second bending area 2BA where the substrate 100 is bent gently, the tensile stress applied to components of the display device may be relatively smaller than that applied to the components at the first bending area 1BA. The first inorganic insulating layer as in the above-described display device includes the first opening or the first groove in the first bending area 1BA, but may be continuously formed over at least a region including the second bending area 2BA in the first area 1A. Here, the reason why the first inorganic insulating layer is continuously formed over at least a region is that the first inorganic insulating layer may include contact holes for electrically connecting conductive layers located on upper and lower portions thereof in the first area 1A. The contact holes may have circular shapes, oval shapes, square shapes, or the like on the plan view, and the first opening or the first groove may be shown as a rectangular shape having a very large aspect ratio in the plan view.

Although a display device does not exist within the first bending area 1BA, the display device may be formed over the second bending area 2BA that is included in the first area 1A. Accordingly, the display device having an at least bent portion may be implemented. In addition, since the display device is bent at the second bending area 2BA, a user may recognize as if a peripheral area, on which images are not displayed and pads are located, has a reduced area when the user watches a display surface of the display device.

In addition, as described above, since the chamfered portion CP is formed, the substrate 100 may be bent about the second bending axis 2BAX crossing the first bending axis 1BAX, as well as about the first axis 1BAX, at the same time. Here, the chamfered portion CP may be rounded so that a sharp angle may not be formed toward a center portion of the substrate 100, as shown in FIG. 44.

As shown in FIG. 43, the first bending area 1BA is bent about the first bending axis 1BAX and the second bending area 2BA is bent about the second bending axis 2BAX, a large stress is applied to a corner CN toward the center portion of the substrate 100 in the chamfered portion CP, and thus, the substrate 100 may be torn or damaged. Therefore, in order to prevent defects from generating, the chamfered portion CP may have the corner CN that is rounded toward the center portion of the substrate 100 as shown in FIG. 44. Here, a radius of curvature at the corner CN toward the center portion of the substrate 100 may be about 1/20 to about 1/5 of the radius of curvature at the first bending area 1BA, for example, 1/10.

In addition, in order to prevent the large stress from being applied to the corner CN toward the center portion of the substrate 100 when the first bending area 1BA is bent about the first bending axis 1BAX and the second bending area 2BA is bent about the second bending axis 2BAX, an end of the first bending area 1BA toward the first area 1A may be closer to the edge of the substrate 100 than an extension line of a first cutting line 1CL of the chamfered portion CP. For example, a distance between the end of the first bending area 1BA toward the first area 1A and the extension line of the first cutting line 1CL may be about 500 μm.

An end of the second bending area 2BA toward the center portion of the substrate 100 may be closer to the edge of the substrate 100 than an extension line of a second cutting line 2CL of the chamfered portion CP. Here, as described above, since the radius of curvature R2 at the second bending area 2BA is greater than the radius of curvature R1 at the first bending area 1BA, the stress applied to the corner CN of the chamfered portion CP due to the bending at the second bending area 2BA is smaller than the stress applied to the corner CN of the chamfered portion CP due to the bending at the first bending area 1BA. Therefore, a distance between the end of the second bending area 2BA toward the center portion of the substrate 100 and the extension line of the second cutting line 2CL may be shorter than the distance between the end of the first bending area 1BA toward the first area 1A and the extension line of the first cutting line 1CL.

The above descriptions about the corner CN of the chamfered portion CP may be applied to the other embodiments or modified examples thereof.

Figure 45:
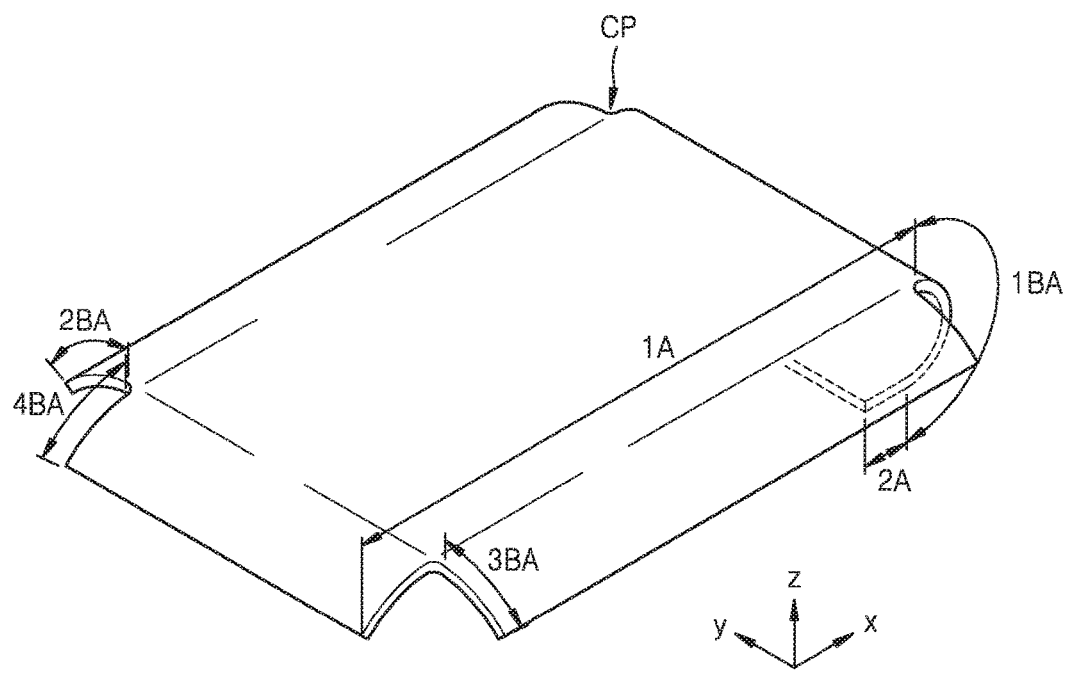
FIG. 45 is a schematic perspective view partially showing a display device according to an embodiment.

In FIG. 43, the display device is described to include the second bending area 2BA, in addition to the first bending area 1BA, but is not limited thereto. For example, as shown in FIG. 45 that is a schematic perspective view of a part of a display device according to an embodiment, a third bending area 3BA and a fourth bending area 4BA may be provided, in addition to the first or the second bending area 1BA or 2BA. In the above-described display device, it may be appreciated that four edges of the display device are all bent. Here, the third bending area 3BA and the fourth bending area 4BA may have structures that are the same as/similar to the second bending area 2BA.

Display devices may exist in the second bending area 2BA, the third bending area 3BA, and the fourth bending area 4BA included in the first area 1A. Accordingly, the display device having four bent edges may be implemented. In addition, since the display device is bent at the second to fourth bending areas 2BA to 4BA, the user may recognize as if the peripheral area on which images are not displayed and pads are located has been reduced, when the user sees the display device.

Figure 46:
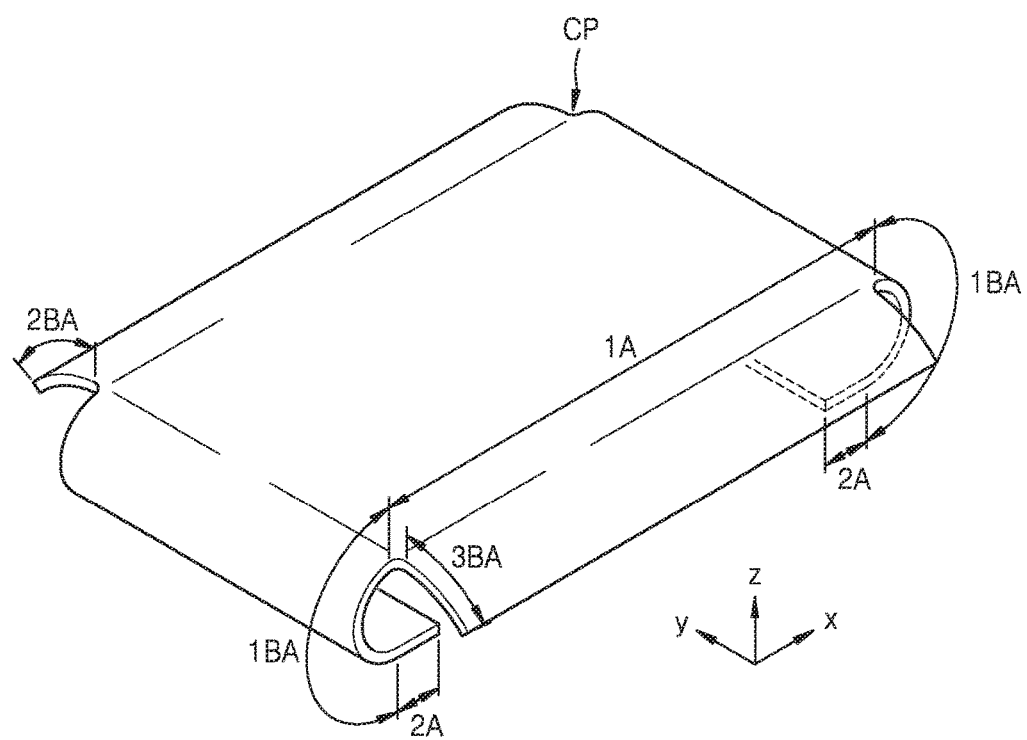
FIG. 46 is a schematic perspective view partially showing a display device according to an embodiment.

FIG. 46 is a schematic perspective view of a part of a display device according to an embodiment. Unlike the example shown in FIG. 45, the first bending area 1BA and the second area 2A may be provided in the second direction (+x direction), and in opposite direction (−x direction) as well. Like the second area 2A existing in the second direction (+x direction), various electronic devices may be located in the second area 2A or printed circuit boards may be electrically connected to the second area 2A.

As described above about the display devices according to one or more embodiments, at least two embodiments may be applied to one display device unless they are contradictory to each other. For example, the protective film 170 of the display device according to the embodiment illustrated with reference to FIG. 23 may be applied to the display device according to the embodiment illustrated with reference to FIG. 32.

Aforementioned bending area may be understood as a bent area, because the substrate is bent in that area. However, the present invention is not limited thereto, and thus may be applied to a flexible or bendable display having the bending area.

According to one or more embodiments, a longer lifespan of the display device may be guaranteed and generation of defects may be reduced during manufacturing the display device.

It should be understood that embodiments described herein should be considered in a descriptive sense only and not for purposes of limitation. Descriptions of features or aspects within each embodiment should typically be considered as available for other similar features or aspects in other embodiments.

While the inventive technology has been described with reference to the figures, it will be understood by those of ordinary skill in the art that various changes in form and details may be made therein without departing from the spirit and scope as defined by the following claims.

What is claimed is:

1. A display device comprising:
a substrate comprising a first area, a second area, and a first bending area located between the first and second areas, wherein the first bending area is bent about a first bending axis extending in a first direction;
a first inorganic insulating layer arranged over the substrate and having a first opening or a first groove at least in the first bending area;
an organic material layer filling at least a part of the first opening or the first groove; and
a first conductive layer extending from the first area to the second area across the first bending area and located over the organic material layer,
wherein the organic material layer is extended continuously within the first opening or the first groove, between the substrate and the first conductive layer.

2. The display device of claim 1, wherein the first opening or the first groove overlaps the first bending area.

3. The display device of claim 2, wherein the first opening or the first groove has an area that is greater than the first bending area.

4. The display device of claim 1, further comprising a protective film located over a surface of the substrate, wherein the surface is opposite to the first inorganic insulating layer, and wherein the protective film has a protective film opening at least in the first bending area.

5. The display device of claim 4, wherein the protective film opening has an area that is greater than the first bending area.

6. The display device of claim 4, wherein the protective film opening has an area that is greater than the first bending area and smaller than an area of the first opening or the first groove.

7. The display device of claim 1, wherein the organic material layer covers an inner side surface of the first opening or the first groove.

8. The display device of claim 1, wherein the organic material layer comprises an upper surface that is at least partially uneven.

9. The display device of claim 8, wherein an uneven portion of the upper surface of the organic material layer is disposed only in the first opening or the first groove.

10. The display device of claim 9, wherein the uneven portion of the organic material layer has an area is greater than the first bending area and smaller than that of the first opening or the first groove.

11. The display device of claim 8, wherein the upper surface of the organic material layer comprises a plurality of grooves extending in the first direction, and wherein the grooves define an uneven portion of the upper surface.

12. The display device of claim 8, wherein an upper surface of the first conductive layer has a shape corresponding to that of the upper surface of the organic material layer.

13. The display device of claim 8, wherein an uneven portion of the upper surface comprises a plurality of protrusions in a second direction that crosses the first direction, and wherein the protrusions at a center portion of the first opening or the first groove has a distance therebetween that is less than that between the protrusions at other portions in the first opening or the first groove.

14. The display device of claim 8, wherein an uneven portion of the upper surface comprises a plurality of protrusions in a second direction that crosses the first direction, and wherein a height from an upper surface of the substrate to the protrusions at a center portion of the first opening or the first groove is greater than a height from the upper surface of the substrate to the protrusions at other portions in the first opening or the first groove.

15. The display device of claim 8, further comprising a stress neutralization layer located over an upper portion of the first conductive layer, wherein an upper surface of the stress neutralization layer at least partially has a shape corresponding to an uneven portion of the upper surface.

16. The display device of claim 15, wherein the upper surface of the stress neutralization layer has the same shape as that of the uneven portion.

17. The display device of claim 15, wherein all of a plurality of protrusions on the upper surface of the stress neutralization layer correspond to at least some of the protrusions in the uneven portion.

18. The display device of claim 7, wherein the organic material layer comprises an uneven surface having a plurality of protrusions in a second direction crossing the first direction, and wherein a distance between the protrusions at a portion adjacent to the inner side surface of the first opening or the first groove is smaller than a distance between the protrusions at other portions in the first opening or the first groove.

19. The display device of claim 7, wherein the organic material layer comprises an uneven surface having a plurality of protrusions in a second direction crossing the first direction, and wherein a height from an upper surface of the substrate to the protrusions at a portion adjacent to the inner side surface of the first opening or the first groove is greater than a height from the upper surface of the substrate to the protrusions at other portions in the first opening or the first groove.

20. The display device of claim 1, further comprising:
a thin film transistor (TFT) arranged over the first area or the second area and comprising a source electrode, a drain electrode, and a gate electrode;
an encapsulation layer covering an organic light-emitting diode (OLED) over the first area; and
a touch electrode of a touch sensing layer located over the encapsulation layer,
wherein the first conductive layer and the touch electrode are formed of at least one same material.

21. The display device of claim 20, further comprising a touch protective layer covering the touch electrode and the first conductive layer.

22. The display device of claim 20, further comprising an additional OLED over the second area, wherein the encapsulation layer covers the additional OLED over the second area.

23. The display device of claim 1, further comprising an encapsulation layer comprising a first inorganic encapsulation layer, a second inorganic encapsulation layer, and an organic encapsulation layer arranged between the first and second inorganic encapsulation layers, wherein the encapsulation layer covers an organic light-emitting diode (OLED) over the first area, and wherein the organic material layer and the organic encapsulation layer are formed of at least one same material.

24. The display device of claim 1, further comprising a second conductive layer arranged over the first area or the second area and located on a layer different from a layer on which the first conductive layer is located, wherein the second conductive layer is electrically connected to the first conductive layer.

25. The display device of claim 24, wherein an elongation rate of the first conductive layer is greater than that of the second conductive layer.

26. The display device of claim 24, further comprising a TFT arranged over the first area or the second area and comprising a source electrode, a drain electrode, and a gate electrode, wherein the first conductive layer is located on the same layer as the source and drain electrodes, and wherein the second conductive layer is located on the same layer as the gate electrode.

27. The display device of claim 26, wherein the TFT further comprises a semiconductor layer, wherein the first inorganic insulating layer is arranged between the semiconductor layer and the gate electrode.

28. The display device of claim 26, wherein the first inorganic insulating layer is arranged between the TFT and the substrate.

29. The display device of claim 28, wherein the TFT further comprises a semiconductor layer, wherein the organic material layer extends to be interposed between the semiconductor layer and the gate electrode.

30. The display device of claim 1, further comprises:
a TFT arranged over the first area or the second area and comprising a source electrode, a drain electrode, and a gate electrode; and
a planarization layer covering the TFT and formed of an organic material, wherein the organic material layer and the planarization layer are formed of at least one same material.

31. The display device of claim 1, further comprising:
a TFT arranged over the first area or the second area and comprising, a source electrode, a drain electrode, and a gate electrode;
and an interlayer insulating layer arranged between the source electrode and the gate electrode and between the drain electrode and the gate electrode,
wherein the organic material layer and the interlayer insulating layer are formed of at least one same material.

32. The display device of claim 31, wherein the organic material layer is integrally formed with the interlayer insulating layer.

33. The display device of claim 1, further comprising:
a first TFT arranged over the first area or the second area and comprising a first semiconductor layer, a first source electrode, a first drain electrode, and a first gate electrode; and
a second TFT arranged over the first area or the second area and comprising a second semiconductor layer, a second source electrode, a second drain electrode, and a second gate electrode,
wherein a distance between a layer in which the first gate electrode is located and the substrate is smaller than a distance between a layer in which the second gate electrode is located and the substrate, wherein the first inorganic insulating layer is arranged between the first semiconductor layer and the first gate electrode and between the second semiconductor layer and the second gate electrode, and
wherein the organic material layer extends to be interposed between the first inorganic insulating layer and the second gate electrode.

34. The display device of claim 33, further comprising a second inorganic insulating layer arranged over the organic material layer and comprising a second opening or a second groove corresponding to the first bending area.

35. The display device of claim 33, further comprising a second conductive layer arranged over the first area or the second area, wherein the second conductive layer and the first gate electrode are formed of at least one same material, wherein the second conductive layer is electrically connected to the first conductive layer, and wherein the first conductive layer and the second gate electrode are formed of at least one same material.

36. A display device comprising:
a substrate comprising a first area, a second area, and a first bending area located between the first and second areas, wherein the first bending area is bent about a first bending axis extending in a first direction;
a first inorganic insulating layer arranged over the substrate and having a first opening or a first groove at least in the bending area;
an organic material layer filling at least a part of the first opening or the first groove; and
a first conductive layer extending from the first area to the second area across the first bending area and located over the organic material layer,
wherein the substrate comprises a second bending area that extends in a second direction crossing the first direction within the first area, and wherein the second bending area is bent about a second bending axis extending in the second direction.

37. The display device of claim 36, wherein the substrate has a chamfered corner that is the closest to a point where the first bending axis and the second bending axis cross each other.

38. The display device of claim 36, wherein a radius of curvature at the first bending area is smaller than that of the second bending area.

39. The display device of claim 38, wherein the first inorganic insulating layer is continuous over at least a region including the second bending area within the first area.

40. The display device of claim 1, further comprising an additional inorganic insulating layer comprising an additional opening corresponding to the first bending area and overlapping the first conductive layer.

41. The display device of claim 40, wherein the additional opening overlaps the first bending area.

42. The display device of claim 41, wherein the additional opening has an area that is greater than that of the first bending area.

43. The display device of claim 40, wherein the first opening or the first groove overlaps the first bending area.

44. The display device of claim 43, wherein an area of the first opening or the first groove is greater than an area of the first bending area.

45. The display device of claim 43, wherein the additional opening has an area that is greater than that of the first opening or the first groove.

46. The display device of claim 40, wherein the additional opening corresponds to the first conductive layer within the first bending area.

47. The display device of claim 46, wherein the additional opening overlaps the first conductive layer within the first bending area.

48. The display device of claim 47, wherein the additional opening has an area that is greater than that of an upper surface of the first conductive layer within the first bending area.

49. The display device of claim 47, wherein the additional inorganic insulating layer at least partially covers an upper surface of the organic material layer on an outer portion of the first conductive layer within the first bending area.

50. A display device comprising:
a substrate comprising a first area, a second area, and a first bent area located between the first and second areas, wherein the first bent area is bent about a first bending axis extending in a first direction;
a first inorganic insulating layer arranged over the substrate and having a first opening or a first groove at least in the first bent area;
an organic material layer filling at least a part of the first opening or the first groove; and
a first conductive layer extending from the first area to the second area across the first bent area and located over the organic material layer,
wherein the organic material layer is extended continuously within the first opening or the first groove, between the substrate and the first conductive layer.

* * * * *